US011965047B2

(12) United States Patent
Mizuno et al.

(10) Patent No.: US 11,965,047 B2
(45) Date of Patent: Apr. 23, 2024

(54) CURABLE COMPOSITION, FILM, STRUCTURAL BODY, COLOR FILTER, SOLID-STATE IMAGING ELEMENT, AND IMAGE DISPLAY DEVICE

(71) Applicant: FUJIFILM Corporation, Tokyo (JP)

(72) Inventors: Akio Mizuno, Shizuoka (JP); Hirotaka Takishita, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 191 days.

(21) Appl. No.: 17/357,929

(22) Filed: Jun. 24, 2021

(65) Prior Publication Data

US 2021/0332173 A1 Oct. 28, 2021

Related U.S. Application Data

(63) Continuation of application No. PCT/JP2020/002477, filed on Jan. 24, 2020.

(30) Foreign Application Priority Data

Feb. 1, 2019 (JP) ................................ 2019-016979
Jul. 23, 2019 (JP) ................................ 2019-135357

(51) Int. Cl.

| | |
|---|---|
| ***C08F 2/46*** | (2006.01) |
| ***C08F 2/08*** | (2006.01) |
| ***C08F 2/48*** | (2006.01) |
| ***C08F 2/50*** | (2006.01) |
| ***C08F 220/28*** | (2006.01) |
| ***C08F 220/36*** | (2006.01) |
| ***C08F 265/06*** | (2006.01) |
| ***C08G 61/04*** | (2006.01) |
| ***C08K 5/00*** | (2006.01) |
| ***C08K 5/101*** | (2006.01) |
| ***G02B 5/20*** | (2006.01) |

(52) U.S. Cl.

CPC .............. *C08F 265/06* (2013.01); *C08F 2/08* (2013.01); *C08F 2/48* (2013.01); *C08F 220/283* (2020.02); *C08F 220/365* (2020.02); *C08K 5/0041* (2013.01); *C08K 5/101* (2013.01); *G02B 5/20* (2013.01)

(58) Field of Classification Search

CPC .... G08K 5/0041; G08K 5/001; C08F 265/02; C08F 120/14; C08F 265/06; C08F 285/00; C08F 220/283; C08F 220/14; C08F 220/365; C08F 220/1804; C08F 2/44; C08F 2/08; C08F 2/48; C08F 222/1006; C09D 151/003; C09D 151/08; G02B 5/223; G02B 5/20; G03F 7/004; G03F 7/023; H01L 27/146; G02F 5/20; C08L 33/12

USPC ................. 522/99, 1, 6, 189, 184, 71; 520/1

See application file for complete search history.

(56) References Cited

U.S. PATENT DOCUMENTS

| | | | | |
|---|---|---|---|---|
| 10,795,260 | B2 * | 10/2020 | Ogawa | G03F 7/0388 |
| 2010/0045905 | A1 * | 2/2010 | Nakashima | G03F 7/033 430/286.1 |
| 2011/0124824 | A1 | 5/2011 | Nagata et al. | |
| 2015/0118451 | A1 | 4/2015 | Shimohara | |
| 2019/0221596 | A1 | 7/2019 | Oota et al. | |
| 2019/0332009 | A1 * | 10/2019 | Takishita | G02B 5/20 |
| 2022/0163885 | A1 * | 5/2022 | Nakamura | G03F 7/0007 |
| 2022/0213293 | A1 * | 7/2022 | Taguchi | G03F 7/038 |

FOREIGN PATENT DOCUMENTS

| | | |
|---|---|---|
| CN | 102171287 | 8/2011 |
| CN | 102645692 | 8/2012 |
| EP | 2490262 | 11/2014 |
| JP | 2006317924 | * 11/2006 |
| JP | 2010106268 | 5/2010 |
| JP | 2011122115 | 6/2011 |

(Continued)

OTHER PUBLICATIONS

Hirasa et al, JP 2006-317924 Machine Translation, Nov. 24, 2006 (Year: 2006).*

(Continued)

*Primary Examiner* — Jessica Whiteley
(74) *Attorney, Agent, or Firm* — JCIPRNET

(57) ABSTRACT

Provided are a curable composition including a pigment, a resin, a polymerizable compound, a photopolymerization initiator, and a solvent; a film formed of the curable composition; a structural body; a color filter; a solid-state imaging element; and an image display device. The resin includes a resin A which includes a repeating unit having a graft chain of a poly(meth)acrylate structure and a repeating unit having an acid group, and the graft chain of a poly (meth)acrylate structure includes a repeating unit represented by the following formula. $R^1$ represents a hydrogen atom or a methyl group, and $R^2$ represents a hydrocarbon group having 1 to 20 carbon atoms. However, $R^1$ is a hydrogen atom in a case where $R^2$ is a methyl group, and $R^2$ is a hydrocarbon group having 2 or more carbon atoms in a case where $R^1$ is a methyl group.

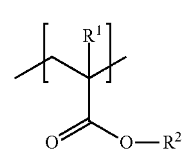

14 Claims, 2 Drawing Sheets

(56) References Cited

FOREIGN PATENT DOCUMENTS

| | | | |
|---|---|---|---|
| JP | 2012025943 | | 2/2012 |
| JP | 2015052754 | * | 3/2015 |
| TW | 201403223 | | 1/2014 |
| TW | 201821253 | | 6/2018 |
| WO | 2013180035 | | 12/2013 |
| WO | 2014030473 | | 2/2014 |
| WO | 2016129342 | | 8/2016 |
| WO | 2018062130 | | 4/2018 |

OTHER PUBLICATIONS

Yoshibayashi, JP 2015052754 Machine Translation, Mar. 19, 2015 (Year: 2015).*

"Office Action of Japan Counterpart Application", dated Jul. 26, 2022, with English translation thereof, p. 1-p. 6.

"International Search Report (Form PCT/ISA/210) of PCT/JP2020/002477," dated Apr. 14, 2020, with English translation thereof, pp. 1-6.

"Written Opinion of the International Searching Authority (Form PCT/ISA/237)" of PCT/JP2020/002477, dated Apr. 14, 2020, with English translation thereof, pp. 1-10.

"Office Action of China Counterpart Application", dated Oct. 26, 2022, with English translation thereof, p. 1-p. 13.

"Office Action of China Counterpart Application", dated Apr. 29, 2023, with English translation thereof, p. 1-p. 11.

"Office Action of Korea Counterpart Application" with English translation thereof, dated Jul. 3, 2023, p. 1-p. 14.

"Office Action of Taiwan Counterpart Application", dated Apr. 11, 2023, with partial English translation thereof, p. 1- p. 14.

* cited by examiner

CURABLE COMPOSITION, FILM, STRUCTURAL BODY, COLOR FILTER, SOLID-STATE IMAGING ELEMENT, AND IMAGE DISPLAY DEVICE

CROSS-REFERENCE TO RELATED APPLICATIONS

This application is a Continuation of PCT International Application No. PCT/JP2020/002477 filed on Jan. 24, 2020, which claims priority under 35 U.S.C § 119(a) to Japanese Patent Application No. 2019-016979 filed on Feb. 1, 2019, and Japanese Patent Application No. 2019-135357 filed on Jul. 23, 2019. Each of the above application(s) is hereby expressly incorporated by reference, in its entirety, into the present application.

BACKGROUND OF THE INVENTION

1. Field of the Invention

The present invention relates to a curable composition including a pigment, a resin, a polymerizable compound, a photopolymerization initiator, and a solvent. The present invention further relates to a film formed of the curable composition, a structural body, a color filter, a solid-state imaging element, and an image display device.

2. Description of the Related Art

In recent years, as a digital camera, a mobile phone with a camera, and the like have been further spreading, there has been a greatly increasing demand for a solid-state imaging element such as a charge coupled device (CCD) image sensor. A color filter has been used as a key device in a display or an optical element.

The color filter has been manufactured using a curable composition including a pigment, a resin, a polymerizable compound, a photopolymerization initiator, and a solvent. In addition, in a case where the pigment is used as a colorant, in order to improve storage stability of the curable composition, the pigment is dispersed in the curable composition using a dispersant or the like.

As the dispersant, for example, a resin which has a repeating unit having a graft chain is known. For example, in JP2011-122115A, a pigment is dispersed using a graft polymer (resin) which has a repeating unit including a carbon-carbon unsaturated double bond in a graft chain. In paragraph No. 0082 of JP2011-122115A, it is disclosed that the graft polymer (resin) preferably has a repeating unit represented by Formula (I) or Formula (II).

(I)

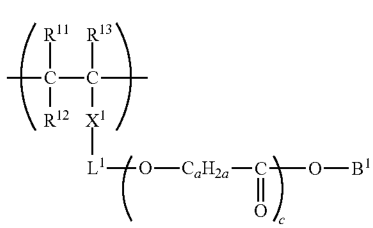

-continued (II)

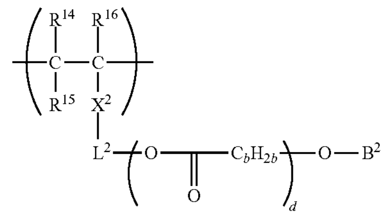

(in Formula (I) and Formula (II), $R^{11}$ to $R^{16}$ each independently represent a hydrogen atom or a monovalent organic group, $X^1$ and $X^2$ each independently represent —CO—, —C(═O)O—, —CONH—, —OC(═O)—, or a phenylene group, $L^1$ and $L^2$ each independently represent a single bond or a divalent organic linking group, $B^1$ and $B^2$ each independently represent an organic group having at least one carbon-carbon unsaturated double bond, a and b represent an integer of 2 to 8, and c and d represent an integer of 1 to 100.)

SUMMARY OF THE INVENTION

It is desired that the curable composition including a pigment, a resin, a polymerizable compound, a photopolymerization initiator, and a solvent has excellent storage stability and developability. In addition, in recent years, it has been desired to achieve both of these characteristics at a higher level.

In addition, according to the study of the present inventor, in a case where a film formed using the curable composition including a pigment, a resin, a polymerizable compound, a photopolymerization initiator, and a solvent is exposed to a high humidity environment for a long period of time, it has been found that film shrinkage may occur. In a case where the film shrinkage occurs, for example, the height of each pixel of the color filter becomes homogeneous, the light-collecting property varies from pixel to pixel, and color reproducibility may deteriorate.

Accordingly, an object of the present invention is to provide a curable composition with which a film having good storage stability and developability, and having excellent moisture resistance can be formed. Another object of the present invention is to provide a film formed of the curable composition, a color filter, a structural body, a solid-state imaging element, and an image display device.

According to the studies conducted by the present inventor, it has been found that the above-described object can be achieved by adopting the following configuration, thereby leading to the completion of the present invention. Therefore, the present invention provides the following.

<1> A curable composition comprising:

a pigment;

a resin;

a polymerizable compound;

a photopolymerization initiator; and a solvent;

in which the resin includes a resin A which includes a repeating unit having a graft chain of a poly(meth)acrylate structure and a repeating unit having an acid group, and the graft chain of a poly(meth)acrylate structure includes a repeating unit represented by Formula (1), Formula (1)

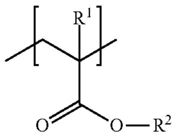

in Formula (1), $R^1$ represents a hydrogen atom or a methyl group, and $R^2$ represents a hydrocarbon group having 1 to 20 carbon atoms, where $R^1$ is a hydrogen atom in a case where $R^2$ is a methyl group, and $R^2$ is a hydrocarbon group having 2 or more carbon atoms in a case where $R^1$ is a methyl group.

<2> The curable composition according to <1>, in which the graft chain of a poly(meth)acrylate structure includes a repeating unit in which $R^1$ of Formula (1) is a hydrogen atom.

<3> The curable composition according to <1> or <2>, in which $R^2$ of Formula (1) is an alkyl group having 2 to 20 carbon atoms.

<4> The curable composition according to <1> or <2>, in which $R^2$ of Formula (1) is a primary or secondary alkyl group having 2 to 20 carbon atoms.

<5> The curable composition according to any one of <1> to <4>, in which the graft chain of a poly(meth)acrylate structure includes a repeating unit in which $R^1$ of Formula (1) is a hydrogen atom, and a repeating unit represented by Formula (2), Formula (2)

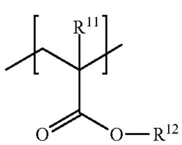

in Formula (2), $R^{11}$ represents a methyl group, and $R^{12}$ represents a hydrocarbon group having 1 to 20 carbon atoms.

<6> The curable composition according to any one of <1> to <5>, in which a glass transition temperature of the graft chain of a poly(meth)acrylate structure is 100° C. or lower.

<7> The curable composition according to any one of <1> to <6>, in which a Hansen solubility parameter of the graft chain of a poly(meth)acrylate structure is 7.8 to 9.5 $(cal/cm^3)^{0.5}$.

<8> The curable composition according to any one of <1> to <7>, in which the resin A is a dispersant.

<9> The curable composition according to any one of <1> to <8>, in which the pigment includes a chromatic pigment.

<10> The curable composition according to any one of <1> to <9>, further comprising:

a pigment derivative.

<11> The curable composition according to any one of <1> to <10>, in which the curable composition is used for forming a pixel in an area partitioned by a partition wall.

<12> A film formed of the curable composition according to any one of <1> to <11>.

<13> A structural body comprising:

a support;

a partition wall provided on the support; and a pixel obtained from the curable composition according to any one of <1> to <11> and provided on an area of the support partitioned by the partition wall.

<14> A color filter comprising:

the film according to <12>.

<15> A solid-state imaging element comprising:

the film according to <12>.

<16> An image display device comprising:

the film according to <12>.

According to the present invention, it is possible to provide a curable composition with which a film having good storage stability and developability, and having excellent moisture resistance can be formed. In addition, according to the present invention, it is possible to provide a film formed of the curable composition, a color filter, a structural body, a solid-state imaging element, and an image display device.

DESCRIPTION OF THE PREFERRED EMBODIMENTS

Figure 1:
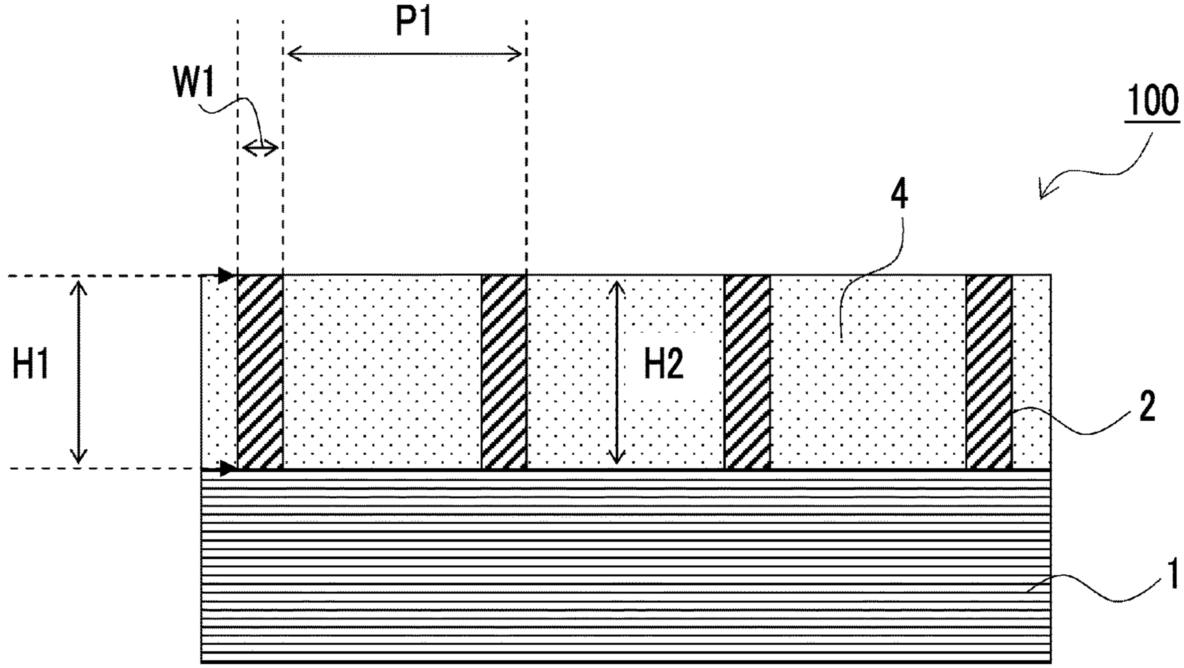
FIG. 1 is a side-sectional view showing an embodiment of a structural body according to the present invention.

Hereinafter, the details of the present invention will be described.

In the present specification, numerical ranges represented by "to" include numerical values before and after "to" as lower limit values and upper limit values.

In the present specification, unless specified as a substituted group or as an unsubstituted group, a group (atomic group) denotes not only a group (atomic group) having no substituent but also a group (atomic group) having a substituent. For example, "alkyl group" denotes not only an alkyl group having no substituent (unsubstituted alkyl group) but also an alkyl group having a substituent (substituted alkyl group).

In the present specification, unless specified otherwise, "exposure" denotes not only exposure using light but also drawing using a corpuscular beam such as an electron beam or an ion beam. Examples of the light used for exposure include an actinic ray or radiation, for example, a bright line spectrum of a mercury lamp, a far ultraviolet ray represented by excimer laser, an extreme ultraviolet ray (EUV ray), an X-ray, or an electron beam.

In the present specification, "(meth)acrylate" denotes either or both of acrylate and methacrylate, "(meth)acryl" denotes either or both of acryl and methacryl, and "(meth) acryloyl" denotes either or both of acryloyl and methacryloyl.

In the present specification, in structural formulae, Me represents a methyl group, Et represents an ethyl group, Bu represents a butyl group, and Ph represents a phenyl group.

In the present specification, a weight-average molecular weight and a number-average molecular weight are values in terms of polystyrene through measurement by a gel permeation chromatography (GPC) method.

In the present specification, a total solid content denotes the total mass of all the components of the composition excluding a solvent.

In the present specification, a pigment means a compound which is hardly dissolved in a solvent.

In the present specification, the term "step" denotes not only an individual step but also a step which is not clearly distinguishable from another step as long as an effect expected from the step can be achieved.

<Curable Composition>

A curable composition according to an embodiment of the present invention includes a pigment, a resin, a polymerizable compound, a photopolymerization initiator, and a solvent, in which the resin includes a resin A which includes a repeating unit having a graft chain of a poly(meth)acrylate structure and a repeating unit having an acid group, and the graft chain of a poly(meth)acrylate structure includes a repeating unit represented by Formula (1).

In the curable composition according to the embodiment of the present invention, by including the above-described resin A, dispersibility of the pigment in the curable composition can be improved, and the curable composition can have excellent storage stability. Further, developability can also be improved. Furthermore, moisture resistance of a film to be obtained can also be improved. The reason for obtaining such an effect is assumed as follows. That is, since the resin A includes a repeating unit having a graft chain of a poly(meth)acrylate structure and a repeating unit having an acid group, it is assumed that the acid group moiety included in the resin A is adsorbed on the pigment and the graft chain of the resin A acts as a steric repulsive group. Therefore, it is assumed that the dispersibility of the pigment in the curable composition can be improved, and as a result, the storage stability of the curable composition can be improved. Further, it is assumed that excellent developability is obtained by combining a repeating unit having an acid group and a repeating unit having a graft chain of a predetermined poly(meth)acrylate structure. In addition, it is assumed that the above-described graft chain of a poly (meth)acrylate structure is not easily affected by humidity. Therefore, it is assumed that a film having excellent moisture resistance can be formed.

The curable composition according to the embodiment of the present invention can be used for a color filter, a near-infrared transmission filter, a near-infrared cut filter, a black matrix, a light-shielding film, a refractive index adjusting film, a microlens, and the like. In addition, the curable composition according to the embodiment of the present invention can also be used as a composition for forming a color microlens. Examples of a method for manufacturing the color microlens include the method described in JP2018-010162A.

Examples of the color filter include a filter having a colored pixel which transmits light having a specific wavelength, and a filter having at least one colored pixel selected from a red pixel, a blue pixel, a green pixel, a yellow pixel, a cyan pixel, and a magenta pixel is preferable. The color filter can be formed using a curable composition including a chromatic pigment.

Examples of the near-infrared cut filter include a filter having a maximum absorption wavelength in a wavelength range of 700 to 1800 nm. As the near-infrared cut filter, a filter having a maximum absorption wavelength in a wavelength range of 700 to 1300 nm is preferable, and a filter having a maximum absorption wavelength in a wavelength range of 700 to 1000 nm is more preferable. In addition, in the near-infrared cut filter, a transmittance of in the entire wavelength range of 400 to 650 nm is preferably 70% or more, more preferably 80% or more, and still more preferably 90% or more. In addition, the transmittance at at least one point in a wavelength range of 700 to 1800 nm is preferably 20% or less. In addition, in the near-infrared cut filter, absorbance Amax/absorbance A550, which is a ratio of an absorbance Amax at a maximum absorption wavelength to an absorbance A550 at a wavelength of 550 nm, is preferably 20 to 500, more preferably 50 to 500, still more preferably 70 to 450, and particularly preferably 100 to 400. The near-infrared cut filter can be formed using a curable composition including a near-infrared absorbing pigment.

The near-infrared transmission filter is a filter which transmits at least a part of near-infrared rays. The near-infrared transmission filter may be a filter (transparent film) which transmits both visible light and near-infrared rays, or may be a filter which shields at least a part of visible light and transmits at least a part of near-infrared rays. Examples of the near-infrared transmission filter include filters satisfying spectral characteristics in which the maximum value of a transmittance in a wavelength range of 400 to 640 nm is 20% or less (preferably 15% or less and more preferably 10% or less) and the minimum value of a transmittance in a wavelength range of 1100 to 1300 nm is 70% or more (preferably 75% or more and more preferably 80% or more). The near-infrared transmission filter is preferably a filter which satisfies any one of the following spectral characteristics (1) to (4).

(1): filter in which the maximum value of a transmittance in a wavelength range of 400 to 640 nm is 20% or less (preferably 15% or less and more preferably 10% or less) and the minimum value of a transmittance in a wavelength range of 800 to 1300 nm is 70% or more (preferably 75% or more and more preferably 80% or more).

(2): filter in which the maximum value of a transmittance in a wavelength range of 400 to 750 nm is 20% or less (preferably 15% or less and more preferably 10% or less) and the minimum value of a transmittance in a wavelength range of 900 to 1300 nm is 70% or more (preferably 75% or more and more preferably 80% or more).

(3): filter in which the maximum value of a transmittance in a wavelength range of 400 to 830 nm is 20% or less (preferably 15% or less and more preferably 10% or less) and the minimum value of a transmittance in a wavelength range of 1000 to 1300 nm is 70% or more (preferably 75% or more and more preferably 80% or more).

(4): filter in which the maximum value of a transmittance in a wavelength range of 400 to 950 nm is 20% or less (preferably 15% or less and more preferably 10% or less) and the minimum value of a transmittance in a wavelength range of 1100 to 1300 nm is 70% or more (preferably 75% or more and more preferably 80% or more).

The curable composition according to the embodiment of the present invention can be preferably used as a curable composition for a color filter. Specifically, the curable composition according to the embodiment of the present invention can be preferably used as a curable composition for forming a pixel of a color filter, and can be more preferably used as a curable composition for forming a pixel of a color filter used in a solid-state imaging element.

Hereinafter, the respective components used in the curable composition according to the embodiment of the present invention will be described.

<<Pigment>>

The curable composition according to the embodiment of the present invention contains a pigment. Examples of the pigment include a white pigment, a black pigment, a chromatic pigment, and a near-infrared absorbing pigment. In the present invention, the white pigment includes not only a pure white pigment but also a bright gray (for example, grayish-white, light gray, and the like) pigment close to white. In addition, the pigment may be either an inorganic pigment or an organic pigment. In addition, as the pigment, a material in which a part of an inorganic pigment or an organic-inorganic pigment is replaced with an organic chromophore can also be used. By substituting an inorganic pigment or an organic-inorganic pigment with an organic chromophore, color tone design can be easily performed. In addition, as the pigment, a pigment having a maximum absorption wavelength in a wavelength range of 400 to 2000 nm is preferable, and a pigment having a maximum absorption wavelength in a wavelength range of 400 to 700 nm is more preferable. In addition, in a case of using a pigment (preferably a chromatic pigment) having a maximum absorption wavelength in a wavelength range of 400 to 700 nm, the curable composition according to the embodiment of the present invention can be preferably used as a curable composition for forming a colored pixel in a color filter. Examples of the colored pixel include a red pixel, a green pixel, a blue pixel, a magenta pixel, a cyan pixel, and a yellow pixel.

The average primary particle diameter of the pigment is preferably 1 to 200 nm. The lower limit is preferably 5 nm or more and more preferably 10 nm or more. The upper limit is preferably 180 nm or less, more preferably 150 nm or less, and still more preferably 100 nm or less. In a case where the average primary particle diameter of the pigment is within the above-described range, dispersibility of the pigment in the curable composition is good. In the present invention, the primary particle diameter of the pigment can be determined from an image obtained by observing primary particles of the pigment using a transmission electron microscope. Specifically, a projected area of the primary particles of the pigment is determined, and the corresponding circle-equivalent diameter is calculated as the primary particle diameter of the pigment. In addition, the average primary particle diameter in the present invention is the arithmetic average value of the primary particle diameters with respect to 400 primary particles of the pigment. In addition, the primary particle of the pigment refers to a particle which is independent without aggregation.

(Chromatic Pigment)

The chromatic pigment is not particularly limited, and a known chromatic pigment can be used. Examples of the chromatic pigment include a pigment having a maximum absorption wavelength in a wavelength range of 400 to 700 nm. Examples thereof include a yellow pigment, an orange pigment, a red pigment, a green pigment, a violet pigment, and a blue pigment. Specific examples of these pigments include the following pigments.

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, 231, 232 (methine-based), 233 (quinoline-based), and the like (all of which are yellow pigments);

C. I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, 294 (xanthene-based, Organo Ultramarine, Bluish Red), 295 (azo-based), 296 (azo-based), and the like (all of which are red pigments);

C. I. Pigment Green 7, 10, 36, 37, 58, 59, 62, and 63 (all of which are green pigments);

C. I. Pigment Violet 1, 19, 23, 27, 32, 37, 42, 60 (triarylmethane-based), 61 (xanthene-based), and the like (all of which are violet pigments); and C. I. Pigment Blue 1, 2, 15, 15:1, 15:2, 15:3, 15:4, 15:6, 16, 22, 29, 60, 64, 66, 79, 80, 87 (monoazo-based), 88 (methine-based), and the like (all of which are blue pigments).

In addition, as the green pigment, a halogenated zinc phthalocyanine pigment having an average number of halogen atoms in one molecule of 10 to 14, an average number of bromine atoms in one molecule of 8 to 12, and an average number of chlorine atoms in one molecule of 2 to 5 can also be used. Specific examples thereof include compounds described in WO2015/118720A. In addition, as the green pigment, compounds described in CN2010-6909027A, phthalocyanine compounds described in WO2012/102395A, which have a phosphoric acid ester as a ligand, or the like can also be used.

In addition, as the blue pigment, an aluminum phthalocyanine compound having a phosphorus atom can also be used. Specific examples thereof include the compounds described in paragraph Nos. 0022 to 0030 of JP2012-247591A and paragraph No. 0047 of JP2011-157478A.

In addition, as the yellow pigment, pigments described in JP2017-201003A, pigments described in JP2017-197719A, pigments described in paragraph Nos. 0011 to 0062 and 0137 to 0276 of JP2017-171912A, pigments described in paragraph Nos. 0010 to 0062 and 0138 to 0295 of JP2017-171913A, pigments described in paragraph Nos. of 0011 to 0062 and 0139 to 0190 of JP2017-171914A, and pigments described in paragraph Nos. 0010 to 0065 and 0142 to 0222 of JP2017-171915A can also be used.

In addition, as the yellow pigment, compounds described in JP2018-062644A can also be used. These compounds can also be used as a pigment derivative.

In addition, as the red pigment, diketopyrrolopyrrole compounds described in JP2017-201384A, in which the structure has at least one substituted bromine atom, diketopyrrolopyrrole compounds described in paragraph Nos. 0016 to 0022 of JP6248838B, diketopyrrolopyrrole compounds described in WO2012/0102399A, diketopyrrolopyrrole compounds described in WO2012/0117965A, naphtholazo compounds described in JP2012-229344, and the like can also be used. In addition, as the red pigment, a compound having a structure that an aromatic ring group in which a group bonded with an oxygen atom, a sulfur atom, or a nitrogen atom is introduced to an aromatic ring is bonded to a diketopyrrolopyrrole skeleton can be used. As the compound, a compound represented by Formula (DPP1) is preferable, and a compound represented by Formula (DPP2) is more preferable.

(DPP1)

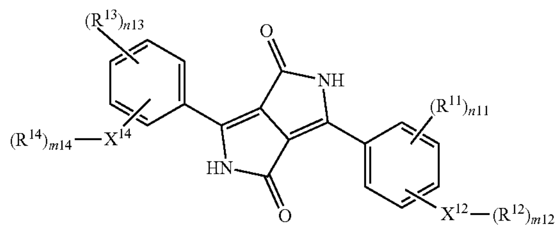

(DPP2)

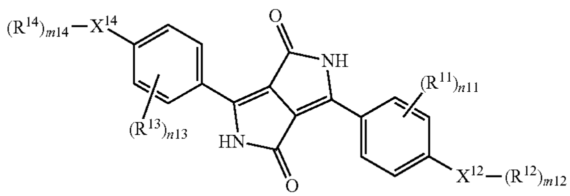

In the formulae, $R^{11}$ and $R^{13}$ each independently represent a substituent, $R^{12}$ and $R^{14}$ each independently represent a hydrogen atom, an alkyl group, an aryl group, or a heteroaryl group, n11 and n13 each independently represent an integer of 0 to 4, $X^{12}$ and $X^{14}$ each independently represent an oxygen atom, a sulfur atom, or a nitrogen atom, in a case where $X^{12}$ is an oxygen atom or a sulfur atom, m12 represents 1, in a case where $X^{12}$ is a nitrogen atom, m12 represents 2, in a case where $X^{14}$ is an oxygen atom or a sulfur atom, m14 represents 1, and in a case where $X^{14}$ is a nitrogen atom, m14 represents 2. Preferred specific examples of the substituent represented by $R^{11}$ and $R^{13}$ include an alkyl group, an aryl group, a halogen atom, an acyl group, an alkoxycarbonyl group, an aryloxycarbonyl group, a heteroaryloxycarbonyl group, an amide group, a cyano group, a nitro group, a trifluoromethyl group, a sulfoxide group, and a sulfo group.

In the present invention, the chromatic pigment may be used in combination of two or more kinds thereof. In addition, in a case where the chromatic pigment is used in combination of two or more kinds thereof, the combination of two or more chromatic pigments may form black. Examples of such a combination include the following aspects (1) to (7). In a case where two or more chromatic pigments are included in the curable composition and the combination of two or more chromatic pigments forms black, the curable composition according to the embodiment of the present invention can be preferably used as a curable composition for the near-infrared transmission filter.

(1) aspect in which a red pigment and a blue pigment are contained.

(2) aspect in which a red pigment, a blue pigment, and a yellow pigment are contained.

(3) aspect in which a red pigment, a blue pigment, a yellow pigment, and a violet pigment are contained.

(4) aspect in which a red pigment, a blue pigment, a yellow pigment, a violet pigment, and a green pigment are contained.

(5) aspect in which a red pigment, a blue pigment, a yellow pigment, and a green pigment are contained.

(6) aspect in which a red pigment, a blue pigment, and a green pigment are contained.

(7) aspect in which a yellow pigment and a violet pigment are contained.

(White Pigment)

Examples of the white pigment include titanium oxide, strontium titanate, barium titanate, zinc oxide, magnesium oxide, zirconium oxide, aluminum oxide, barium sulfate, silica, talc, mica, aluminum hydroxide, calcium silicate, aluminum silicate, hollow resin particles, and zinc sulfide. The white pigment is preferably particles having a titanium atom, more preferably titanium oxide. In addition, the white pigment is preferably a particle having a refractive index of 2.10 or more with respect to light having a wavelength of 589 nm. The above-mentioned refractive index is preferably 2.10 to 3.00 and more preferably 2.50 to 2.75.

In addition, as the white pigment, the titanium oxide described in "Titanium Oxide-Physical Properties and Applied Technology, written by Manabu Kiyono, pages 13 to 45, published on Jun. 25, 1991, published by Shuppan Co., Ltd." can also be used.

The white pigment is not limited to a compound formed of a single inorganic substance, and may be particles combined with other materials. For example, it is preferable to use a particle having a pore or other materials therein, a particle having a number of inorganic particles attached to a core particle, or a core-shell composite particle composed of a core particle formed of polymer particles and a shell layer formed of inorganic fine nanoparticles. With regard to the core-shell composite particle composed of a core particle formed of polymer particles and a shell layer formed of inorganic fine nanoparticles, reference can be made to, for example, the descriptions in paragraph Nos. 0012 to 0042 of JP2015-047520A, the contents of which are incorporated herein by reference.

As the white pigment, hollow inorganic particles can also be used. The hollow inorganic particles refer to inorganic particles having a structure with a cavity therein, and the cavity is enclosed by an outer shell. As the hollow inorganic particles, hollow inorganic particles described in JP2011-075786A, WO2013/061621A, JP2015-164881A, and the like can be used, the contents of which are incorporated herein by reference.

(Black Pigment)

The black pigment is not particularly limited, and a known black pigment can be used. Examples thereof include carbon black, titanium black, and graphite, and carbon black or titanium black is preferable and titanium black is more preferable. The titanium black is black particles containing a titanium atom, and is preferably lower titanium oxide or titanium oxynitride. The surface of the titanium black can be modified, as necessary, according to the purpose of improving dispersibility, suppressing aggregating properties, and the like. For example, the surface of the titanium black can be coated with silicon oxide, titanium oxide, germanium oxide, aluminum oxide, magnesium oxide, or zirconium oxide. In addition, a treatment with a water-repellent substance as described in JP2007-302836A can be performed. Examples of the black pigment include Color Index (C. I.) Pigment Black 1 and 7. It is preferable that the titanium black has a small primary particle diameter of the individual particles and has a small average primary particle diameter. Specifically, the average primary particle diameter thereof is preferably 10 to 45 nm. The titanium black can be used as a dispersion. Examples thereof include a dispersion which includes titanium black particles and silica particles and in which the content ratio of Si atoms to Ti atoms is adjusted to a range of 0.20 to 0.50. With regard to the dispersion, reference can be made to the description in paragraphs 0020 to 0105 of JP2012-169556A, the contents of which are incorporated herein by reference. Examples of a commercially available product of the titanium black include Titanium black 10S, 12S, 13R, 13M, 13M-C, 13R-N, 13M-T (trade name; manufactured by Mitsubishi Materials Corporation) and Tilack D (trade name; manufactured by Akokasei Co., Ltd.).

(Near-Infrared Absorbing Pigment)

The near-infrared absorbing pigment is preferably an organic pigment. In addition, the near-infrared absorbing pigment preferably has a maximum absorption wavelength in a wavelength range of more than 700 nm and 1400 nm or less. In addition, the maximum absorption wavelength of the near-infrared absorbing pigment is preferably 1200 nm or less, more preferably 1000 nm or less, and still more preferably 950 nm or less. In addition, in the near-infrared absorbing pigment, $A_{550}/A_{max}$, which is a ratio of an absorbance $A_{550}$ at a wavelength of 550 nm to an absorbance $A_{max}$ at the maximum absorption wavelength, is preferably 0.1 or less, more preferably 0.05 or less, still more preferably 0.03 or less, and particularly preferably 0.02 or less. The lower limit is not particularly limited, but for example, may be 0.0001 or more or may be 0.0005 or more. In a case where the ratio of the above-described absorbance is within the above-described range, a near-infrared absorbing pigment excellent in visible transparency and near-infrared shielding properties can be obtained. In the present invention, the maximum absorption wavelength of the near-infrared absorbing pigment and values of absorbance at each wavelength are values obtained from an absorption spectrum of a film formed by using a photosensitive composition including the near-infrared absorbing pigment.

Examples of the near-infrared absorbing pigment include a pyrrolopyrrole compound, a cyanine compound, a squarylium compound, a phthalocyanine compound, a naphthalocyanine compound, a quaterrylene compound, a merocyanine compound, a croconium compound, an oxonol compound, an iminium compound, a dithiol compound, a triarylmethane compound, a pyrromethene compound, an azomethine compound, an anthraquinone compound, a dibenzofuranone compound, a dithiolene metal complex, a metal oxide, and a metal boride. Examples of the pyrrolopyrrole compound include compounds described in paragraph Nos. 0016 to 0058 of JP2009-263614A, compounds described in paragraph Nos. 0037 to 0052 of JP2011-068731A, and compounds described in paragraph Nos. 0010 to 0033 of WO2015/166873A. Examples of the squarylium compound include compounds described in paragraph Nos. 0044 to 0049 of JP2011-208101A, compounds described in paragraph Nos. 0060 and 0061 of JP6065169B, compounds described in paragraph No. 0040 of WO2016/181987A, compounds described in JP2015-176046A, compounds described in paragraph No. 0072 of WO2016/190162A, compounds described in paragraph Nos. 0196 to 0228 of JP2016-074649A, compounds described in paragraph No. 0124 of JP2017-067963A, compounds described in WO2017/135359A, compounds described in JP2017-114956A, compounds described in JP6197940B, and compounds described in WO2016/120166A. Examples of the cyanine compound include compounds described in paragraph Nos. 0044 and 0045 of JP2009-108267A, compounds described in paragraph Nos. 0026 to 0030 of JP2002-194040A, compounds described in JP2015-172004A, compounds described in JP2015-172102A, compounds described in JP2008-088426A, compounds described in paragraph No. 0090 of WO2016/190162A, and compounds described in JP2017-031394A. Examples of the croconium compound include compounds described in JP2017-082029A. Examples of the iminium compound include compounds described in JP2008-528706A, compounds described in JP2012-012399A, compounds described in JP2007-092060A, and compounds described in paragraph Nos. 0048 to 0063 of WO2018/043564A. Examples of the phthalocyanine compound include compounds described in paragraph No. 0093 of JP2012-077153A, oxytitanium phthalocyanine described in JP2006-343631A, compounds described in paragraph Nos. 0013 to 0029 of JP2013-195480A, and vanadium phthalocyanine compounds described in JP6081771B. Examples of the naphthalocyanine compound include compounds described in paragraph No. 0093 of JP2012-077153A. Examples of the dithiolene metal complex include compounds described in JP5733804B. Examples of the metal oxide include indium tin oxide, antimony tin oxide, zinc oxide, Al-doped zinc oxide, fluorine-doped tin dioxide, niobium-doped titanium dioxide, and tungsten oxide. The details of tungsten oxide can be found in paragraph No. 0080 of JP2016-006476A, the content of which is incorporated herein by reference. Examples of the metal boride include lanthanum boride. Examples of a commercially available product of lanthanum boride include $LaB_6$-F (manufactured by JAPAN NEW METALS CO., LTD.). In addition, as the metal boride, compounds described in WO2017/119394A can also be used. Examples of a commercially available product of indium tin oxide include F-ITO (manufactured by DOWA HIGHTECH CO., LTD.).

In addition, as the near-infrared absorbing pigment, squarylium compounds described in JP2017-197437A, squarylium compounds described in JP2017-025311A, squarylium compounds described in WO2016/154782A, squarylium compounds described in JP5884953B, squarylium compounds described in JP6036689B, squarylium compounds described in JP5810604B, squarylium compounds described in paragraph Nos. 0090 to 0107 of WO2017/213047A, pyrrole ring-containing compounds described in paragraph Nos. 0019 to 0075 of JP2018-054760A, pyrrole ring-containing compounds described in paragraph Nos. 0078 to 0082 of JP2018-040955A, pyrrole ring-containing compounds described in paragraph Nos. 0043 to 0069 of JP2018-002773A, squarylium compounds having an aromatic ring at the α-amide position described in paragraph Nos. 0024 to 0086 of JP2018-041047A, amide-linked squarylium compounds described in JP2017-179131A, compounds having a pyrrole bis-type squarylium skeleton or a croconium skeleton described in JP2017-141215A, dihydrocarbazole bis-type squarylium compounds described in JP2017-082029, asymmetric compounds described in paragraph Nos. 0027 to 0114 of JP2017-068120A, pyrrole ring-containing compounds (carbazole type) described in JP2017-067963A, phthalocyanine compounds described in JP6251530B, and the like can also be used.

The content of the pigment in the total solid content of the curable composition is preferably 5 mass % or more, more preferably 10 mass % or more, still more preferably 20 mass % or more, and even more preferably 30 mass % or more, and particularly preferably 40 mass % or more. The upper limit is preferably 80 mass % or less, more preferably 70 mass % or less, and still more preferably 60 mass % or less.

<<Pigment Derivative>>

The curable composition according to the embodiment of the present invention can contain a pigment derivative.

Examples of the pigment derivative include a compound having a structure in which a part of a chromophore is substituted with an acid group, a basic group, or a phthalimidomethyl group. Examples of the chromophore constituting the pigment derivative include a quinoline skeleton, a benzimidazolone skeleton, a diketopyrrolopyrrole skeleton, an azo skeleton, a phthalocyanine skeleton, an anthraquinone skeleton, a quinacridone skeleton, a dioxazine skeleton, a perinone skeleton, a perylene skeleton, a thioindigo skeleton, an isoindoline skeleton, an isoindolinone skeleton, a quinophthalone skeleton, a threne skeleton, and a metal complex skeleton. Among these, a quinoline skeleton, a benzimidazolone skeleton, a diketopyrrolopyrrole skeleton, an azo skeleton, a quinophthalone skeleton, an isoindoline skeleton, or a phthalocyanine skeleton is preferable, and an azo skeleton or a benzimidazolone skeleton is more preferable. As the acid group included in the pigment derivative, a sulfo group or a carboxyl group is preferable and a sulfo group is more preferable. As the basic group included in the pigment derivative, an amino group is preferable and a tertiary amino group is more preferable.

In the present invention, as the pigment derivative, a pigment derivative having excellent visible transparency (hereinafter, also referred to as a transparent pigment derivative) can be contained. The maximum value (εmax) of the molar light absorption coefficient of the transparent pigment derivative in a wavelength range of 400 to 700 nm is preferably 3000 $L \cdot mol^{-1} \cdot cm^{-1}$ or less, more preferably 1000 $L \cdot mol^{-1} \cdot cm^{-1}$ or less, and still more preferably 100 $L \cdot mol^{-1} \cdot cm^{-1}$ or less. The lower limit of εmax is, for example, 1 $L \cdot mol^{-1} \cdot cm^{-1}$ or more and may be 10 $L \cdot mol^{-1} \cdot cm^{-1}$ or more.

Specific examples of the pigment derivative include compounds described in Examples described later, compounds described in paragraph Nos. 0162 to 0183 of JP2011-252065A, and compounds described in JP2003-081972A.

The content of the pigment derivative is preferably 1 to 30 parts by mass and still more preferably 3 to 20 parts by mass with respect to 100 parts by mass of the pigment.

<<Dye>>

The curable composition according to the embodiment of the present invention can contain a dye. As the dye, a known dye can be used without any particular limitation. The dye may be a chromatic dye or may be a near-infrared absorbing dye. Examples of the chromatic dye include a pyrazoleazo compound, an anilinoazo compound, a triarylmethane compound, an anthraquinone compound, an anthrapyridone compound, a benzylidene compound, an oxonol compound, a pyrazolotriazoleazo compound, a pyridoneazo compound, a cyanine compound, a phenothiazine compound, a pyrrolopyrazoleazomethine compound, a xanthene compound, a phthalocyanine compound, a benzopyran compound, an indigo compound, and a pyrromethene compound. In addition, thiazole compounds described in JP2012-158649A, azo compounds described in JP2011-184493A, or azo compounds described in JP2011-145540A can also be used. In addition, as yellow dyes, quinophthalone compounds described in paragraph Nos. 0011 to 0034 of JP2013-054339A, quinophthalone compounds described in paragraph Nos. 0013 to 0058 of JP2014-026228A, or the like can also be used. Examples of the near-infrared absorbing dye include a pyrrolopyrrole compound, a rylene compound, an oxonol compound, a squarylium compound, a cyanine compound, a croconium compound, a phthalocyanine compound, a naphthalocyanine compound, a pyrylium compound, an azurenium compound, an indigo compound, and a pyrromethene compound.

The content of the dye in the total solid content of the curable composition is preferably 1 mass % or more, more preferably 5 mass % or more, and particularly preferably 10 mass % or more. The upper limit is not particularly limited, but is preferably 70 mass % or less, more preferably 65 mass % or less, and still more preferably 60 mass % or less.

In addition, the content of the dye is preferably 5 to 50 parts by mass with respect to 100 parts by mass of the pigment. The upper limit is preferably 45 parts by mass or less and more preferably 40 parts by mass or less. The lower limit is preferably 10 parts by mass or more and still more preferably 15 parts by mass or more.

In addition, it is also possible that the curable composition according to the embodiment of the present invention does not substantially contain the dye. The case where the curable composition according to the embodiment of the present invention does not substantially include the dye means that the content of the dye in the total solid content of the curable composition according to the embodiment of the present invention is preferably 0.1 mass % or less, more preferably 0.05 mass % or less, and particularly preferably 0 mass %.

<<Resin>>

The curable composition according to the embodiment of the present invention includes a resin. The resin is blended in, for example, an application for dispersing particles such as a pigment in a composition or an application as a binder. Mainly, a resin which is used for dispersing particles and the like in a composition is also referred to as a dispersant. However, such applications of the resin are merely exemplary, and the resin can also be used for other purposes in addition to such applications.

The resin used in the curable composition according to the embodiment of the present invention includes a resin A including a repeating unit having a graft chain of a predetermined poly(meth)acrylate structure described later and a repeating unit having an acid group. The curable composition according to the embodiment of the present invention may include one resin A or two or more kinds of resins.

The content of the resin in the total solid content of the curable composition is preferably 10 to 50 mass %. The upper limit is preferably 40 mass % or less and more preferably 30 mass % or less. The lower limit is preferably 15 mass % or more and more preferably 20 mass % or more.

The content of the resin A in the resin included in the curable composition according to the embodiment of the present invention is preferably 5 to 100 mass %. The upper limit is preferably 99 mass % or less and more preferably 95 mass % or less. The lower limit is preferably 6 mass % or more and more preferably 10 mass % or more.

In the curable composition according to the embodiment of the present invention, the resin A is also preferably used as a dispersant. In a case where the resin A is used as a dispersant, the content of the resin A is preferably 10 to 100 parts by mass with respect to 100 parts by mass of the pigment. The upper limit is preferably 90 parts by mass or less and more preferably 80 parts by mass or less. The lower limit is preferably 6 parts by mass or more and more preferably 10 parts by mass or more. In addition, in a case where the resin A is used as a dispersant, the content of the resin A in the total content of the dispersant is preferably 5 to 100 mass %, more preferably 20 to 100 mass %, and still more preferably 30 to 100 mass %.

(Resin A)

Next, the resin A will be described. The resin A includes a repeating unit having a graft chain of a poly(meth)acrylate structure and a repeating unit having an acid group. The above-described graft chain of a poly(meth)acrylate structure includes a repeating unit represented by Formula (1). In the present invention, the graft chain means a polymer chain branched and extended from the main chain of the repeating unit. The length of the graft chain is not particularly limited, and in a case where the graft chain gets longer, a steric repulsion effect is enhanced, and thus, the dispersibility of a pigment or the like can be increased. As the graft chain, the number of atoms excluding the hydrogen atoms is preferably 40 to 10000, the number of atoms excluding the hydrogen atoms is more preferably 50 to 2000, and the number of atoms excluding the hydrogen atoms is still more preferably 60 to 500.

The weight-average molecular weight of the resin A is preferably 3000 to 50000. The lower limit is preferably 5000 or more and more preferably 7000 or more. The upper limit is preferably 40000 or less and more preferably 30000 or less. In a case where the weight-average molecular weight of the resin A is within the above-described range, it is easy to achieve both excellent developability and storage stability.

The acid value of the resin A is preferably 20 to 150 mgKOH/g. The upper limit is preferably 130 mgKOH/g or less and more preferably 110 mgKOH/g or less. The lower limit is preferably 30 mgKOH/g or more and more preferably 40 mgKOH/g or more. In a case where the acid value of the resin A is within the above-described range, it is easy to achieve both excellent developability and storage stability.

First, the repeating unit having an acid group, which is included in the resin A, will be described. The repeating unit having an acid group includes a repeating unit represented by Formula (a1).

(a1)

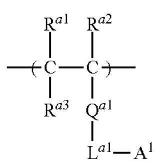

In Formula (a1), $R^{a1}$ to $R^{a3}$ each independently represent a hydrogen atom or an alkyl group. The alkyl group represented by $R^{a1}$ to $R^{a3}$ preferably has 1 to 10 carbon atoms, more preferably has 1 to 3 carbon atoms, and still more preferably has 1 carbon atom.

In Formula (a1), $Q^{a1}$ represents —COO—, —CONH—, or a phenylene group, and is preferably —COO— or —CONH— and more preferably —COO—.

In Formula (a1), $L^{a1}$ represents a single bond or a divalent linking group. Examples of the divalent linking group represented by $L^{a1}$ include an alkylene group (preferably an alkylene group having 1 to 12 carbon atoms), an arylene group (preferably an arylene group having 6 to 20 carbon atoms), —NH—, —SO—, —$SO_2$—, —CO—, —O—, —COO—, —OCO—, —S—, and a group formed by combination of two or more of these groups. The alkylene group and the arylene group may have a substituent. Examples of the substituent include a hydroxyl group and a halogen atom. $L^{a1}$ is preferably a single bond.

In Formula (a1), $A^1$ represents a hydrogen atom or an acid group. However, in a case where $A^1$ is a hydrogen atom, $Q^{a1}$ is —COO— and $L^{a1}$ is a single bond, or $L^{a1}$ is a divalent linking group in which the terminal of $L^{a1}$ on the $A^1$ side is —COO—. Examples of the acid group represented by $A^1$ include a carboxyl group, a sulfo group, and a phosphoric acid group, and a carboxyl group is preferable.

In Formula (a1), a combination in which $Q^{a1}$ is —COO—, $L^{a1}$ is a single bond, and $A^1$ is a hydrogen atom is particularly preferable. According to this aspect, more excellent storage stability is easily obtained.

Specific examples of the repeating unit having an acid group include repeating units a1-1 to a1-5 described in Examples described later, and from the reason that it is easy to achieve both excellent developability and storage stability, a1-1 or a1-5 is preferable.

It is preferable that the resin A contains 3 to 50 mass % of the repeating unit having an acid group in all the repeating units of the resin A. The upper limit is preferably 45 mass % or less and more preferably 40 mass % or less. The lower limit is preferably 4 mass % or more and more preferably 5 mass % or more.

Next, the repeating unit having a graft chain of a poly(meth)acrylate structure, which is included in the resin A, will be described. First, the poly(meth)acrylate structure will be described.

The poly(meth)acrylate structure includes a repeating unit represented by Formula (1).

Formula (1)

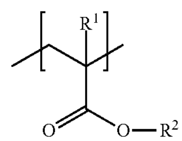

In Formula (1), $R^1$ represents a hydrogen atom or a methyl group, and $R^2$ represents a hydrocarbon group having 1 to 20 carbon atoms, where $R^1$ is a hydrogen atom in a case where $R^2$ is a methyl group, and $R^2$ is a hydrocarbon group having 2 or more carbon atoms in a case where $R^1$ is a methyl group.

The hydrocarbon group represented by $R^2$ has 1 to 20 carbon atoms, and preferably has 2 to 20 carbon atoms, more preferably has 2 to 15 carbon atoms, still more preferably has 2 to 10 carbon atoms, and particularly preferably has 2 to 8 carbon atoms.

Examples of the hydrocarbon group represented by $R^2$ in Formula (1) include an alkyl group, an alkenyl group, an alkynyl group, and an aryl group, and an alkyl group is preferable. Examples of the alkyl group include a linear alkyl group, a branched alkyl group, and a cyclic alkyl group, and a linear alkyl group or a branched alkyl group is preferable and a linear alkyl group is more preferable. The alkyl group may have a substituent. Examples of the substituent include an aryl group, an alkoxy group, an aryloxy group, a halogen atom, and a nitrile group, and from the reason that it is easy to obtain excellent moisture resistance, an aryl group is preferable. From the viewpoint of moisture resistance and developability, the alkyl group is preferably an unsubstituted alkyl group.

From the viewpoint of developability, the hydrocarbon group having 1 to 20 carbon atoms, which is represented by $R^2$ in Formula (1), is preferably a primary or secondary alkyl group, more preferably a primary alkyl group, still more preferably a primary linear alkyl group, and particularly preferably an unsubstituted primary linear alkyl group.

The graft chain of a poly(meth)acrylate structure preferably includes a repeating unit in which $R^1$ of Formula (1) is a hydrogen atom. According to this aspect, more excellent developability is easily obtained. In this case, the graft chain may consist only of a repeating unit in which $R^1$ of Formula (1) is a hydrogen atom, or may further include a repeating unit other than the repeating unit in which $R^1$ of Formula (1) is a hydrogen atom. As the other repeating unit, a repeating unit represented by Formula (2) is preferable. That is, it is also preferable that the graft chain of a poly(meth)acrylate structure includes a repeating unit in which $R^1$ of Formula (1) is a hydrogen atom, and a repeating unit represented by Formula (2). Even in this aspect, more excellent developability is easily obtained. Further, although the details are unknown, the effect of further improving the dispersibility of the pigment can be expected while maintaining the developability. In a case where the above-described graft chain includes a repeating unit in which $R^1$ of Formula (1) is a hydrogen atom and a repeating unit represented by Formula (2), the mass ratio of the repeating units is preferably repeating unit in which $R^1$ of Formula (1) is a hydrogen atom:a repeating unit represented by Formula (2)=1:0.05 to 9, more preferably 1:0.1 to 9, and still more preferably 1:0.15 to 8. In a case where the mass ratio of the repeating units is within the above-described range, it is easy to achieve both excellent developability and storage stability.

Formula (2)

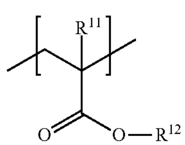

In Formula (2), $R^{11}$ represents a methyl group, and $R^{12}$ represents a hydrocarbon group having 1 to 20 carbon atoms.

The hydrocarbon group represented by $R^{11}$ has 1 to 20 carbon atoms, and more preferably has 1 to 15 carbon atoms, still more preferably has 1 to 10 carbon atoms, and particularly preferably has 1 to 8 carbon atoms. Examples of the hydrocarbon group represented by $R^{12}$ include an alkyl group, an alkenyl group, an alkynyl group, and an aryl group, and an alkyl group is preferable. Examples of the alkyl group include a linear alkyl group, a branched alkyl group, and a cyclic alkyl group, and a linear alkyl group or a branched alkyl group is preferable and a linear alkyl group is more preferable. The alkyl group may have a substituent. Examples of the substituent include an aryl group, an alkoxy group, an aryloxy group, a halogen atom, and a nitrile group, and from the reason that it is easy to obtain excellent moisture resistance, an aryl group is preferable. From the viewpoint of moisture resistance and developability, the alkyl group is preferably an unsubstituted alkyl group.

A terminal structure of the above-described graft chain is not particularly limited. The terminal structure may be a hydrogen atom or a substituent. Examples of the substituent include an alkyl group, an aryl group, a heteroaryl group, an alkoxy group, an aryloxy group, a heteroaryloxy group, an alkylthioether group, an arylthioether group, and a heteroarylthioether group. Among these, from the viewpoint of improvement of the dispersibility of the pigment or the like, a group having a steric repulsion effect is preferable, and an alkyl group or alkoxy group having 5 to 24 carbon atoms is preferable. The alkyl group and the alkoxy group may be linear, branched, or cyclic, and are preferably linear or branched.

The weight-average molecular weight of the above-described graft chain is preferably 500 to 10000. The upper limit is preferably 8000 or less and more preferably 6000 or less. The lower limit is preferably 1000 or more and more preferably 1500 or more. In a case where the weight-average molecular weight of the graft chain is 10000 or less (preferably 8000 or less and more preferably 6000 or less), excellent developability can be obtained. In addition, in a case where the weight-average molecular weight of the graft chain is 500 or more (preferably 1000 or more and more preferably 1500 or more), the dispersibility of the pigment can be improved, and the storage stability of the curable composition can be improved. In the present specification, the weight-average molecular weight of the graft chain is a value calculated from the weight-average molecular weight of the raw material monomer used for the polymerization of the repeating unit having the graft chain. For example, the repeating unit having the graft chain can be formed by polymerizing a macromonomer. Here, the macromonomer means a polymer compound in which a polymerizable group is introduced at a polymer terminal. In addition, as the value of the weight-average molecular weight of the raw material monomer, a value in terms of polystyrene through measurement by a gel permeation chromatography (GPC) method is used.

The glass transition temperature of the above-described graft chain is preferably 100° C. or lower, more preferably 80° C. or lower, and still more preferably 60° C. or lower. In a case where the glass transition temperature of the graft chain is 100° C. or lower (preferably 80° C. or lower and more preferably 60° C. or lower), excellent developability can be obtained. In addition, from the viewpoint of pattern adhesiveness after development, the lower limit value of the glass transition temperature of the graft chain is preferably −60° C. or higher and more preferably −25° C. or higher. In the present specification, the glass transition temperature of the graft chain is a value calculated using a glass transition temperature of a homopolymer of the monomer corresponding to the repeating unit of the graft chain. As the value of the glass transition temperature of the homopolymer, the value of the glass transition temperature of the homopolymer described in Polymer Handbook (Wiley-Interscience) is used. Specifically, in a case where the graft chain is a homopolymer, the value of the glass transition temperature of the homopolymer described in Polymer Handbook (Wiley-Interscience) is used. In addition, in a case where the graft chain is a copolymer, the sum of values obtained by multiplying the value of each glass transition temperature of the homopolymer of the monomer which corresponds to each repeating unit of the copolymer by the mass ratio of each repeating unit of the copolymer is used. A case in which the graft chain is a copolymer of methyl methacrylate and n-butyl acrylate and is a copolymer consisting of 50 mass % of a repeating unit derived from methyl methacrylate and 50 mass % of a repeating unit derived from n-butyl acrylate will be specifically described by taking as an example. Since the glass transition temperature of the homopolymer of methyl methacrylate is 105° C. and the glass transition temperature of the homopolymer of n-butyl acrylate is −54° C., the glass transition temperature of the above-described copolymer is (105° C.×0.5)+(−54° C.×0.5)=52.5+(−27)=25.5° C.

The Hansen solubility parameter of the above-described graft chain is preferably 7.8 to 9.5 $(cal/cm^3)^{0.5}$. The upper limit is preferably 9.4 $(cal/cm^3)^{0.5}$ or less and more preferably 9.1 $(cal/cm^3)^{0.5}$ or less. The lower limit is preferably $(8.0\ cal/cm^3)^{0.5}$ or more and more preferably 8.2 $(cal/cm^3)^{0.5}$ or more. In a case where the Hansen solubility parameter of the graft chain is within the above-described range, the dispersibility of the pigment is good and excellent storage stability can be easily obtained.

The Hansen solubility parameter is defined by three-dimensional parameters of London dispersion force element, molecular polarization element (dipole-dipole force element), and hydrogen bond element, and is a value represented by the following expression (H-1). The details regarding the Hansen solubility parameter are described in "PROPERTIES OF POLYMERS" (writer: D. W. VAN KREVELEN, publisher: ELSEVIER SCIENTIFIC PUBLISHING COMPANY, published in 1989, 5th edition).

$$\delta^2=(\delta D)^2+(\delta P)^2+(\delta H)^2 \qquad \text{(H-1)}$$

δ: Hansen solubility parameter

δD: London dispersion force element

δP: molecular polarization element (dipole-dipole force element)

δH: hydrogen bond element

In the present specification, the Hansen solubility parameter of the graft chain is obtained from the above expression (H-1) by calculating London dispersion force element (δD), molecular polarization element (dipole-dipole force element) (δP), and hydrogen bond element (δH) of the monomer corresponding to the repeating unit of the graft chain using Hansen Solubility Parameters in Practice (HSPiP), ver. 4.1.07, which is a program developed by Dr. Hansen's group proposed the Hansen solubility parameter. In addition, in a case where the graft chain is a copolymer, the sum of values obtained by multiplying the value of Hansen solubility parameter of the monomer which corresponds to each repeating unit of the copolymer by the mass ratio of each repeating unit of the copolymer is used.

Examples of the repeating unit having the graft chain of a poly(meth)acrylate structure, which is included in the resin A, include a repeating unit represented by Formula (a2).

(a2)

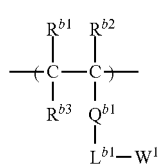

In Formula (a2), $R^{b1}$ to $R^{b3}$ each independently represent a hydrogen atom or an alkyl group. The number of carbon atoms in the alkyl group represented by $R^{b1}$ to $R^{b3}$ is preferably 1 to 10, more preferably 1 to 3, and still more preferably 1.

In Formula (a2), $Q^{b1}$ represents —COO—, —CONH—, or a phenylene group, and is preferably —COO— or —CONH— and more preferably —COO—.

In Formula (a2), $L^{b1}$ represents a single bond or a divalent linking group. Examples of the divalent linking group represented by $L^{b1}$ include an alkylene group (preferably an alkylene group having 1 to 12 carbon atoms), an arylene group (preferably an arylene group having 6 to 20 carbon atoms), —NH—, —SO—, —$SO_2$—, —CO—, —O—, —COO—, —OCO—, —S—, and a group formed by combination of two or more of these groups. The alkylene group and the arylene group may have a substituent. Examples of the substituent include a hydroxyl group and a halogen atom. $L^{b1}$ is preferably a divalent linking group. In addition, from the viewpoint of producing suitability and producing cost, the terminal of the divalent linking group represented by $L^{b1}$ on the $W^1$ side is preferably S. Specific examples of the divalent linking group represented by $L^{b1}$ include an alkylene group-COO-alkylene group-S—, an alkylene group-OCO-alkylene group-S—, an alkylene group-NHCO-alkylene group-S—, and an alkylene group-CONH-alkylene group-S—. In addition, from the viewpoint of producing suitability and producing cost, the divalent linking group represented by $L^{b1}$ preferably has 4 or more atoms, more preferably has 6 or more atoms, still more preferably has 8 or more atoms, and even more preferably 10 or more atoms constituting a chain linking $Q^{b1}$ and $W^1$. In addition, from the viewpoint of dispersibility of the pigment, the upper limit is preferably 30 or less, more preferably 20 or less, still more preferably 18 or less, and particularly preferably 16 or less. For example, in a case of the following repetition, the number of atoms constituting a chain linking $Q^{b1}$ (—COO—) and $W^1$ is 8. The numerical value added to the site of $L^{b1}$ in the following structural formula represents an order of the arrangement of atoms constituting the chain linking $Q^{b1}$ (—COO—) and $W^1$.

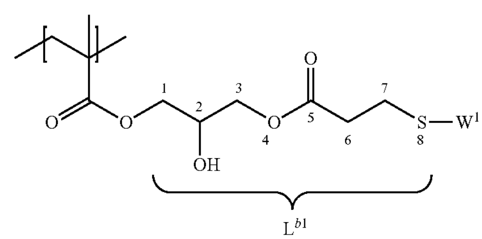

In Formula (a2), $W^1$ represents a graft chain of a poly(meth)acrylate structure. Examples of the graft chain of a poly(meth)acrylate structure include those described above.

Specific examples of the repeating unit having a graft chain of a poly(meth)acrylate structure include repeating units a2-1 to a2-19, and a2-21 to 25 described in Examples described later, and from the reason that it is easy to achieve both storage stability, developability, and adhesiveness at a high level, a2-2, a2-3, a2-7, a2-8, a2-12 to a2-19, and a2-21 to 25 are preferable, and a2-21 to 25 are more preferable.

It is preferable that the resin A contains 20 to 95 mass % or more of the repeating unit having a graft chain of a poly(meth)acrylate structure in all the repeating units of the resin A. The upper limit is preferably 91 mass % or less and more preferably 80 mass % or less. The lower limit is preferably 25 mass % or more and more preferably 30 mass % or more.

The resin A may include a repeating unit other than the above-described repeating unit having an acid group and repeating unit having a graft chain of a poly(meth)acrylate structure. Examples of the other repeating units include a repeating unit represented by Formula (a3).

(a3)

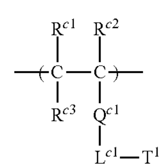

In Formula (a3), $R^{c1}$ to $R^{c3}$ each independently represent a hydrogen atom or an alkyl group. The number of carbon atoms in the alkyl group represented by $R^{c1}$ to $R^{c3}$ is preferably 1 to 10, more preferably 1 to 3, and still more preferably 1.

In Formula (a3), $Q^{c1}$ represents —COO—, —CONH—, or a phenylene group, and is preferably —COO— or —CONH— and more preferably —COO—.

In Formula (a3), $L^{c1}$ represents a single bond or a divalent linking group. Examples of the divalent linking group represented by $L^{c1}$ include an alkylene group (preferably an alkylene group having 1 to 12 carbon atoms), an arylene group (preferably an arylene group having 6 to 20 carbon atoms), —NH—, —SO—, —$SO_2$—, —CO—, —O—, —COO—, —OCO—, —S—, and a group formed by combination of two or more of these groups. The divalent linking group represented by $L^{c1}$ is preferably an alkylene group. The alkylene group and the arylene group may have a substituent. Examples of the substituent include a hydroxyl group and a halogen atom. $L^{c1}$ is preferably a divalent linking group.

In Formula (3), $T^1$ represents a substituent. Examples of the substituent include an alkyl group, an aryl group, an alkoxy group, an aryloxy group, a vinyl group, an allyl group, and a (meth)acryloyl group.

Specific examples of the other repeating units include repeating units a3-1 to a3-3 described in Examples described later.

In a case where the resin A includes other repeating units, the content of the other repeating units is preferably 5 to 70 mass % in all the repeating units of the resin A. The upper limit is preferably 65 mass % or less and more preferably 60 mass % or less. The lower limit is preferably 6 mass % or more and more preferably 8 mass % or more.

The method for synthesizing the resin A is not particularly limited, and a known method or a method applying the known method can be used for the synthesis. Examples of a solvent used for the polymerization include the solvents described in the section of solvents used in the curable composition. In addition, a polymerization initiator for synthesizing the main chain and the graft chain is not particularly limited, and a known polymerization initiator can be used. Examples of the polymerization initiator include a water-soluble azo polymerization initiator and an oil-soluble azo polymerization initiator. Examples of the water-soluble azo polymerization initiator include 4,4'-azobis(4-cyanovaleric acid), 2,2'-azobis[2(2-imidazolin-2-yl)propane] dihydrochloride, 2,2'-azobis[2-(2-imidazolin-2-yl)propane] disulfate/dihydrate, 2,2'-azobis(2-methylpropionamidine) dihydrochloride, 2,2'-azobis[N-(2-carboxyethyl)-2-methylpropionamidine] tetrahydrate, and 2,2'-azobis[2-methyl-N-(2-hydroxyethyl)propionamide]. Examples of the oil-soluble azo polymerization initiator include 2,2'-azobis (isobutyronitrile), 2,2'-azobis(4-methoxy-2,4-dimethylvaleronitrile), 2,2'-azobis(2,4-dimethylvaleronitrile), 2,2'-azobis(methyl isobutyrate), 2,2'-azobis(2-methylbutyronitrile), 1,1'-azobis(cyclohexane-1-carbonitrile), 2,2'-azobis(N-butyl-2-methylpropionamide), 1,1'-azobis(methyl 1-cyclohexanecarboxylate), and 2,2'-azobis(methyl 2-methylpropionate).

(Other Resins)

The curable composition according to the embodiment of the present invention can further include a resin other than the resin A (hereinafter, also referred to an other resins).

The weight-average molecular weight (Mw) of the other resins is preferably 2000 to 2000000. The upper limit is preferably 1000000 or less and more preferably 500000 or less. The lower limit is preferably 3000 or more, more preferably 4000 or more, and still more preferably 5000 or more.

Examples of the other resins include a (meth)acrylic resin, a (meth)acrylamide resin, an epoxy resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamideimide resin, a polyolefin resin, a cyclic olefin resin, a polyester resin, a styrene resin, and a siloxane resin.

The other resins are also preferably a resin having an acid group. Examples of the acid group include a carboxyl group, a phosphoric acid group, a sulfo group, and a phenolic hydroxyl group. The resin having an acid group can also be used as an alkali-soluble resin or a dispersant. The acid value of the resin having an acid group is preferably 30 to 500 mgKOH/g. The lower limit is more preferably 50 mgKOH/g or more and still more preferably 70 mgKOH/g or more. The upper limit is more preferably 400 mgKOH/g or less, still more preferably 200 mgKOH/g or less, particularly preferably 150 mgKOH/g or less, and most preferably 120 mgKOH/g or less.

As the other resins, a resin including a repeating unit derived from a compound represented by Formula (ED1) and/or a compound represented by Formula (ED2) (hereinafter, these compounds will also be referred to as an "ether dimer") is also preferable.

(ED1)

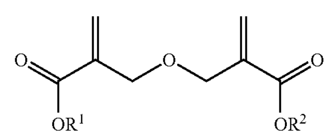

In Formula (ED1), $R^1$ and $R^2$ each independently represent a hydrogen atom or a hydrocarbon group having 1 to 25 carbon atoms, which may have a substituent.

(ED2)

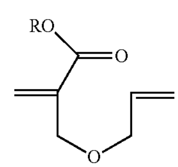

In Formula (ED2), R represents a hydrogen atom or an organic group having 1 to 30 carbon atoms. Specific examples of Formula (ED2) can be found in the description of JP2010-168539A.

Specific examples of the ether dimer can be found in paragraph No. 0317 of JP2013-029760A, the contents of which are incorporated herein by reference.

The other resins are also preferably a resin including a repeating unit having a polymerizable group. By using a resin including a repeating unit having a polymerizable group, it is possible to form a film having excellent color loss resistance, solvent resistance, and heat resistance. Examples of the polymerizable group include ethylenically unsaturated bonding groups such as a vinyl group, a (meth)allyl group, and a (meth)acryloyl group.

It is also preferable that the other resins are a resin including a repeating unit derived from a compound represented by Formula (X).

(X)

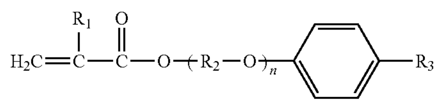

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may include a benzene ring. n represents an integer of 1 to 15.

The other resins are also preferably a dispersant. Examples of the other resins as a dispersant include an acidic dispersant (acidic resin) and a basic dispersant (basic resin). Here, the acidic dispersant (acidic resin) represents a resin in which the amount of the acid group is larger than the amount of the basic group. The acidic dispersant (acidic resin) is preferably a resin in which the amount of the acid group occupies 70 mol % or more in a case where the total amount of the acid group and the basic group is 100 mol %, and more preferably a resin substantially consisting of only an acid group. The acid group included in the acidic dispersant (acidic resin) is preferably a carboxyl group. The acid value of the acidic dispersant (acidic resin) is preferably 10 to 105 mgKOH/g. In addition, the basic dispersant (basic resin) represents a resin in which the amount of the basic group is larger than the amount of the acid group. The basic dispersant (basic resin) is preferably a resin in which the amount of the basic group is more than 50 mol % in a case where the total amount of the acid group and the basic group is 100 mol %. The basic group included in the basic dispersant is preferably an amino group.

The other resins used as a dispersant preferably include a repeating unit having an acid group. In a case where the other resins used as a dispersant include a repeating unit having an acid group, the generation of the development residue can be further suppressed in the formation of a pattern by a photolithography method.

It is also preferable that the other resins used as a dispersant are a graft resin. With regard to details of the graft resin, reference can be made to the description in paragraph Nos. 0025 to 0094 of JP2012-255128A, the contents of which are incorporated herein by reference.

It is also preferable that the other resins used as a dispersant are a polyimine-based dispersant including a nitrogen atom in at least one of the main chain or the side chain. As the polyimine-based dispersant, a resin having a main chain which has a partial structure having a functional group of pKa 14 or less, and a side chain which has 40 to 10000 atoms, in which at least one of the main chain or the side chain has a basic nitrogen atom, is preferable. The basic nitrogen atom is not particularly limited as long as it is a nitrogen atom exhibiting basicity. With regard to the polyimine-based dispersant, reference can be made to the description in paragraph Nos. 0102 to 0166 of JP2012-255128A, the contents of which are incorporated herein by reference.

It is also preferable that the other resins used as a dispersant are a resin having a structure in which a plurality of polymer chains are bonded to a core portion. Examples of such a resin include dendrimers (including star polymers). In addition, specific examples of the dendrimer include polymer compounds C-1 to C-31 described in paragraph Nos. 0196 to 0209 of JP2013-043962A.

It is also preferable that the other resins used as a dispersant are a resin including a repeating unit having an ethylenically unsaturated bonding group in the side chain. The content of the repeating unit having an ethylenically unsaturated bonding group in the side chain is preferably 10 mol % or more, more preferably 10 to 80 mol %, and still more preferably 20 to 70 mol % with respect to all the repeating units of the resin.

A commercially available product is also available as the dispersant, and specific examples thereof include DISPERBYK series (for example, DISPERBYK-111, 2001, and the like) manufactured by BYK Chemie, Solsperse series (for example, Solsperse 20000, 76500, and the like) manufactured by Lubrizol Corporation, and AJISPER series manufactured by Ajinomoto Fine-Techno Co., Inc. In addition, products described in paragraph No. 0129 of JP2012-137564A and products described in paragraph No. 0235 of JP2017-194662A can also be used as the dispersant.

In a case where the curable composition according to the embodiment of the present invention includes the other resins, the content of the other resins is preferably 0.5 to 20 mass % with respect to the total solid content of the curable composition. The upper limit is preferably 15 mass % or less and more preferably 8 mass % or less. The lower limit is preferably 1 mass % or more and more preferably 2 mass % or more.

In addition, the content of the other resins in the resin included in the curable composition according to the embodiment of the present invention is preferably 1 to 50 mass %. The upper limit is preferably 40 mass % or less and more preferably 30 mass % or less. The lower limit is preferably 2 mass % or more and more preferably 5 mass % or more.

<<Polymerizable Compound>>

The curable composition according to the embodiment of the present invention contains a polymerizable compound. The polymerizable compound is preferably a compound having an ethylenically unsaturated bonding group. Examples of the ethylenically unsaturated bonding group include a vinyl group, a (meth)allyl group, and a (meth)acryloyl group. The polymerizable compound used in the present invention is preferably a radically polymerizable compound.

Any chemical forms of a monomer, a prepolymer, an oligomer, or the like may be used as the polymerizable compound, but a monomer is preferable. The molecular weight of the polymerizable compound is preferably 100 to 3000. The upper limit is more preferably 2000 or less, still more preferably 1500 or less, and even more preferably 1000 or less. The lower limit is more preferably 150 or more and still more preferably 250 or more.

The polymerizable compound is preferably a compound including 3 or more ethylenically unsaturated bonding groups, more preferably a compound including 3 to 15 ethylenically unsaturated bonding groups, and still more preferably a compound having 3 to 6 ethylenically unsaturated bonding groups. In addition, the polymerizable compound is preferably a trifunctional to pentadecafunctional (meth)acrylate compound and more preferably a trifunctional to hexafunctional (meth)acrylate compound. Specific examples of the polymerizable compound include the compounds described in paragraph Nos. 0095 to 0108 of JP2009-288705A, paragraph No. 0227 of JP2013-029760A, paragraph Nos. 0254 to 0257 of JP2008-292970A, paragraph Nos. 0034 to 0038 of JP2013-253224A, paragraph No. 0477 of JP2012-208494A, JP2017-048367A, JP6057891B, JP6031807B, and JP2017-194662A, the contents of which are incorporated herein by reference.

From the viewpoint of storage stability of the curable composition and color loss resistance of a film to be obtained, an ethylenically unsaturated bonding group value (hereinafter, referred to as a C═C value) of the polymerizable compound is preferably 2 to 14 mmol/g. The lower limit is preferably 3 mmol/g or more, more preferably 4 mmol/g or more, and still more preferably 5 mmol/g or more. The upper limit is preferably 12 mmol/g or less, more preferably 10 mmol/g or less, and still more preferably 8 mmol/g or less. The C═C value of the polymerizable compound is obtained by dividing the number of ethylenically unsaturated bonding groups included in one molecule of the polymerizable compound by the molecular weight of the polymerizable compound.

As the polymerizable compound, dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa (meth)acrylate (as a commercially available product, KAYARAD DPHA manufactured by Nippon Kayaku Co., Ltd., NK ESTER A-DPH-12E manufactured by Shin-Nakamura Chemical Co., Ltd.), or a compound having a structure in which the (meth)acryloyl group of these compounds is bonded through an ethylene glycol and/or a propylene glycol residue (for example, SR454 and SR499 which are commercially available from Sartomer) is preferable. In addition, as the polymerizable compound, diglycerin ethylene oxide (EO)-modified (meth)acrylate (as a commercially available product, M-460 manufactured by TOAGOSEI CO., LTD.), pentaerythritol tetraacrylate (NK ESTER A-TMMT manufactured by Shin-Nakamura Chemical Co., Ltd.), 1,6-hexanediol diacrylate (KAYARAD HDDA manufactured by Nippon Kayaku Co., Ltd.), RP-1040 (manufactured by Nippon Kayaku Co., Ltd.), ARONIX TO-2349 (manufactured by TOAGOSEI CO., LTD.), NK OLIGO UA-7200 (manufactured by Shin-Nakamura Chemical Co., Ltd.), 8UH-1006 and 8UH-1012 (manufactured by Taisei Fine Chemical Co., Ltd.), Light Acrylate POB-A0 (manufactured by KYOEISHA CHEMICAL Co., Ltd.), and the like can also be used.

In addition, as the polymerizable compound, it is also preferable to use a trifunctional (meth)acrylate compound such as trimethylolpropane tri(meth)acrylate, trimethylolpropane propyleneoxide-modified tri(meth)acrylate, trimethylolpropane ethyleneoxide-modified tri(meth)acrylate, isocyanuric acid ethyleneoxide-modified tri(meth)acrylate, and pentaerythritol tri(meth)acrylate. Examples of a commercially available product of the trifunctional (meth)acrylate compound include ARONIX M-309, M-310, M-321, M-350, M-360, M-313, M-315, M-306, M-305, M-303, M-452, and M-450 (manufactured by TOAGOSEI CO., LTD.), NK ESTER A9300, A-GLY-9E, A-GLY-20E, A-TMM-3, A-TMM-3L, A-TMM-3LM-N, A-TMPT, and TMPT (manufactured by Shin-Nakamura Chemical Co., Ltd.), and KAYARAD GPO-303, TMPTA, THE-330, TPA-330, and PET-30 (manufactured by Nippon Kayaku Co., Ltd.).

As the polymerizable compound, a compound having an isocyanurate skeleton can also be used. By using a polymerizable compound having an isocyanurate skeleton, solvent resistance of a film to be obtained can be improved. Specific examples of the polymerizable compound having an isocyanurate skeleton include tris(2-acryloyloxyethyl) isocyanurate and &-caprolactone-modified tris(2-acryloxyethyl) isocyanurate. Examples of a commercially available product thereof include FANCRYL FA-731 A (manufactured by Hitachi Chemical Co., Ltd.), NK ESTER A-9300, A-9300-lCL, and A9300-3CL (manufactured by Shin-Nakamura Chemical Co., Ltd.), and ARONIX M-315 (manufactured by TOAGOSEI CO., LTD.).

As the polymerizable compound, a compound having an acid group can also be used. By using a polymerizable compound having an acid group, the polymerizable compound in an unexposed area is easily removed during development and the generation of the development residue can be suppressed. Examples of the acid group include a carboxyl group, a sulfo group, and a phosphoric acid group, and a carboxyl group is preferable. Examples of a commercially available product of the polymerizable compound having an acid group include ARONIX M-305, M-510, M-520, and ARONIX TO-2349 (manufactured by TOAGOSEI CO., LTD.). The acid value of the polymerizable compound having an acid group is preferably 0.1 to 40 mgKOH/g and more preferably 5 to 30 mgKOH/g. In a case where the acid value of the polymerizable compound is 0.1 mgKOH/g or more, solubility in a developer is good, and in a case where the acid value of the polymerizable compound is 40 mgKOH/g or less, it is advantageous in production and handling.

As the polymerizable compound, a compound having a caprolactone structure can also be used. Examples of the polymerizable compound having a caprolactone structure include DPCA-20, DPCA-30, DPCA-60, and DPCA-120, each of which is commercially available as KAYARAD DPCA series from Nippon Kayaku Co., Ltd.

As the polymerizable compound, a polymerizable compound having an alkyleneoxy group can also be used. The polymerizable compound having an alkyleneoxy group is preferably a polymerizable compound having an ethyleneoxy group and/or a propyleneoxy group, more preferably a polymerizable compound having an ethyleneoxy group, and still more preferably a trifunctional to hexafunctional (meth) acrylate compound having 4 to 20 ethyleneoxy groups. Examples of a commercially available product of the polymerizable compound having an alkyleneoxy group include SR-494 manufactured by Sartomer, which is a tetrafunctional (meth)acrylate having four ethyleneoxy groups, and KAYARAD TPA-330 manufactured by Nippon Kayaku Co., Ltd., which is a trifunctional (meth)acrylate having three isobutyleneoxy groups.

As the polymerizable compound, a polymerizable compound having a fluorene skeleton can also be used. Examples of a commercially available product of the polymerizable compound having a fluorene skeleton include OGSOL EA-0200, EA-0300 (manufactured by Osaka Gas Chemicals Co., Ltd., (meth)acrylate monomer having a fluorene skeleton).

As the polymerizable compound, it is also preferable to use a compound which does not substantially include environmentally regulated substances such as toluene. Examples of a commercially available product of such a compound include KAYARAD DPHA LT and KAYARAD DPEA-12 LT (manufactured by Nippon Kayaku Co., Ltd.).

The urethane acrylates described in JP1973-041708B (JP-S48-041708B), JP1976-037193A (JP-S51-037193A), JP1990-032293B (JP-H02-032293B), or JP1990-016765B (JP-H02-016765B), or the urethane compounds having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) are also suitable as the polymerizable compound. In addition, the polymerizable compounds having an amino structure or a sulfide structure in the molecule, described in JP1988-277653A (JP-S63-277653A), JP1988-260909A (JP-S63-260909A), or JP1989-105238A (JP-H01-105238A), are also preferably used. In addition, as the polymerizable compound, commercially available products such as UA-7200 (manufactured by Shin-Nakamura Chemical Co., Ltd.), DPHA-40H (manufactured by Nippon Kayaku Co., Ltd.), and UA-306H, UA-306T, UA-3061, AH-600, T-600, AI-600, and LINC-202UA (manufactured by KYOEISHA CHEMICAL Co., Ltd.) can also be used.

The content of the polymerizable compound in the total solid content of the curable composition is preferably 0.1 to 30 mass %. The lower limit is preferably 0.5 mass % or more, more preferably 1 mass % or more, still more preferably 3 mass % or more, and even more preferably 5 mass % or more. The upper limit is preferably 25 mass % or less, more preferably 20 mass % or less, and still more preferably 15 mass % or less. The polymerizable compound may be used singly or in combination of two or more kinds thereof. In a case where two or more kinds thereof are used in combination, the total thereof is preferably within the above-described range.

In addition, the total content of the resin and the polymerizable compound in the total solid content of the curable composition is preferably 10 to 50 mass %. The lower limit is preferably 15 mass % or more, more preferably 20 mass % or more, and still more preferably 25 mass % or more. The upper limit is preferably 45 mass % or less, more preferably 40 mass % or less, and still more preferably 35 mass % or less.

In addition, the content of the polymerizable compound is preferably 10 to 2000 parts by mass with respect to 100 parts by mass of the photopolymerization initiator. The upper limit is preferably 1800 parts by mass or less and more preferably 1500 parts by mass or less. The lower limit is preferably 30 parts by mass or more and more preferably 50 parts by mass or more.

<<Photopolymerization Initiator>>

The curable composition according to the embodiment of the present invention contains a photopolymerization initiator. The photopolymerization initiator is not particularly limited, and can be appropriately selected from known photopolymerization initiators. For example, a compound having photosensitivity to light in a range from an ultraviolet range to a visible range is preferable. The photopolymerization initiator is preferably a photoradical polymerization initiator.

Examples of the photopolymerization initiator include a halogenated hydrocarbon derivative (for example, a compound having a triazine skeleton or a compound having an oxadiazole skeleton), an acylphosphine compound, a hexaarylbiimidazole, an oxime compound, an organic peroxide, a thio compound, a ketone compound, an aromatic onium salt, an α-hydroxyketone compound, and an α-aminoketone compound. From the viewpoint of exposure sensitivity, as the photopolymerization initiator, a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable, a compound selected from an oxime compound, an α-hydroxyketone compound, an α-aminoketone compound, or an acylphosphine compound is more preferable, and an oxime compound is still more preferable. Examples of the photopolymerization initiator include compounds described in paragraphs 0065 to 0111 of JP2014-130173A, and JP6301489B, the contents of which are incorporated herein by reference.

Examples of a commercially available product of the α-hydroxyketone compound include IRGACURE-184, DAROCUR-1173, IRGACURE-500, IRGACURE-2959, and IRGACURE-127 (all of which are manufactured by BASF). Examples of a commercially available product of the α-aminoketone compound include IRGACURE-907, IRGACURE-369, IRGACURE-379, and IRGACURE-379EG (all of which are manufactured by BASF). Examples of a commercially available product of the acylphosphine compound include IRGACURE-819, and DAROCUR-TPO (both of which are manufactured by BASF).

Examples of the oxime compound include the compounds described in JP2001-233842A, the compounds described in JP2000-080068A, the compounds described in JP2006-342166A, the compounds described in J. C. S. Perkin II (1979, pp. 1653-1660), the compounds described in J. C. S. Perkin II (1979, pp. 156-162), the compounds described in Journal of Photopolymer Science and Technology (1995, pp. 202-232), the compounds described in JP2000-066385A, the compounds described in JP2000-080068A, the compounds described in JP2004-534797A, the compounds described in JP2006-342166A, the compounds described in JP2017-019766A, the compounds described in JP6065596B, the compounds described in WO2015/152153A, the compounds described in WO2017/051680A, the compounds described in JP2017-198865A, and the compounds described in paragraph Nos. 0025 to 0038 of WO2017/164127A. Specific examples of the oxime compound include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one. Examples of a commercially available product thereof include IRGACURE-OXE01, IRGACURE-OXE02, IRGACURE-OXE03, and IRGACURE-OXE04 (all of which are manufactured by BASF), TR-PBG-304 (manufactured by TRONLY), and ADEKA OPTOMER N-1919 (manufactured by ADEKA Corporation; photopolymerization initiator 2 described in JP2012-014052A). In addition, as the oxime compound, it is also preferable to use a compound having no coloring property or a compound having high transparency and being resistant to discoloration. Examples of a commercially available product thereof include ADEKAARKLS NCI-730, NCI-831, and NCI-930 (all of which are manufactured by ADEKA Corporation).

In the present invention, an oxime compound having a fluorene ring can also be used as the photopolymerization initiator. Specific examples of the oxime compound having a fluorene ring include compounds described in JP2014-137466A.

In addition, as the photopolymerization initiator, an oxime compound having a skeleton in which at least one benzene ring of a carbazole ring is a naphthalene ring can also be used. Specific examples of such an oxime compound include the compounds described in WO2013/083505A.

In the present invention, an oxime compound having a fluorine atom can also be used as the photopolymerization initiator. Specific examples of the oxime compound having a fluorine atom include compounds described in JP2010-262028A, Compounds 24 and 36 to 40 described in JP2014-500852A, and Compound (C-3) described in JP2013-164471A.

In the present invention, an oxime compound having a nitro group can be used as the photopolymerization initiator. It is preferable that the oxime compound having a nitro group is a dimer. Specific examples of the oxime compound having a nitro group include a compound described in paragraph Nos. 0031 to 0047 of JP2013-114249A and paragraph Nos. 0008 to 0012 and 0070 to 0079 of JP2014-137466A, a compound described in paragraph Nos. 0007 to 0025 of JP4223071B, and ADEKA ARKLS NCI-831 (manufactured by ADEKA Corporation).

In the present invention, an oxime compound having a benzofuran skeleton can also be used as the photopolymerization initiator. Specific examples thereof include OE-01 to OE-75 described in WO2015/036910A.

Specific examples of the oxime compound which are preferably used in the present invention are shown below, but the present invention is not limited thereto.

(C-1)

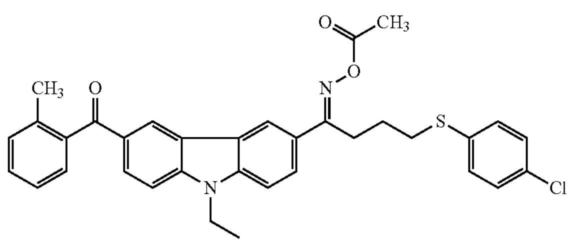

(C-2)

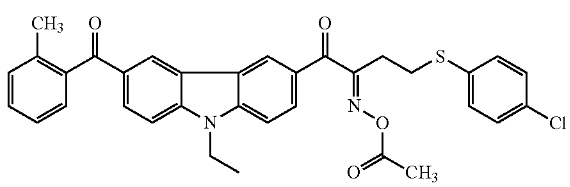

(C-3)

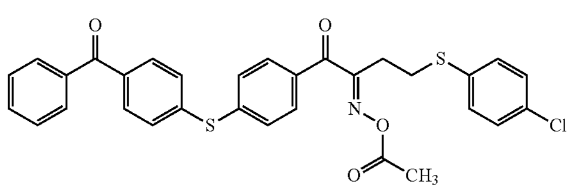

(C-4)

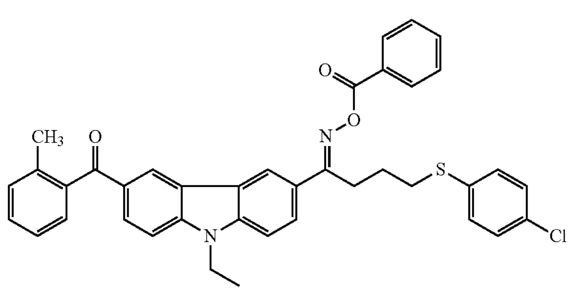

-continued (C-5)

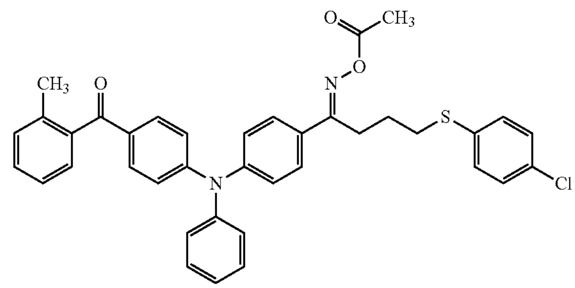

(C-6)

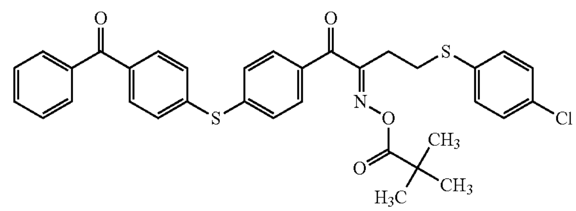

(C-7)

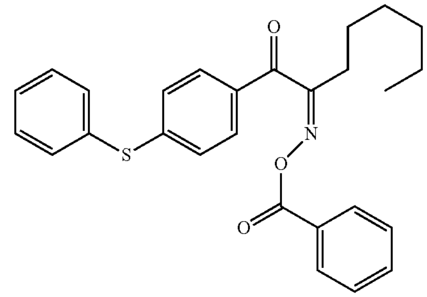

(C-8)

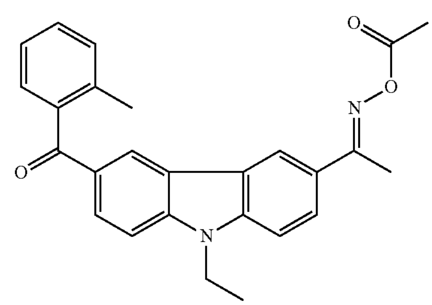

(C-9)

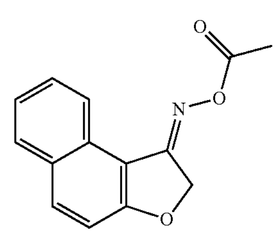

-continued (C-10)

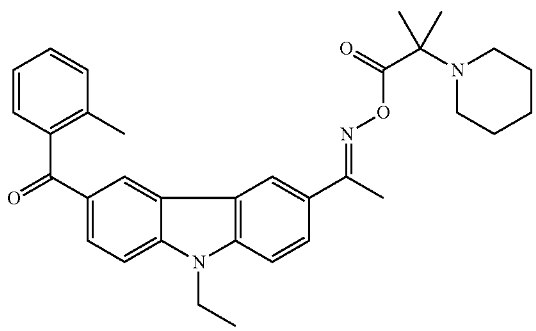

(C-11)

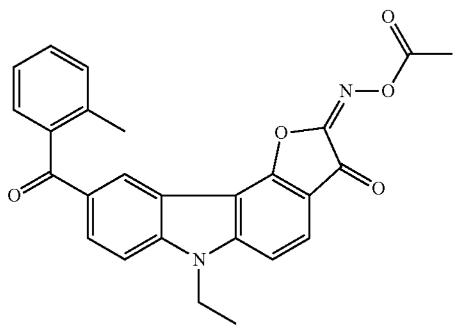

(C-12)

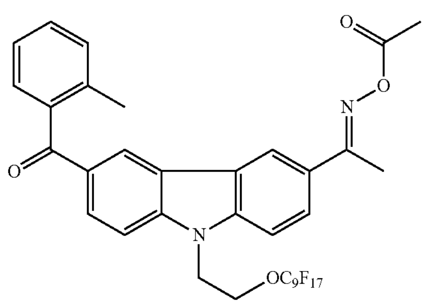

(C-13)

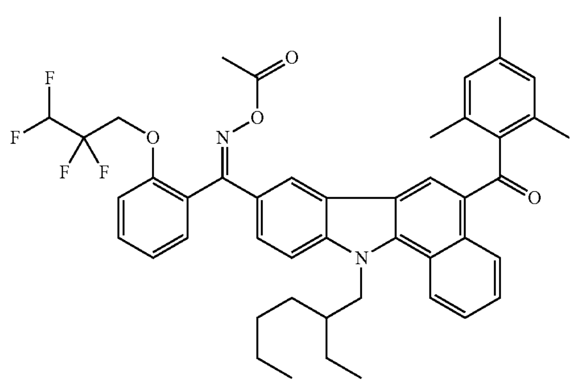

(C-14)

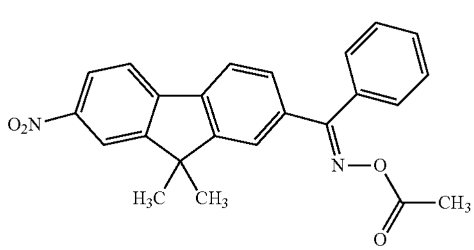

-continued (C-15)

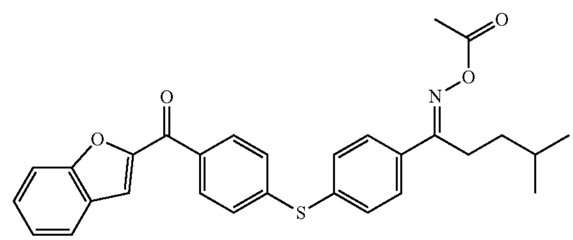

(C-16)

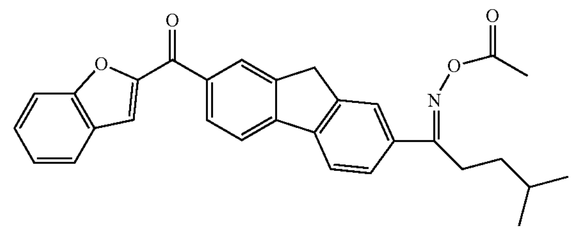

The oxime compound is preferably a compound having a maximum absorption wavelength in a wavelength range of 350 to 500 nm and more preferably a compound having a maximum absorption wavelength in a wavelength range of 360 to 480 nm. In addition, from the viewpoint of sensitivity, the molar light absorption coefficient of the oxime compound at a wavelength of 365 nm or 405 nm is preferably high, more preferably 1000 to 300000, still more preferably 2000 to 300000, and particularly preferably 5000 to 200000. The molar light absorption coefficient of a compound can be measured using a well-known method. For example, it is preferable that the molar light absorption coefficient can be measured using a spectrophotometer (Cary-5 spectrophotometer, manufactured by Varian Medical Systems, Inc.) and ethyl acetate at a concentration of 0.01 g/L.

As the photopolymerization initiator, a bifunctional or tri- or more functional photoradical polymerization initiator may be used. By using such a photoradical polymerization initiator, two or more radicals are generated from one molecule of the photoradical polymerization initiator, and as a result, good sensitivity is obtained. In addition, in a case of using a compound having an asymmetric structure, crystallinity is reduced so that solubility in a solvent or the like is improved, precipitation is to be difficult over time, and temporal stability of the curable composition can be improved. Specific examples of the bifunctional or tri- or more functional photoradical polymerization initiator include dimers of the oxime compounds described in JP2010-527339A, JP2011-524436A, WO2015/004565A, paragraph Nos. 0407 to 0412 of JP2016-532675A, and paragraph Nos. 0039 to 0055 of WO2017/033680A; the compound (E) and compound (G) described in JP2013-522445A; Cmpd 1 to 7 described in WO2016/034963A; the oxime ester photoinitiators described in paragraph No. 0007 of JP2017-523465A; the photoinitiators described in paragraph Nos. 0020 to 0033 of JP2017-167399A; and the photopolymerization initiator (A) described in paragraph Nos. 0017 to 0026 of JP2017-151342A.

The content of the photopolymerization initiator in the total solid content of the curable composition according to the embodiment of the present invention is preferably 0.1 to 30 mass %. The lower limit is preferably 0.5 mass % or more and more preferably 1 mass % or more. The upper limit is preferably 20 mass % or less and more preferably 15 mass % or less. In the curable composition according to the embodiment of the present invention, the photopolymerization initiator may be used singly or in combination of two or more kinds thereof. In a case where two or more kinds thereof are used, the total content thereof is preferably within the above-described range.

<<Solvent>>

The curable composition according to the embodiment of the present invention contains a solvent. Basically, the solvent is not particularly limited as long as it satisfies the solubility of the respective components and the application properties of the curable composition. As the solvent, an organic solvent is preferable. Examples of the organic solvent include an ester solvent, a ketone solvent, an alcohol solvent, an amide solvent, an ether solvent, and a hydrocarbon solvent. The details of the organic solvent can be found in paragraph No. 0223 of WO2015/166779A, the content of which is incorporated herein by reference. In addition, an ester solvent in which a cyclic alkyl group is substituted or a ketone solvent in which a cyclic alkyl group is substituted can also be preferably used. Specific examples of the organic solvent include polyethylene glycol monomethyl ether, dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclohexyl acetate, cyclopentanone, ethyl carbitol acetate, butyl carbitol acetate, propylene glycol monomethyl ether, propylene glycol monomethyl ether acetate, 3-methoxy-N,N-dimethylpropanamide, and 3-butoxy-N,N-dimethylpropanamide. In this case, it may be preferable that the content of aromatic hydrocarbons (such as benzene, toluene, xylene, and ethylbenzene) as the organic solvent is low (for example, 50 parts per million (ppm) by mass or less, 10 ppm by mass or less, or 1 ppm by mass or less with respect to the total amount of the organic solvent) in consideration of environmental aspects and the like.

In the present invention, an organic solvent having a low metal content is preferably used. For example, the metal content in the organic solvent is preferably 10 mass parts per billion (ppb) or less. Optionally, an organic solvent having a metal content at a mass parts per trillion (ppt) level may be used. For example, such an organic solvent is available from Toyo Gosei Co., Ltd. (The Chemical Daily, Nov. 13, 2015).

Examples of a method for removing impurities such as a metal from the organic solvent include distillation (such as molecular distillation and thin-film distillation) and filtration using a filter. The filter pore size of the filter used for the filtration is preferably 10 μm or less, more preferably 5 μm or less, and still more preferably 3 μm or less. As a material of the filter, polytetrafluoroethylene, polyethylene, or nylon is preferable.

The organic solvent may include an isomer (a compound having the same number of atoms and a different structure). In addition, only one kind of isomers may be included, or a plurality of isomers may be included.

The organic solvent preferably has the content of peroxides of 0.8 mmol/L or less, and more preferably, the organic solvent does not substantially include peroxides.

The content of the organic solvent in the curable composition is preferably 10 to 95 mass %, more preferably 20 to 90 mass %, and still more preferably 30 to 90 mass %.

In addition, from the viewpoint of environmental regulation, it is preferable that the curable composition according to the embodiment of the present invention does not substantially contain environmentally regulated substances. In the present invention, the description "does not substantially contain environmentally regulated substances" means that the content of the environmentally regulated substances in the curable composition is 50 ppm by mass or less, preferably 30 ppm by mass or less, still more preferably 10 ppm by mass or less, and particularly preferably 1 ppm by mass or less. Examples of the environmentally regulated substances include benzenes; alkylbenzenes such as toluene and xylene; and halogenated benzenes such as chlorobenzene. These compounds are registered as environmentally regulated substances in accordance with Registration Evaluation Authorization and Restriction of Chemicals (REACH) rules, Pollutant Release and Transfer Register (PRTR) law, Volatile Organic Compounds (VOC) regulation, and the like, and strictly regulated in their amount used and handling method. These compounds can be used as a solvent in a case of producing respective components used in the curable composition according to the embodiment of the present invention, and may be incorporated into the curable composition as a residual solvent. From the viewpoint of human safety and environmental considerations, it is preferable to reduce these substances as much as possible. Examples of a method for reducing the environmentally regulated substances include a method for reducing the environmentally regulated substances by distilling the environmentally regulated substances from a system by heating or depressurizing the system such that the temperature of the system is higher than a boiling point of the environmentally regulated substances. In addition, in a case of distilling a small amount of the environmentally regulated substances, it is also useful to azeotrope with a solvent having the boiling point equivalent to that of the above-described solvent in order to increase efficiency. In addition, in a case of containing a compound having radical polymerizability, in order to suppress the radical polymerization reaction proceeding during the distillation under reduced pressure to cause cross-linking between the molecules, a polymerization inhibitor or the like may be added and the distillation under reduced pressure is performed. These distillation methods can be performed at any stage of raw material, product (for example, resin solution after polymerization or polyfunctional monomer solution) obtained by reacting the raw material, curable composition produced by mixing these compounds, or the like.

<<Compound Having Epoxy Group>>

The curable composition according to the embodiment of the present invention can further contain a compound having an epoxy group (hereinafter, also referred to as an epoxy compound). Examples of the epoxy compound include a compound having one or more epoxy groups in one molecule, and a compound two or more epoxy groups in one molecule is preferable. The epoxy compound preferably has 1 to 100 epoxy groups in one molecule. The upper limit of the number of epoxy groups may be, for example, 10 or less or 5 or less. The lower limit of the number of epoxy groups is preferably 2 or more. As the epoxy compound, the compounds described in paragraph Nos. 0034 to 0036 of JP2013-011869A, paragraph Nos. 0147 to 0156 of JP2014-043556A, and paragraph Nos. 0085 to 0092 of JP2014-089408A, and the compounds described in JP2017-179172A can also be used. The contents of which are incorporated herein by reference.

The epoxy compound may be a low-molecular-weight compound (for example, having a molecular weight of less than 2000, and further, a molecular weight of less than 1000) or a high-molecular-weight compound (macromolecule) (for example, having a molecular weight of 1000 or more, and in a case of a polymer, having a weight-average molecular weight of 1000 or more). The weight-average molecular weight of the epoxy compound is preferably 200 to 100000 and more preferably 500 to 50000. The upper limit of the weight-average molecular weight is preferably 10000 or less, more preferably 5000 or less, and still more preferably 3000 or less.

Examples of a commercially available product of the epoxy compound include EHPE3150 (manufactured by Daicel Corporation) and EPICLON N-695 (manufactured by DIC Corporation).

In a case where the curable composition according to the embodiment of the present invention contains an epoxy compound, the content of the epoxy compound in the total solid content of the curable composition is preferably 0.1 to 20 mass %. The lower limit is, for example, preferably 0.5 mass % or more, and more preferably 1 mass % or more. The upper limit is, for example, preferably 15 mass % or less and still more preferably 10 mass % or less. The epoxy compound contained in the curable composition may be only one kind or two or more kinds thereof. In a case of using two or more kinds thereof, the total content thereof is preferably within the above-described range.

<<Silane Coupling Agent>>

The curable composition according to the embodiment of the present invention can contain a silane coupling agent. According to this aspect, adhesiveness of a film to be obtained with a support can be further improved. In the present invention, the silane coupling agent means a silane compound having a hydrolyzable group and other functional groups. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group, and an alkoxy group is preferable. That is, it is preferable that the silane coupling agent is a compound having an alkoxysilyl group. Examples of the functional group other than the hydrolyzable group include a vinyl group, a (meth)allyl group, a (meth)acryloyl group, a mercapto group, an epoxy group, an oxetanyl group, an amino group, a ureide group, a sulfide group, an isocyanate group, and a phenyl group, and an amino group, a (meth)acryloyl group, or an epoxy group is preferable. Specific examples of the silane coupling agent include the compounds described in paragraph Nos. 0018 to 0036 of JP2009-288703A and the compounds described in paragraph Nos. 0056 to 0066 of JP2009-242604A, the contents of which are incorporated herein by reference.

The content of the silane coupling agent in the total solid content of the curable composition is preferably 0.1 to 5 mass %. The upper limit is preferably 3 mass % or less and more preferably 2 mass % or less. The lower limit is preferably 0.5 mass % or more and more preferably 1 mass % or more. The silane coupling agent may be used singly or in combination of two or more kinds thereof. In a case of using two or more kinds thereof, the total content thereof is preferably within the above-described range.

<<Curing Accelerator>>

For the purpose of promoting the reaction of polymerizable compounds or lowering a curing temperature, a curing accelerator may be added to the curable composition according to the embodiment of the present invention. As the curing accelerator, compounds such as a thiol compound, a methylol compound, an amine compound, a phosphonium salt compound, an amidine salt compound, an amide compound, a base generator, an isocyanate compound, an alkoxysilane compound, and an onium salt compound can also be used. Specific examples of the curing accelerator include compounds described in paragraph Nos. 0246 to 0253 of JP2015-034963A, compounds described in paragraph Nos. 0186 to 0251 of JP2013-041165A, ionic compounds described in JP2014-055114A, compounds described in paragraph Nos. 0071 to 0080 of JP2012-150180A, alkoxysilane compounds having an epoxy group described in JP2011-253054A, compounds described in paragraph Nos. 0085 to 0092 of JP5765059B, and carboxyl group-containing epoxy curing agent described in JP2017-036379A.

In a case where the curable composition according to the embodiment of the present invention contains a curing accelerator, the content of the curing accelerator is preferably 0.3 to 8.9 mass % and more preferably 0.8 to 6.4 mass % with respect to the total solid content of the curable composition.

<<Polymerization Inhibitor>>

The curable composition according to the embodiment of the present invention can contain a polymerization inhibitor. Examples of the polymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-t-butylphenol), and an N-nitrosophenylhydroxylamine salt (an ammonium salt, a cerous salt, or the like). Among these, p-methoxyphenol is preferable. The content of the polymerization inhibitor in the total solid content of the curable composition is preferably 0.0001 to 5 mass %.

<<Surfactant>>

The curable composition according to the embodiment of the present invention can contain a surfactant. As the surfactant, various surfactants such as a fluorine-based surfactant, a nonionic surfactant, a cationic surfactant, an anionic surfactant, or a silicon-based surfactant can be used. Examples of the surfactant include surfactants described in paragraph Nos. 0238 to 0245 of WO2015/166779A, the contents of which are incorporated herein by reference.

In the present invention, it is preferable that the surfactant is a fluorine-based surfactant. By containing a fluorine-based surfactant in the curable composition, liquid characteristics (particularly, fluidity) are further improved, and liquid saving properties can be further improved. In addition, it is possible to form a film with a small thickness unevenness.

The fluorine content in the fluorine-based surfactant is preferably 3 to 40 mass %, more preferably 5 to 30 mass %, and particularly preferably 7 to 25 mass %. The fluorine-based surfactant in which the fluorine content is within the above-described range is effective in terms of the evenness of the thickness of the coating film or liquid saving properties and the solubility of the surfactant in the curable composition is also good.

Examples of the fluorine-based surfactant include surfactants described in paragraph Nos. 0060 to 0064 of JP2014-041318A (paragraph Nos 0060 to 0064 of the corresponding WO2014/017669A) and the like, and surfactants described in paragraph Nos 0117 to 0132 of JP2011-132503A, the contents of which are incorporated herein by reference. Examples of a commercially available product of the fluorine-based surfactant include: MEGAFACE F171, F172, F173, F176, F177, F141, F142, F143, F144, R30, F437, F475, F479, F482, F554, F780, EXP, MFS-330 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and POLYFOX PF636, PF656, PF6320, PF6520, and PF7002 (all of which are manufactured by OMNOVA Solutions Inc.).

In addition, as the fluorine-based surfactant, an acrylic compound which has a molecular structure having a functional group containing a fluorine atom and in which, by applying heat to the molecular structure, the functional group containing a fluorine atom is broken to volatilize a fluorine atom can also be suitably used. Examples of such a fluorine-based surfactant include MEGAFACE DS series (manufactured by DIC Corporation, The Chemical Daily (Feb. 22, 2016), Nikkei Business Daily (Feb. 23, 2016)), for example, MEGAFACE DS-21.

In addition, as the fluorine-based surfactant, a polymer of a fluorine atom-containing vinyl ether compound having a fluorinated alkyl group or a fluorinated alkylene ether group, and a hydrophilic vinyl ether compound can be preferably used. Examples of such a fluorine surfactant include fluorine-based surfactants described in JP2016-216602A, the contents of which are incorporated herein by reference.

As the fluorine-based surfactant, a block polymer can also be used. As the fluorine-based surfactant, a fluorine-containing polymer compound including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups) can also be preferably used. In addition, fluorine-containing surfactants described in paragraph Nos. 0016 to 0037 of JP2010-032698A, or the following compounds are also exemplified as the fluorine-based surfactant used in the present invention.

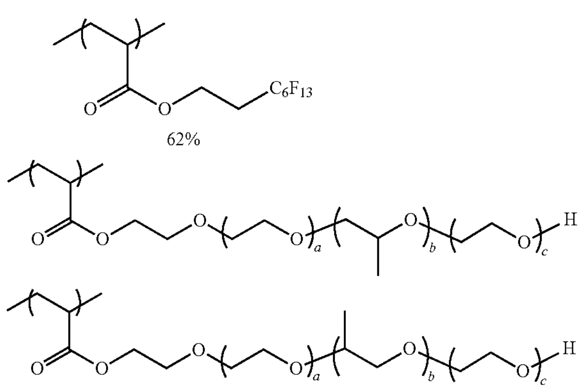

The weight-average molecular weight of the compound is preferably 3000 to 50000 and, for example, 14000. In the compound, "%" representing the proportion of a repeating unit is mol %.

In addition, as the fluorine-based surfactant, a fluorine-containing polymer having an ethylenically unsaturated bonding group in the side chain can be used. Specific examples thereof include compounds described in paragraph Nos. 0050 to 0090 and paragraph Nos. 0289 to 0295 of JP2010-164965A, and MEGAFACE RS-101, RS-102, RS-718K, and RS-72-K manufactured by DIC Corporation. In addition, as the fluorine-based surfactant, compounds described in paragraph Nos. 0015 to 0158 of JP2015-117327A can also be used.

Examples of the nonionic surfactant include glycerol, trimethylolpropane, trimethylolethane, an ethoxylate and propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters, PLURONIC L10, L31, L61, L62, 10R5, 17R2, and 25R2 (manufactured by BASF), TETRONIC 304, 701, 704, 901, 904, and 150R1 (manufactured by BASF), SOLSPERSE 20000 (manufactured by Lubrizol Corporation), NCW-101, NCW-1001, and NCW-1002 (all of which are manufactured by FUJIFILM Wako Pure Chemical Corporation), PIONIN D-6112, D-6112-W, and D-6315 (all of which are manufactured by Takemoto Oil&Fat Co., Ltd.), and OLFINE E1010 and SURFYNOL 104, 400, and 440 (all of which are manufactured by Nissin Chemical Co., Ltd.).

Examples of the silicon-based surfactant include TORAY SILICONE DC3PA, TORAY SILICONE SH7PA, TORAY SILICONE DCIIPA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Toray Co., Ltd.), TSF-4440, TSF-4300, TSF-4445, TSF-4460, and TSF-4452 (all of which are manufactured by Momentive Performance Materials Co., Ltd.), KP-341, KF-6001, and KF-6002 (all of which are manufactured by Shin-Etsu Chemical Co., Ltd.), and BYK307, BYK323, and BYK330 (all of which are manufactured by BYK Chemie).

The content of the surfactant in the total solid content of the curable composition is preferably 0.001 mass % to 5.0 mass % and more preferably 0.005 to 3.0 mass %. The surfactant may be used singly or in combination of two or more kinds thereof. In a case of using two or more kinds thereof, the total content thereof is preferably within the above-described range.

<<Ultraviolet Absorber>>

The curable composition according to the embodiment of the present invention can contain an ultraviolet absorber. As the ultraviolet absorber, a conjugated diene compound, an aminodiene compound, a salicylate compound, a benzophenone compound, a benzotriazole compound, an acrylonitrile compound, a hydroxyphenyltriazine compound, an indole compound, a triazine compound, and the like can be used. Examples of such a compound include compounds described in paragraph Nos. 0038 to 0052 of JP2009-217221A, paragraph Nos. 0052 to 0072 of JP2012-208374A, paragraph Nos. 0317 to 0334 of JP2013-068814A, and paragraph Nos. 0061 to 0080 of JP2016-162946A, the contents of which are incorporated herein by reference. Examples of a commercially available product of the ultraviolet absorber include UV-503 (manufactured by Daito Chemical Co., Ltd.). In addition, examples of the benzotriazole compound include MYUA series manufactured by Miyoshi Oil & Fat Co., Ltd. (The Chemical Daily, Feb. 1, 2016). In addition, as the ultraviolet absorber, compounds described in paragraph Nos. 0049 to 0059 of JP6268967B can also be used. The content of the ultraviolet absorber in the total solid content of the curable composition is preferably 0.01 to 10 mass % and more preferably 0.01 to 5 mass %. In the present invention, the ultraviolet absorber may be used singly or in combination of two or more kinds thereof. In a case where two or more kinds thereof are used, the total content thereof is preferably within the above-described range.

<<Antioxidant>>

The curable composition according to the embodiment of the present invention can contain an antioxidant. Examples of the antioxidant include a phenol compound, a phosphite ester compound, and a thioether compound. As the phenol compound, any phenol compound which is known as a phenol-based antioxidant can be used. Preferred examples of the phenol compound include a hindered phenol compound. A compound having a substituent at a site (ortho position) adjacent to a phenolic hydroxyl group is preferable. As the substituent, a substituted or unsubstituted alkyl group having 1 to 22 carbon atoms is preferable. In addition, as the antioxidant, a compound having a phenol group and a phosphite ester group in the same molecule is also preferable. In addition, as the antioxidant, a phosphorus antioxidant can also be suitability used. In addition, as the antioxidant, compounds described in paragraph Nos. 0023 to 0048 of JP6268967B, compounds described in WO2017/006600A, or compounds described in WO2017/164024A can also be used.

The content of the antioxidant in the total solid content of the curable composition is preferably 0.01 to 20 mass % and more preferably 0.3 to 15 mass %. The antioxidant may be used singly or in combination of two or more kinds thereof. In a case where two or more kinds thereof are used, the total content thereof is preferably within the above-described range.

<<Other Components>>

Optionally, the curable composition according to the embodiment of the present invention may further contain a sensitizer, a curing accelerator, a filler, a thermal curing accelerator, a plasticizer, and other auxiliary agents (for example, conductive particles, an anti-foaming agent, a flame retardant, a leveling agent, a peeling accelerator, an aromatic chemical, a surface tension adjuster, or a chain transfer agent). By appropriately containing these components, properties such as film properties can be adjusted. The details of the components can be found in, for example, paragraph Nos. 0183 and later of JP2012-003225A (corresponding to paragraph No. 0237 of US2013/0034812A) and paragraph Nos. 0101 to 0104 and 0107 to 0109 of JP2008-250074A, the content of which is incorporated herein by reference. In addition, optionally, the curable composition according to the embodiment of the present invention may contain a potential antioxidant. Examples of the potential antioxidant include a compound in which a portion that functions as the antioxidant is protected by a protective group and the protective group is desorbed by heating the compound at 100° C. to 250° C. or by heating the compound at 80° C. to 200° C. in the presence of an acid/a base catalyst. Examples of the potential antioxidant include compounds described in WO2014/021023A, WO2017/030005A, and JP2017-008219A. Examples of a commercially available product of the potential antioxidant include ADEKA ARKLS GPA-5001 (manufactured by ADEKA Corporation).

In order to adjust the refractive index of a film to be obtained, the curable composition according to the embodiment of the present invention may contain a metal oxide. Examples of the metal oxide include $TiO_2$, $ZrO_2$, $Al_2O_3$, and $SiO_2$. The primary particle diameter of the metal oxide is preferably 1 to 100 nm, more preferably 3 to 70 nm, and still more preferably 5 to 50 nm. The metal oxide may have a core-shell structure. In addition, in this case, the core portion may be hollow.

The curable composition according to the embodiment of the present invention may include a light-resistance improver. Examples of the light-resistance improver include the compounds described in paragraph Nos. 0036 and 0037 of JP2017-198787A, the compounds described in paragraph Nos. 0029 to 0034 of JP2017-146350A, the compounds described in paragraph Nos. 0036 and 0037, and 0049 to “0052 of JP2017-129774A, the compounds described in paragraph Nos. 0031 to 0034, 0058, and 0059 of JP2017-129674A, the compounds described in paragraph Nos. 0036 and 0037, and 0051 to 0054 of JP2017-122803A, the compounds described in paragraph Nos. 0025 to 0039 of WO2017/164127A, the compounds described in paragraph Nos. 0034 to 0047 of JP2017-186546A, the compounds described in paragraph Nos. 0019 to 0041 of JP2015-025116A, the compounds described in paragraph Nos. 0101 to 0125 of JP2012-145604A, the compounds described in paragraph Nos. 0018 to 0021 of JP2012-103475A, the compounds described in paragraph Nos. 0015 to 0018 of JP2011-257591A, the compounds described in paragraph Nos. 0017 to 0021 of JP2011-191483A, the compounds described in paragraph Nos. 0108 to 0116 of JP2011-145668A, and the compounds described in paragraph Nos. 0103 to 0153 of JP2011-253174A.

In the curable composition according to the embodiment of the present invention, the content of free metal which is not bonded to or coordinated with a pigment or the like is preferably 100 ppm or less, more preferably 50 ppm or less, and still more preferably 10 ppm or less, it is particularly preferable to not contain the free metal substantially. According to this aspect, effects such as stabilization of pigment dispersibility (restraint of aggregation), improvement of spectral characteristics due to improvement of dispersibility, restraint of conductivity fluctuation due to stabilization of curable components or elution of metal atoms and metal ions, and improvement of display characteristics can be expected. In addition, the effects described in JP2012-153796A, JP2000-345085A, JP2005-200560A, JP1996-043620A (JP-H08-043620A), JP2004-145078A, JP2014-119487A, JP2010-083997A, JP2017-090930A, JP2018-025612A, JP2018-025797A, JP2017-155228A, JP2018-036521A, and the like can also be obtained. Examples of the types of the above-described free metals include Na, K, Ca, Sc, Ti, Mn, Cu, Zn, Fe, Cr, Co, Mg, Al, Sn, Zr, Ga, Ge, Ag, Au, Pt, Cs, Ni, Cd, Pb, and Bi. In addition, in the curable composition according to the embodiment of the present invention, the content of free halogen which is not bonded to or coordinated with a pigment or the like is preferably 100 ppm or less, more preferably 50 ppm or less, and still more preferably 10 ppm or less, it is particularly preferable to not contain the free halogen substantially. Examples of halogen include F, Cl, Br, I, and anions thereof. Examples of a method for reducing free metals and halogens in the curable composition include washing with ion exchange water, filtration, ultrafiltration, and purification with an ion exchange resin.

It is also preferable that the curable composition according to the embodiment of the present invention does not substantially include terephthalic acid ester.

The moisture content in the curable composition according to the embodiment of the present invention is usually 3 mass % or less, preferably 0.01 to 1.5 mass % and more preferably in a range of 0.1 to 1.0 mass %. The moisture content can be measured by a Karl Fischer method.

The curable composition according to the embodiment of the present invention can be used after viscosity is adjusted for the purposes of adjusting the state of a film surface (flatness or the like), adjusting a film thickness, or the like. The value of the viscosity can be appropriately selected as desired, and is, for example, preferably 0.3 mPa×s to 50 mPa×s, and more preferably 0.5 mPa×s to 20 mPa×s at 25° C. As for a method for measuring the viscosity, the viscosity can be measured, for example, with a temperature being adjusted to 25° C., using a viscometer RE85L (rotor: 1° 34'×R24, measurement range of 0.6 to 1,200 mPa×s) manufactured by Toki Sangyo Co., Ltd.

In a case where the curable composition according to the embodiment of the present invention is used as a color filter in applications for a liquid crystal display device, the voltage holding ratio of a liquid crystal display element comprising a color filter is preferably 70% or more, and more preferably 90% or more. A known method for obtaining a high voltage holding ratio can be appropriately incorporated, and examples of typical methods include use of high-purity materials (for example, reduction in ionic impurities) and control of the amount of acidic functional groups in a composition. The voltage holding ratio can be measured by, for example, the methods described in paragraph 0243 of JP2011-008004A and paragraphs 0123 to 0129 of JP2012-224847A.

A storage container of the curable composition is not particularly limited, and a known storage container can be used. In addition, as the storage container, in order to suppress infiltration of impurities into the raw materials or the curable composition, a multilayer bottle in which a container inner wall having a six-layer structure is formed of six kinds of resins or a bottle in which a container inner wall having a seven-layer structure is formed of six kinds of resins is preferably used. Examples of such a container include a container described in JP2015-123351A. In addition, for the purpose of preventing metal elution from the container inner wall, improving storage stability of the curable composition, and suppressing the alteration of components, it is also preferable that the inner wall of the storage container of the curable composition is formed of glass, stainless steel, or the like.

Storage conditions of the curable composition are not particularly limited, and a known method in the related art can be used. In addition, a method described in JP2016-180058A can be used.

<Method of Preparing Curable Composition>

The curable composition according to the embodiment of the present invention can be prepared by mixing the above-described components with each other. During the preparation of the curable composition, all the components may be dissolved and/or dispersed in a solvent at the same time to prepare the curable composition. Optionally, two or more solutions or dispersion liquids in which the respective components are appropriately blended may be prepared, and the solutions or dispersion liquids may be mixed with each other during use (during application) to prepare the curable composition.

In addition, in the preparation of the curable composition, a process of dispersing the pigment is preferably included. In the process of dispersing the pigment, examples of a mechanical force which is used for dispersing the pigment include compression, pressing, impact, shear, and cavitation. Specific examples of these processes include a beads mill, a sand mill, a roll mill, a ball mill, a paint shaker, a microfluidizer, a high-speed impeller, a sand grinder, a flow jet mixer, high-pressure wet atomization, and ultrasonic dispersion. In addition, in the pulverization of the pigment in a sand mill (beads mill), it is preferable to perform a treatment under the condition for increasing a pulverization efficiency by using beads having small diameters; increasing the filling rate of the beads; or the like. In addition, it is preferable that rough particles are removed by filtering, centrifugal separation, and the like after pulverization treatment. In addition, as the process and the disperser for dispersing the pigment, the process and the disperser described in "Dispersion Technology Comprehension, published by Johokiko Co., Ltd., Jul. 15, 2005", "Actual comprehensive data collection on dispersion technology and industrial application centered on suspension (solid/liquid dispersion system), published by Publication Department, Management Development Center, Oct. 10, 1978", and paragraph No. 0022 of JP2015-157893A can be suitably used. In addition, in the process for dispersing the pigment, a refining treatment of particles in a salt milling step may be performed. A material, a device, process conditions, and the like used in the salt milling step can be found in, for example, JP2015-194521A and JP2012-046629A.

During the preparation of the curable composition, it is preferable that the curable composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including high-density polypropylene) or nylon is preferable.

The pore size of the filter is preferably 0.01 to 7.0 μm, more preferably 0.01 to 3.0 μm, and still more preferably 0.05 to 0.5 μm. In a case where the pore size of the filter is within the above-described range, fine foreign matters can be reliably removed. With regard to the pore size value of the filter, reference can be made to a nominal value of filter manufacturers. As the filter, various filters provided by Nihon Pall Corporation (DFA4201NIEY and the like), Advantec Toyo Kaisha., Ltd., Nihon Entegris G.K. (formerly Nippon Microlith Co., Ltd.), Kitz Microfilter Corporation, and the like can be used.

In addition, it is preferable that a fibrous filter material is used as the filter. Examples of the fibrous filter material include polypropylene fiber, nylon fiber, and glass fiber. Examples of a commercially available product include SBP type series (SBP008 and the like), TPR type series (TPR002, TPR005, and the like), or SHPX type series (SHPX003 and the like), all manufactured by Roki Techno Co., Ltd.

In a case where a filter is used, a combination of different filters (for example, a first filter and a second filter) may be used. In this case, the filtering using each of the filters may be performed once, or twice or more. In addition, a combination of filters having different pore sizes in the above-described range may be used. In addition, the filtering using the first filter may be performed only on the dispersion liquid, and then the filtering using the second filter may be performed on a mixture of the dispersion liquid and other components.

<Film>

The film according to the embodiment of the present invention is a film obtained from the above-described curable composition according to the embodiment of the present invention. The film according to the embodiment of the present invention can be used for a color filter, a near-infrared transmission filter, a near-infrared cut filter, a black matrix, a light-shielding film, and the like. For example, the film according to the embodiment of the present invention can be preferably used as a colored layer (colored pixel) of a color filter. Examples of the colored pixel include a red pixel, a green pixel, a blue pixel, a magenta pixel, a cyan pixel, and a yellow pixel. The thickness of the film according to the embodiment of the present invention can be appropriately adjusted according to the purpose. For example, the thickness of the film is preferably 20 μm or less, more preferably 10 μm or less, and still more preferably 5 μm or less. The lower limit of the thickness of the film is preferably 0.1 μm or more, more preferably 0.2 m or more, and still more preferably 0.3 μm or more.

<Color Filter>

Next, the color filter according to the embodiment of the present invention will be described. The color filter according to the embodiment of the present invention has the film according to the embodiment of the present invention. More preferably, the color filter according to the embodiment of the present invention has the film according to the embodiment of the present invention as a colored pixel of the color filter. The color filter according to the embodiment of the present invention can be used for a solid-state imaging element such as a charge coupled device (CCD) and a complementary metal-oxide semiconductor (CMOS), an image display device, or the like.

In the color filter according to the embodiment of the present invention, the thickness of the film according to the embodiment of the present invention can be appropriately adjusted depending on the purposes. The thickness of the film is preferably 20 μm or less, more preferably 10 μm or less, and still more preferably 5 μm or less. The lower limit of the thickness of the film is preferably 0.1 μm or more, more preferably 0.2 μm or more, and still more preferably 0.3 μm or more.

In the color filter according to the embodiment of the present invention, the width of the pixel is preferably 0.5 to 20.0 μm. The lower limit is preferably 1.0 μm or more and more preferably 2.0 μm or more. The upper limit is preferably 15.0 μm or less and more preferably 10.0 μm or less. In addition, the Young's modulus of the pixel is preferably 0.5 to 20 GPa and more preferably 2.5 to 15 GPa.

Each pixel included in the color filter according to the embodiment of the present invention preferably has high flatness. Specifically, the surface roughness Ra of the pixel is preferably 100 nm or less, more preferably 40 nm or less, and still more preferably 15 nm or less. The lower limit is not specified, but is preferably, for example, 0.1 nm or more. The surface roughness of the pixel can be measured, for example, using an atomic force microscope (AFM) Dimension 3100 manufactured by Veeco Instruments, Inc. In addition, the contact angle of water on the pixel can be appropriately set to a preferred value and is typically in the range of 500 to 110°. The contact angle can be measured, for example, using a contact angle meter CV-DT-A Model (manufactured by Kyowa Interface Science Co., Ltd.). In addition, it is preferable that the volume resistivity value of the pixel is high. Specifically, the volume resistivity value of the pixel is preferably 109 Ω×cm or more and more preferably $10^{11}$ Ω×cm or more. The upper limit is not specified, but is, for example, preferably $10^{14}$ Ω×cm or less. The volume resistivity value of the pixel can be measured, for example, using an ultrahigh resistance meter 5410 (manufactured by Advantest Corporation).

In addition, in the color filter according to the embodiment of the present invention, a protective layer may be provided on the surface of the film according to the embodiment of the present invention. By providing the protective layer, various functions such as oxygen shielding, low reflection, hydrophilicity/hydrophobicity, and shielding of light (ultraviolet rays, near-infrared rays, and the like) having a specific wavelength can be imparted. The thickness of the protective layer is preferably 0.01 to 10 μm and more preferably 0.1 to 5 μm. Examples of a method for forming the protective layer include a method of forming the protective layer by applying a resin composition dissolved in an organic solvent, a chemical vapor deposition method, and a method of attaching a molded resin with an adhesive. Examples of components constituting the protective layer include a (meth)acrylic resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamidoimide resin, a polyolefin resin, a cyclic olefin resin, a polyester resin, a styrene resin, a polyol resin, a polyvinylidene chloride resin, a melamine resin, a urethane resin, an aramid resin, a polyamide resin, an alkyd resin, an epoxy resin, a modified silicone resin, a fluororesin, a polycarbonate resin, a polyacrylonitrile resin, a cellulose resin, Si, C, W, $Al_2O_3$, Mo, $SiO_2$, and $Si_2N_4$, and two or more kinds of these components may be contained. For example, in a case of a protective layer for oxygen shielding, it is preferable that the protective layer contains a polyol resin, $SiO_2$, and $Si_2N_4$. In addition, in a case of a protective layer for low reflection, it is preferable that the protective layer contains a (meth)acrylic resin and a fluororesin.

In a case of forming the protective layer by applying a resin composition, as a method for applying the resin composition, a known method such as a spin coating method, a casting method, a screen printing method, and an inkjet method can be used. As the organic solvent included in the resin composition, a known organic solvent (for example, propylene glycol 1-monomethyl ether 2-acetate, cyclopentanone, ethyl lactate, and the like) can be used. In a case of forming the protective layer by a chemical vapor deposition method, as the chemical vapor deposition method, a known chemical vapor deposition method (thermochemical vapor deposition method, plasma chemical vapor deposition method, and photochemical vapor deposition method) can be used.

The protective layer may contain, as desired, an additive such as organic or inorganic fine particles, an absorber of light (for example, ultraviolet rays, near-infrared rays, and the like) having a specific wavelength, a refractive index adjusting agent, an antioxidant, an adhesive agent, and a surfactant. Examples of the organic or inorganic fine particles include polymer fine particles (for example, silicone resin fine particles, polystyrene fine particles, and melamine resin fine particles), titanium oxide, zinc oxide, zirconium oxide, indium oxide, aluminum oxide, titanium nitride, titanium oxynitride, magnesium fluoride, hollow silica, silica, calcium carbonate, and barium sulfate. As the absorber of light having a specific wavelength, a known absorber can be used. The content of these additives can be appropriately adjusted, but is preferably 0.1 to 70 mass % and still more preferably 1 to 60 mass % with respect to the total mass of the protective layer.

In addition, as the protective layer, the protective layers described in paragraph Nos. 0073 to 0092 of JP2017-151176A can also be used.

The color filter may have a structure in which each colored pixel is embedded in a space partitioned in, for example, a lattice form by a partition wall.

<Pattern Forming Method>

Next, a pattern forming method using the curable composition according to the embodiment of the present invention will be described. The pattern forming method preferably includes a step of forming a curable composition layer on a support using the above-described curable composition according to the embodiment of the present invention, a step of patternwise exposing the curable composition layer, and a step of removing an unexposed area of the curable composition layer by development to form a pattern (pixel). Hereinafter, each step will be described.

In the step of forming a curable composition layer, the curable composition layer is formed on a support using the curable composition according to the embodiment of the present invention. The support is not particularly limited, and can be appropriately selected depending on applications. Examples thereof include a glass substrate and a silicon substrate, and a silicon substrate is preferable. In addition, a charge coupled device (CCD), a complementary metal-oxide semiconductor (CMOS), a transparent conductive film, or the like may be formed on the silicon substrate. In some cases, a black matrix for isolating each pixel is formed on the silicon substrate. In addition, an undercoat layer may be provided on the silicon substrate so as to improve adhesiveness to an upper layer, prevent the diffusion of substances, or planarize the surface of the substrate.

As a method of applying the curable composition, a known method can be used. Examples of the known method include: a drop casting method; a slit coating method; a spray method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using a mold or the like; and a nanoimprint lithography method. The application method using an ink jet method is not particularly limited, and examples thereof include a method (in particular, pp. 115 to 133) described in "Extension of Use of Ink Jet-Infinite Possibilities in Patent-" (published on February, 2005, S. B. Research Co., Ltd.) and methods described in JP2003-262716A, JP2003-185831A, JP2003-261827A, JP2012-126830A, and JP2006-169325A. In addition, examples of the method of applying the curable composition include methods described in WO2017/030174A and WO2017/018419A, the contents of which are incorporated herein by reference.

The curable composition layer formed on the support may be dried (pre-baked). In a case of producing a film by a low-temperature process, pre-baking may not be performed. In a case where pre-baking is performed, the pre-baking temperature is preferably 150° C. or lower, more preferably 120° C. or lower, and still more preferably 110° C. or lower. The lower limit may be, for example, 50° C. or higher or 80° C. or higher. The pre-baking time is preferably 10 to 3000 seconds, more preferably 40 to 2500 seconds, and still more preferably 80 to 2200 seconds. Pre-baking can be performed using a hot plate, an oven, or the like.

Next, the curable composition layer is patternwise exposed (exposing step). For example, the curable composition layer can be patternwise exposed using a stepper exposure device or a scanner exposure device through a mask having a predetermined mask pattern. As a result, an exposed area can be cured.

Examples of the radiation (light) which can be used during the exposure include g-rays and i-rays. In addition, light (preferably light having a wavelength of 180 to 300 nm) having a wavelength of 300 nm or less can also be used. Examples of the light having a wavelength of 300 nm or less include KrF-rays (wavelength: 248 nm) and ArF-rays (wavelength: 193 nm), and KrF-rays (wavelength: 248 nm) are preferable. In addition, a long-wave light source of 300 nm or more can be used.

In addition, in a case of exposure, the composition layer may be irradiated with light continuously to expose the composition layer, or the composition layer may be irradiated with light in a pulse to expose the composition layer (pulse exposure). The pulse exposure refers to an exposing method in which light irradiation and resting are repeatedly performed in a short cycle (for example, millisecond-level or less). In a case of the pulse exposure, the pulse width is preferably 100 nanoseconds (ns) or less, more preferably 50 nanoseconds or less, and still more preferably 30 nanoseconds or less. The lower limit of the pulse width is not particularly limited, and may be 1 femtosecond (fs) or more or 10 femtoseconds or more. The frequency is preferably 1 kHz or more, more preferably 2 kHz or more, and still more preferably 4 kHz or more. The upper limit of the frequency is preferably 50 kHz or less, more preferably 20 kHz or less, and still more preferably 10 kHz or less. The maximum instantaneous illuminance is preferably 50000000 $W/m^2$ or more, more preferably 100000000 $W/m^2$ or more, and still more preferably 200000000 $W/m^2$ or more. In addition, the upper limit of the maximum instantaneous illuminance is preferably 1000000000 $W/m^2$ or less, more preferably 800000000 $W/m^2$ or less, and still more preferably 500000000 $W/m^2$ or less. The pulse width refers to a time during which light is irradiated in a pulse period. In addition, the frequency refers to the number of pulse periods per second. In addition, the maximum instantaneous illuminance refers to an average illuminance within the period of light irradiation in the pulse period. In addition, the pulse period refers to a period in which light irradiation and resting in the pulse exposure are defined as one cycle.

The irradiation dose (exposure dose) is, for example, preferably 0.03 to 2.5 $J/cm^2$ and more preferably 0.05 to 1.0 $J/cm^2$. The oxygen concentration during the exposure can be appropriately selected, and the exposure may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume), in addition to an atmospheric air. In addition, the exposure illuminance can be appropriately set, and can be usually selected from a range of 1000 $W/m^2$ to 100000 $W/m^2$ (for example, 5000 $W/m^2$, 15000 $W/m^2$, or 35000 $W/m^2$). Appropriate conditions of each of the oxygen concentration and the exposure illuminance may be combined, and for example, a combination of the oxygen concentration of 10% by volume and the illuminance of 10000 $W/m^2$, a combination of the oxygen concentration of 35% by volume and the illuminance of 20000 $W/m^2$, or the like is available.

Next, the unexposed area of the curable composition layer is removed by development to form a pattern (pixel). The unexposed area of the curable composition layer can be removed by development using a developer. Thus, the curable composition layer of the unexposed area in the exposing step is eluted into the developer, and as a result, only a photocured portion remains. For example, the temperature of the developer is preferably 20° C. to 30° C. The development time is preferably 20 to 180 seconds. In addition, in order to further improve residues removing properties, a step of shaking the developer off per 60 seconds and supplying a new developer may be repeated multiple times.

Examples of the developer include an organic solvent and an alkaline developer, and an alkaline developer is preferably used. As the alkaline developer, an alkaline solution (alkaline developer) in which an alkaline agent is diluted with pure water is preferable. Examples of the alkaline agent include: an organic alkaline compound such as ammonia, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethylammonium hydroxide, benzyltrimethylammonium hydroxide, dimethyl bis(2-hydroxyethyl)ammonium hydroxide, choline, pyrrole, piperidine, and 1,8-diazabicyclo[5.4.0]-7-undecene; and an inorganic alkaline compound such as sodium hydroxide, potassium hydroxide, sodium carbonate, sodium bicarbonate, sodium silicate, and sodium metasilicate. In consideration of environmental aspects and safety aspects, the alkaline agent is preferably a compound having a high molecular weight. The concentration of the alkaline agent in the alkaline solution is preferably 0.001 to 10 mass % and more preferably 0.01 to 1 mass %. In addition, the developer may further contain a surfactant. Examples of the surfactant include the surfactants described above. Among these, a nonionic surfactant is preferable. From the viewpoint of easiness of transport, storage, and the like, the developer may be obtained by temporarily preparing a concentrated solution and diluting the concentrated solution to a necessary concentration during use. The dilution factor is not particularly limited and, for example, can be set to be in a range of 1.5 to 100 times. In addition, it is also preferable to wash (rinse) with pure water after development. In addition, it is preferable that the rinsing is performed by supplying a rinsing liquid to the curable composition layer after development while rotating the support on which the curable composition layer after development is formed. In addition, it is preferable that the rinsing is performed by moving a nozzle discharging the rinsing liquid from a center of the support to a peripheral edge of the support. In this case, in the movement of the nozzle from the center of the support to the peripheral edge of the support, the nozzle may be moved while gradually decreasing the moving speed of the nozzle. By performing rinsing in this manner, in-plane variation of rinsing can be suppressed. In addition, the same effect can be obtained by gradually decreasing the rotating speed of the support while moving the nozzle from the center of the support to the peripheral edge of the support.

After the development, it is preferable to perform an additional exposure treatment or a heating treatment (post-baking) after carrying out drying. The additional exposure treatment or the post-baking is a curing treatment after development in order to complete curing. The heating temperature in the post-baking is preferably, for example, 100° C. to 240° C. and more preferably 200° C. to 240° C. The film after development is post-baked continuously or batch-wise using a heating unit such as a hot plate, a convection oven (hot air circulation dryer), and a high-frequency heater under the above-described conditions. In a case of performing the additional exposure treatment, light used for the exposure is preferably light having a wavelength of 400 nm or less. In addition, the additional exposure treatment may be carried out by the method described in KR10-2017-0122130A.

<Structural Body>

Next, the structural body according to the embodiment of the present invention will be described with reference to drawings. FIG. 1 is a side-sectional view showing an embodiment of the structural body according to the present invention, and FIG. 2 is a plan view of the structural body as viewed from directly above.

Figure 2:
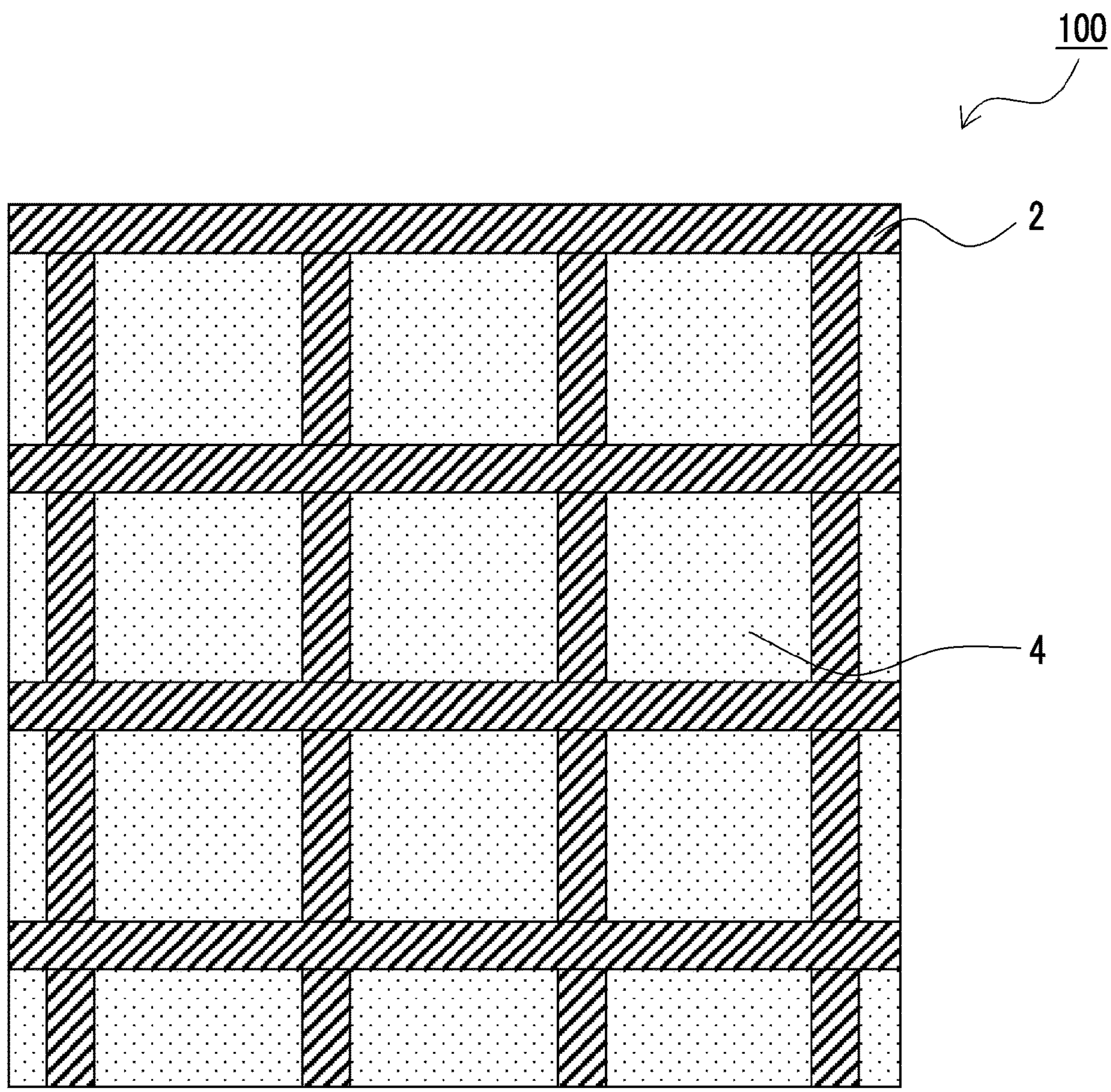
FIG. 2 is a plan view of the structural body as viewed from directly above.

As shown in FIGS. 1 and 2, a structural body 100 according to the embodiment of the present invention includes a support 1, a partition wall 2 provided on the support 1, and a pixel 4 provided on a region of the support 1 partitioned by the partition wall 2. At least one kind (one color) of the pixel 4 is obtained by using the above-described curable composition according to the embodiment of the present invention.

In the structural body according to the embodiment of the present invention, the type of the support 1 is not particularly limited. A substrate (silicon wafer, silicon carbide wafer, silicon nitride wafer, sapphire wafer, and glass wafer) used in various electronic devices such as a solid-state imaging element can be used. In addition, a substrate for a solid-state imaging element on which a photodiode is formed can also be used. In addition, as necessary, an undercoat layer may be provided on these substrates so as to improve adhesiveness to an upper layer, prevent the diffusion of substances, or planarize the surface.

As shown in FIGS. 1 and 2, the partition wall 2 is formed on the support 1. In this embodiment, as shown in FIG. 2, the partition walls 2 are formed in a lattice form in a plan view seen from directly above the support 1. In this embodiment, the shape of the region partitioned by the partition wall 2 on the support 1 (hereinafter, also referred to as a shape of an opening portion of the partition wall) is a square shape, but the shape of the opening portion of the partition wall is not particularly limited, and may be, for example, a rectangular shape, a circular shape, an elliptical shape, a polygonal shape, or the like.

The material of the partition wall 2 is not particularly limited, but it is preferable that the partition wall 2 is formed of a material having a refractive index smaller than that of the pixel 4. According to this aspect, a structural body in which the pixel 4 having a large refractive index is surrounded by the partition wall 2 having a small refractive index can be formed. As a result, light which is to be leaked from the pixel 4 having a large refractive index is easily reflected by the partition wall 2 and returned to the pixel 4, and it is possible to suppress the leakage of light to the adjacent pixel 4. As a specific example of the material of the partition wall 2, various inorganic materials and organic materials can be used. Examples of the organic material include acrylic resin, polystyrene resin, polyimide resin, and organic spin on glass (SOG) resin. Examples of the inorganic material include porous silica, polycrystalline silicon, silicon oxide, silicon nitride, and metal materials such as tungsten and aluminum.

A width W1 of the partition wall 2 is preferably 20 to 500 nm. The lower limit is preferably 30 nm or more, more preferably 40 nm or more, and still more preferably 50 nm or more. The upper limit is preferably 300 nm or less, more preferably 200 nm or less, and still more preferably 100 nm or less.

In addition, a height H1 of the partition wall 2 is preferably 200 nm or more, more preferably 300 nm or more, and still more preferably 400 nm or more. The upper limit is preferably the height (thickness) H2 of the pixel 4×200% or less and more preferably the height (thickness) H2 of the pixel 4×150% or less, and it is still more preferable that the upper limit is substantially the same as the height (thickness) H2 of the pixel 4.

A height-to-width ratio (height/width) of the partition wall 2 is preferably 1 to 100, more preferably 5 to 50, and still more preferably 5 to 30.

A pitch width P1 of the partition walls 2 is preferably 0.5 to 2.0 μm. The lower limit is preferably 0.6 μm or more, more preferably 0.7 μm or more, and still more preferably 0.8 μm or more. The upper limit is preferably 1.8 μm or less, more preferably 1.4 μm or less, and still more preferably 1.2 μm or less. The pitch width P1 of the partition walls 2 is an arrangement pitch of adjacent partition walls. The pixel size is smaller as the pitch width P1 is shorter.

A protective layer may be provided on the surface of the partition wall 2. As a material of the protective layer, various inorganic materials and organic materials can be used. Examples of the organic material include acrylic resin, polystyrene resin, polyimide resin, and organic spin on glass (SOG) resin. In addition, the protective layer can also be formed using a composition including a compound having an ethylenically unsaturated bonding group. Examples of the ethylenically unsaturated bonding group include a vinyl group, a (meth)allyl group, a (meth)acryloyl group, and a styrene group, and a (meth)allyl group or a (meth)acryloyl group is preferable. The compound having an ethylenically unsaturated bonding group may be either a monomer or a resin such as a polymer. Examples of the inorganic material include silicon dioxide.

The pixel 4 is formed in the region (opening portion of the partition wall) of the support 1 partitioned by the partition wall 2. Examples of the type of pixel 4 include colored pixels such as red, blue, green, magenta, and cyan, transparent pixels, and pixels of an infrared absorbing filter. The type and arrangement of pixels can be optionally selected.

A height (thickness) H2 of the pixel 4 can be appropriately selected depending on applications. For example, the height H2 of the pixel 4 is preferably 300 to 1000 nm, more preferably 300 to 800 nm, and still more preferably 300 to 600 nm. In addition, the height (thickness) H2 of the pixel 4 may be higher or lower than the height of the partition wall 2. The height (thickness) H2 of the pixel 4 can be appropriately selected depending on the application.

The structural body according to the embodiment of the present invention can be preferably used for a color filter, a solid-state imaging element, an image display device, and the like.

<Solid-State Imaging Element>

A solid-state imaging element according to the embodiment of the present invention has the film according to the embodiment of the present invention. The configuration of the solid-state imaging element according to the embodiment of the present invention is not particularly limited as long as the solid-state imaging element is configured to include the film according to the embodiment of the present invention and functions as a solid-state imaging element. Examples of the configuration include the following configurations.

The solid-state imaging element is configured to have a plurality of photodiodes constituting a light receiving area of the solid-state imaging element (a charge coupled device (CCD) image sensor, a complementary metal-oxide semiconductor (CMOS) image sensor, or the like), and a transfer electrode formed of polysilicon or the like on a substrate; have a light-shielding film having openings only over the light receiving portion of the photodiodes on the photodiodes and the transfer electrodes; have a device-protective film formed of silicon nitride or the like, which is formed to cover the entire surface of the light-shielding film and the light receiving portion of the photodiodes, on the light-shielding film; and have a color filter on the device-protective film. Further, the solid-state imaging element may also be configured, for example, such that it has a light collecting unit (for example, a microlens, which is the same hereinafter) on a device-protective film under a color filter (a side closer to the substrate), or has a light collecting unit on a color filter. In addition, the color filter may have a structure in which each colored pixel is embedded in a space partitioned in, for example, a lattice form by a partition wall. In this case, it is preferable that the partition wall has a lower refractive index than each colored pixel. Examples of an imaging device having such a structure include the devices described in JP2012-227478A, JP2014-179577A, WO2018/043654A, and US2018/0040656A. An imaging device including the solid-state imaging element according to the embodiment of the present invention can also be used as a vehicle-mounted camera or a monitoring camera, in addition to a digital camera or electronic equipment (mobile phones or the like) having an imaging function.

<Image Display Device>

The image display device according to the embodiment of the present invention has the film according to the embodiment of the present invention. Examples of the image display device include a liquid crystal display device or an organic electroluminescence display device. The definitions of image display devices or the details of the respective image display devices are described in, for example, "Electronic Display Device (edited by Akio Sasaki, Kogyo Chosakai Publishing Co., Ltd., published in 1990)", "Display Device (edited by Sumiaki Ibuki, Sangyo Tosho Co., Ltd., published in 1989)", and the like. In addition, the details of a liquid crystal display device can be found in, for example, "Next-Generation Liquid Crystal Display Techniques (edited by Tatsuo Uchida, Kogyo Chosakai Publishing Co., Ltd., published in 1994)". The liquid crystal display device to which the present invention is applicable is not particularly limited. For example, the present invention is applicable to various liquid crystal display devices described in "Next-Generation Liquid Crystal Display Techniques".

EXAMPLES

Hereinafter, the present invention will be described in detail using Examples. Materials, used amounts, proportions, treatment details, treatment procedures, and the like shown in the following examples can be appropriately changed within a range not departing from the scope of the present invention. Accordingly, the scope of the present invention is not limited to the following specific examples.

<Measurement of Weight-Average Molecular Weight (Mw)>

The weight-average molecular weight (Mw) of a resin was measured by gel permeation chromatography (GPC) according to the following conditions.

Types of columns: columns formed by connection of TOSOH TSKgel Super HZM-H, TOSOH TSKgel Super HZ4000, and TOSOH TSKgel Super HZ2000

Developing solvent: tetrahydrofuran

Column temperature: 40° C.

Flow amount (amount of a sample to be injected): 1.0 μL (sample concentration: 0.1 mass %)

Device name: HLC-8220GPC manufactured by Tosoh Corporation

Detector: refractive index (RI) detector

Calibration curve base resin: polystyrene resin

<Method of Measuring Acid Value>

The acid value of the resin represents a mass of potassium hydroxide required to neutralize acidic components per 1 g of solid content of the resin. The acid value of the resin was measured as follows. That is, a measurement sample was dissolved in a mixed solvent of tetrahydrofuran/water=9/1 (mass ratio), and the obtained solution was subjected to neutralization titration with a 0.1 mol/L sodium hydroxide aqueous solution at 25° C. using a potentiometric titrator (trade name: AT-510, manufactured by KYOTO ELECTRONICS MANUFACTURING CO., LTD.). An inflection point of a titration pH curve was set as a titration end point, and the acid value was calculated from the following equation.

$$A=56.11\times Vs\times 0.5\times f/w$$

A: acid value (mgKOH/g)

Vs: amount (mL) of the 0.1 mol/L sodium hydroxide aqueous solution used for the titration f: titer of the 0.1 mol/L sodium hydroxide aqueous solution w: mass (g) of the measurement sample (expressed in terms of solid contents)

<Synthesis of Resin>

Synthesis Example of Dispersant 17

(1) Synthesis of Macromonomer A 380 parts by mass of propylene glycol monomethyl ether acetate (PGMEA) was charged into a three-neck flask, and the temperature was increased to 75° C. while flowing nitrogen into the flask. Separately, a dropping solution in which 200 parts by mass of methyl methacrylate, 200 parts by mass of butyl acrylate, 23.5 parts by mass of 3-mercaptopropionic acid, 2.25 parts by mass of 2,2'-azobis(methyl 2-metylpropionate) (hereinafter, described as "V-601"), and 254 parts by mass of PGMEA were mixed was prepared. This dropping solution was added dropwise to the above-described three-neck flask over 2 hours. After dropwise addition, the mixture was further heated and stirred at the same temperature for 1 hour. After further adding 2.25 parts by mass of V-601, the mixture was heated at the same temperature for 2 hours. 2.25 parts by mass of V-601 was further added thereto, the temperature was increased to 90° C., the mixture was heated for 3 hours, the polymerization reaction was terminated.

Next, 40.1 parts by mass of glycidyl methacrylate (GMA), 21.2 parts by mass of tetrabutylammonium bromide, and 0.127 parts by mass of dibutylhydroxytoluene (BHT) were added to the obtained polymerization reactant, and the mixture was heated at 100° C. for 4 hours. After confirming that the acid value was 0 by the acid value titration method, the GMA reaction was terminated.

A mixture of 3500 parts by mass of methanol and 3500 parts by mass of water was added dropwise to the obtained GMA reactant was added while stirring. The supernatant was removed, the obtained gum-like product was dried, propylene glycol monomethyl ether acetate was added thereto until the solid content reached 50 mass %, thereby dissolving the product to obtain a 50 mass % PGMEA solution of a macromonomer A.

(2) Synthesis of Dispersant 17

300 parts by mass of the 50 mass % PGMEA solution of the macromonomer A synthesized above, 33 parts by mass of methacrylic acid, 117 parts by mass of benzyl methacrylate, and 549 parts by mass of PGMEA were charged into a three-neck flask, the temperature of the mixture was increased to 75° C. while flowing nitrogen into the flask. 5.21 parts by mass of dodecyl mercaptan and 0.987 parts by mass of V-601 were further added thereto, and the mixture was heated at the same temperature for 2 hours. After further adding 2.25 parts by mass of V-601, the mixture was heated at the same temperature for 2 hours. 2.25 parts by mass of V-601 was further added thereto, the temperature was increased to 90° C., the mixture was heated for 3 hours, and the polymerization reaction was terminated to synthesize a resin. Thereafter, PGMEA was added thereto to adjust the concentration of solid contents to 30 mass %, thereby obtaining a dispersant 17 (30 mass % PGMEA solution). The weight-average molecular weight of the obtained resin was 19000, and the acid value thereof was 72 mgKOH/g.

Modified Example of Synthesis Example of Dispersant 17

A macromonomer A and a dispersant 17 were synthesized by changing V-601 which was used in the synthesis of the macromonomer A and the dispersant 17 to 4,4'-azobis(4-cyanovaleric acid), 2,2'-azobis[2-(2-imidazolin-2-yl)propane] dihydrochloride, 2,2'-azobis[2-(2-imidazolin)-2-yl) propane] disulfate/dihydrate, 2,2'-azobis'(2-methylpropionamidine) dihydrochloride, 2,2'-azobis[N-(2-carboxyethyl)-2-methylpropionamidine] tetrahydrate, 2,2'-azobis[2-methyl-N-(2-hydroxyethyl)propionamide], 2,2'-azobis(isobutyronitrile), 2,2'-azobis (4-methoxy-2,4-dimethylvaleronitrile), 2,2'-azobis(2,4-dimethylvaleronitrile), 2,2'-azobis(methyl isobutyrate), 2,2'-azobis(2-methylbutyronitrile), 1,1'-azobis(cyclohexane-1-carbonitrile), 2,2'-azobis(N-butyl-2-methylpropionamide), or 1,1'-azobis (1-methyl cyclohexanecarboxylate).

Synthesis Example of Dispersant 39

(1) Synthesis of Macromonomer B 380 parts by mass of propylene glycol monomethyl ether acetate (PGMEA) was charged into a three-neck flask, and the temperature was increased to 75° C. while flowing nitrogen into the flask. Separately, a dropping solution in which 200 parts by mass of methyl methacrylate, 200 parts by mass of butyl acrylate, 29.8 parts by mass of 6-mercapto-1-hexanol, 2.25 parts by mass of V-601, and 254 parts by mass of PGMEA were mixed was prepared. This dropping solution was added dropwise to the above-described three-neck flask over 2 hours. After dropwise addition, the mixture was further heated and stirred at the same temperature for 1 hour. After further adding 2.25 parts by mass of V-601, the mixture was heated at the same temperature for 2 hours. 2.25 parts by mass of V-601 was further added thereto, the temperature was increased to 90° C., the mixture was heated for 3 hours, and the polymerization reaction was terminated.

Next, 35.4 parts by mass of 2-isocyanatoethyl methacrylate (manufactured by SHOWA DENKO K.K., Karenz MOI) was added to the obtained polymerization reactant, the mixture was cooled to 0° C., 0.860 parts by mass of zirconium(IV) acetylacetonate and 0.127 parts by mass of dibutylhydroxytoluene (BHT) were added to the mixture, and the mixture was stirred at the same temperature for 2 hours and then at 30° C. for 3 hours.

53.0 parts by mass of PGMEA was added to the obtained MOI reactant, thereby obtaining a 40 mass % PGMEA solution of a macromonomer B.

(2) Synthesis of Dispersant 39

300 parts by mass of the 40 mass % PGMEA solution of the macromonomer B synthesized above, 26.4 parts by mass of methacrylic acid, 93.6 parts by mass of benzyl methacrylate, and 379 parts by mass of PGMEA were charged into a three-neck flask, the temperature of the mixture was increased to 75° C. while flowing nitrogen into the flask. 4.17 parts by mass of dodecyl mercaptan and 0.790 parts by mass of V-601 were further added thereto, and the mixture was heated at the same temperature for 2 hours. After further adding 0.790 parts by mass of V-601, the mixture was heated at the same temperature for 2 hours. 0.790 parts by mass of V-601 was further added thereto, the mixture was heated at 90° C. for 3 hours, and the polymerization reaction was terminate to synthesize a resin. Thereafter, PGMEA was added thereto to adjust the concentration of solid contents to 30 mass %, thereby obtaining a dispersant 39 (30 mass % PGMEA solution). The weight-average molecular weight of the obtained resin was 18000, and the acid value thereof was 73 mgKOH/g.

Synthesis Example of Dispersant 42

(1) Synthesis of Macromonomer C 380 parts by mass of PGMEA was charged into a three-neck flask, and the temperature was increased to 75° C. while flowing nitrogen into the flask. Separately, a dropping solution in which 400 parts by mass of ethyl methacrylate, 29.8 parts by mass of 6-mercapto-1-hexanol, 2.25 parts by mass of V-601, and 254 parts by mass of PGMEA were mixed was prepared. This dropping solution was added dropwise to the above-described three-neck flask over 2 hours. After dropwise addition, the mixture was further heated and stirred at the same temperature for 1 hour. After further adding 2.25 parts by mass of V-601, the mixture was heated at the same temperature for 2 hours. 2.25 parts by mass of V-601 was further added thereto, the temperature was increased to 90° C., the mixture was heated for 3 hours, and the polymerization reaction was terminated.

Next, 35.4 parts by mass of 2-isocyanatoethyl methacrylate (manufactured by SHOWA DENKO K.K., Karenz MOI) was added to the obtained polymerization reactant, the mixture was cooled to 0° C., 0.860 parts by mass of zirconium(IV) acetylacetonate and 0.127 parts by mass of dibutylhydroxytoluene (BHT) were added to the mixture, and the mixture was stirred at the same temperature for 2 hours and then at 30° C. for 3 hours.

53.0 parts by mass of PGMEA was added to the obtained MOI reactant, thereby obtaining a 40 mass % PGMEA solution of a macromonomer C.

(2) Synthesis of Dispersant 42

A dispersant 42 (30 mass % PGMEA solution) was obtained in the same manner as in the production example of the dispersant 39, except that the macromonomer B was changed to the macromonomer C. The weight-average molecular weight of the obtained resin was 18000, and the acid value thereof was 73 mgKOH/g.

Test Example 1

<Production of Dispersion Liquid>

(Dispersion Liquid G1)

230 parts by mass of zirconia beads having a diameter of 0.3 mm were added to a mixed solution obtained by mixing 8.75 parts by mass of C. I. Pigment Green 36 as a G pigment, 3.85 parts by mass of C. I. Pigment Yellow 185 as a Y pigment, 1.40 parts by mass of a derivative 1 as a pigment derivative, 18.7 parts by mass (equivalent to 5.61 parts by mass of solid content) of a dispersant 1 as a resin, and 67.3 parts by mass of propylene glycol monomethyl ether acetate as a solvent, the mixture was subjected to a dispersion treatment for 5 hours using a paint shaker, and the beads were separated by filtration to produce a dispersion liquid G1.

Derivative 1: compound having the following structure (in the following structural formula, Et represents an ethyl group)

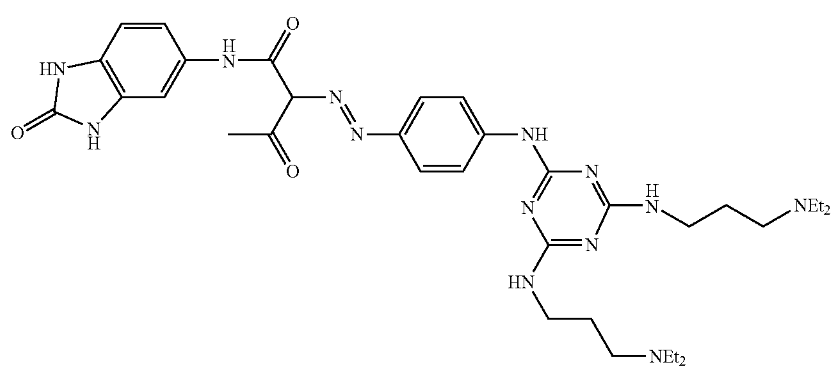

(Dispersion Liquids G2 to G48 and Comparative Dispersion Liquids G1 to G3)

Each dispersion liquid was produced in the same manner as in the dispersion liquid G1, except that the type and blending amount of the resin, and the type of the solvent was changed as shown in the tables below.

TABLE 1

| Dispersion liquid | Resin Type | Resin Part by mass | Solvent Type |
|---|---|---|---|
| Dispersion liquid G1 | Dispersant 1 | 18.7 | PGMEA |
| Dispersion liquid G2 | Dispersant 2 | 18.7 | PGMEA |
| Dispersion liquid G3 | Dispersant 3 | 18.7 | PGMEA |
| Dispersion liquid G4 | Dispersant 4 | 18.7 | PGMEA |
| Dispersion liquid G5 | Dispersant 5 | 18.7 | PGMEA |
| Dispersion liquid G6 | Dispersant 6 | 18.7 | PGMEA |
| Dispersion liquid G7 | Dispersant 7 | 18.7 | PGMEA |
| Dispersion liquid G8 | Dispersant 8 | 18.7 | PGMEA |
| Dispersion liquid G9 | Dispersant 9 | 18.7 | PGMEA |
| Dispersion liquid G10 | Dispersant 10 | 18.7 | PGMEA |
| Dispersion liquid G11 | Dispersant 11 | 18.7 | PGMEA |
| Dispersion liquid G12 | Dispersant 12 | 18.7 | PGMEA |
| Dispersion liquid G13 | Dispersant 13 | 18.7 | PGMEA |
| Dispersion liquid G14 | Dispersant 14 | 18.7 | PGMEA |
| Dispersion liquid G15 | Dispersant 15 | 18.7 | PGMEA |
| Dispersion liquid G16 | Dispersant 16 | 18.7 | PGMEA |
| Dispersion liquid G17 | Dispersant 17 | 18.7 | PGMEA |
| Dispersion liquid G18 | Dispersant 18 | 18.7 | PGMEA |
| Dispersion liquid G19 | Dispersant 18 | 18.7 | PGME |
| Dispersion liquid G20 | Dispersant 18 | 18.7 | Cyclohexanone |
| Dispersion liquid G21 | Dispersant 18/Resin D1 | 14.0/1.4 | PGMEA |
| Dispersion liquid G22 | Dispersant 19 | 18.7 | PGMEA |
| Dispersion liquid G23 | Dispersant 20 | 18.7 | PGMEA |
| Dispersion liquid G24 | Dispersant 21 | 18.7 | PGMEA |
| Dispersion liquid G25 | Dispersant 22 | 18.7 | PGMEA |
| Dispersion liquid G26 | Dispersant 23 | 18.7 | PGMEA |
| Dispersion liquid G27 | Dispersant 24 | 18.7 | PGMEA |
| Dispersion liquid G28 | Dispersant 25 | 18.7 | PGMEA |
| Dispersion liquid G29 | Dispersant 26 | 18.7 | PGMEA |
| Dispersion liquid G30 | Dispersant 27 | 18.7 | PGMEA |

TABLE 2

| Dispersion liquid | Resin Type | Resin Part by mass | Solvent Type |
|---|---|---|---|
| Dispersion liquid G31 | Dispersant 28 | 18.7 | PGMEA |
| Dispersion liquid G32 | Dispersant 29 | 18.7 | PGMEA |
| Dispersion liquid G33 | Dispersant 30 | 18.7 | PGMEA |
| Dispersion liquid G34 | Dispersant 31 | 18.7 | PGMEA |
| Dispersion liquid G35 | Dispersant 32 | 18.7 | PGMEA |
| Dispersion liquid G36 | Dispersant 33 | 18.7 | PGMEA |
| Dispersion liquid G37 | Dispersant 34 | 18.7 | PGMEA |
| Dispersion liquid G38 | Dispersant 35 | 18.7 | PGMEA |
| Dispersion liquid G39 | Dispersant 36 | 18.7 | PGMEA |
| Dispersion liquid G40 | Dispersant 37 | 18.7 | PGMEA |
| Dispersion liquid G41 | Dispersant 38 | 18.7 | PGMEA |
| Dispersion liquid G42 | Dispersant 39 | 18.7 | PGMEA |
| Dispersion liquid G43 | Dispersant 40 | 18.7 | PGMEA |
| Dispersion liquid G44 | Dispersant 41 | 18.7 | PGMEA |
| Dispersion liquid G45 | Dispersant 42 | 18.7 | PGMEA |
| Dispersion liquid G46 | Dispersant 43 | 18.7 | PGMEA |
| Dispersion liquid G47 | Dispersant 44 | 18.7 | PGMEA |
| Dispersion liquid G48 | Dispersant 45 | 18.7 | PGMEA |
| Comparative dispersion liquid G1 | Comparative dispersant 1 | 18.7 | PGMEA |
| Comparative dispersion liquid G2 | Comparative dispersant 2 | 18.7 | PGMEA |
| Comparative dispersion liquid G3 | Comparative dispersant 3 | 18.7 | PGMEA |

The raw materials indicated by abbreviations shown in the above tables are as follows.

(Resin)

Dispersants 1 to 45 and comparative dispersant 1: 30 mass % PGMEA solution of resins listed in the tables below

TABLE 3

| | Structure of resin | | | | | | Characteristics of resin | |
|---|---|---|---|---|---|---|---|---|
| | Repeating unit having acid group | | Repeating unit having graft chain | | Other repeating units | | | |
| Dispersant | Type | Mass ratio [mass %] | Type | Mass ratio [mass %] | Type | Mass ratio [mass %] | Acid value (mgKOH/g) | Molecular weight |
| Dispersant 1 | a1-1 | 11 | a2-1 | 89 | — | 0 | 73 | 18000 |
| Dispersant 2 | a1-1 | 11 | a2-2 | 89 | — | 0 | 72 | 19000 |
| Dispersant 3 | a1-1 | 11 | a2-3 | 89 | — | 0 | 73 | 19000 |
| Dispersant 4 | a1-1 | 11 | a2-4 | 89 | — | 0 | 71 | 21000 |
| Dispersant 5 | a1-1 | 11 | a2-5 | 89 | — | 0 | 73 | 23000 |
| Dispersant 6 | a1-1 | 11 | a2-6 | 89 | — | 0 | 71 | 22000 |
| Dispersant 7 | a1-1 | 11 | a2-7 | 89 | — | 0 | 73 | 17000 |
| Dispersant 8 | a1-1 | 11 | a2-8 | 89 | — | 0 | 74 | 17000 |
| Dispersant 9 | a1-1 | 11 | a2-9 | 89 | — | 0 | 72 | 18000 |
| Dispersant 10 | a1-1 | 11 | a2-10 | 89 | — | 0 | 74 | 19000 |
| Dispersant 11 | a1-1 | 11 | a2-11 | 89 | — | 0 | 72 | 18000 |
| Dispersant 12 | a1-1 | 15 | a2-12 | 89 | — | 0 | 95 | 20000 |
| Dispersant 13 | a1-2 | 40 | a2-12 | 60 | — | 0 | 96 | 21000 |
| Dispersant 14 | a1-3 | 36 | a2-12 | 64 | — | 0 | 75 | 21000 |
| Dispersant 15 | a1-4 | 38 | a2-12 | 62 | — | 0 | 73 | 21000 |

TABLE 4

| | Structure of resin | | | | | | Characteristics of resin | |
|---|---|---|---|---|---|---|---|---|
| | Repeating unit having acid group | | Repeating unit having graft chain | | Other repeating units | | | |
| Dispersant | Type | Mass ratio [mass %] | Type | Mass ratio [mass %] | Type | Mass ratio [mass %] | Acid value (mgKOH/g) | Molecular weight |
| Dispersant 16 | a1-5 | 9 | a2-12 | 91 | — | 0 | 74 | 19000 |
| Dispersant 17 | a1-6 | 20 | a2-12 | 80 | — | 0 | 72 | 19000 |
| Dispersant 18 | a1-1 | 11 | a2-12 | 50 | a3-1 | 39 | 72 | 19000 |
| Dispersant 19 | a1-1 | 8 | a2-12 | 50 | a3-1 | 42 | 54 | 19000 |
| Dispersant 20 | a1-1 | 17 | a2-12 | 50 | a3-1 | 33 | 110 | 18500 |
| Dispersant 21 | a1-1 | 11 | a2-12 | 50 | a3-2 | 39 | 74 | 18000 |
| Dispersant 22 | a1-1 | 11 | a2-12 | 50 | a3-3 | 39 | 72 | 18000 |
| Dispersant 23 | a1-1 | 11 | a2-13 | 50 | a3-4 | 39 | 71 | 19000 |
| Dispersant 24 | a1-1 | 11 | a2-13 | 50 | a3-5 | 39 | 72 | 19000 |
| Dispersant 25 | a1-1 | 11 | a2-13 | 50 | a3-1 | 39 | 74 | 20000 |
| Dispersant 26 | a1-1 | 11 | a2-14 | 50 | a3-1 | 39 | 71 | 22000 |
| Dispersant 27 | a1-1 | 11 | a2-15 | 89 | — | 0 | 72 | 19000 |
| Dispersant 28 | a1-1 | 11 | a2-16 | 89 | — | 0 | 73 | 19000 |
| Dispersant 29 | a1-1 | 11 | a2-17 | 89 | — | 0 | 72 | 20000 |
| Dispersant 30 | a1-1 | 11 | a2-17 | 50 | a3-1 | 39 | 73 | 20000 |

TABLE 5

| | Structure of resin | | | | | | Characteristics of resin | |
|---|---|---|---|---|---|---|---|---|
| | Repeating unit having acid group | | Repeating unit having graft chain | | Other repeating units | | | |
| Dispersant | Type | Mass ratio [mass %] | Type | Mass ratio [mass %] | Type | Mass ratio [mass %] | Acid value (mgKOH/g) | Molecular weight |
| Dispersant 31 | a1-1 | 11 | a2-18 | 89 | — | 0 | 71 | 18000 |
| Dispersant 32 | a1-1 | 11 | a2-19 | 89 | — | 0 | 71 | 18000 |
| Dispersant 33 | a1-1 | 11 | a2-21 | 89 | — | 0 | 73 | 18000 |
| Dispersant 34 | a1-2 | 40 | a2-21 | 60 | — | 0 | 96 | 21000 |
| Dispersant 35 | a1-3 | 36 | a2-21 | 64 | — | 0 | 75 | 21000 |
| Dispersant 36 | a1-4 | 38 | a2-21 | 62 | — | 0 | 73 | 21000 |
| Dispersant 37 | a1-5 | 9 | a2-21 | 91 | — | 0 | 74 | 19000 |
| Dispersant 38 | a1-6 | 20 | a2-21 | 80 | — | 0 | 72 | 19000 |

TABLE 5-continued

| | Structure of resin | | | | | | Characteristics of resin | |
|---|---|---|---|---|---|---|---|---|
| | Repeating unit having acid group | | Repeating unit having graft chain | | Other repeating units | | | |
| Dispersant | Type | Mass ratio [mass %] | Type | Mass ratio [mass %] | Type | Mass ratio [mass %] | Acid value (mgKOH/g) | Molecular weight |
| Dispersant 39 | a1-1 | 11 | a2-21 | 50 | a3-1 | 39 | 73 | 18000 |
| Dispersant 40 | a1-1 | 11 | a2-21 | 50 | a3-1 | 39 | 73 | 13000 |
| Dispersant 41 | a1-1 | 11 | a2-21 | 50 | a3-1 | 39 | 73 | 10000 |
| Dispersant 42 | a1-1 | 11 | a2-22 | 50 | a3-1 | 39 | 73 | 18000 |
| Dispersant 43 | a1-1 | 11 | a2-23 | 50 | a3-1 | 39 | 73 | 18000 |
| Dispersant 44 | a1-1 | 11 | a2-24 | 50 | a3-1 | 39 | 73 | 18500 |
| Dispersant 45 | a1-1 | 11 | a2-25 | 50 | a3-1 | 39 | 73 | 19000 |
| Comparative dispersant 1 | a1-1 | 11 | a2-20 | 89 | — | 0 | 70 | 19000 |

The abbreviations for each repeating unit in the above tables have the following structure.

(Repeating Unit Having Acid Group)

a1-1 to a1-6: repeating units having the following structures (a1-1)

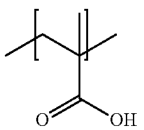

(a1-2)

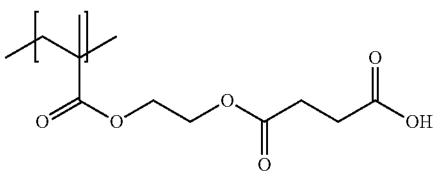

(a1-3)

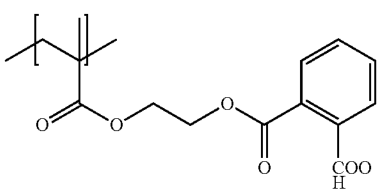

-continued (a1-4)

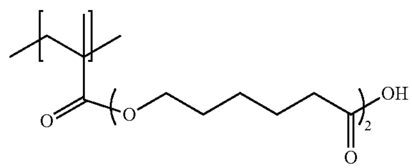

(a1-5)

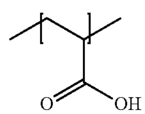

(a1-6)

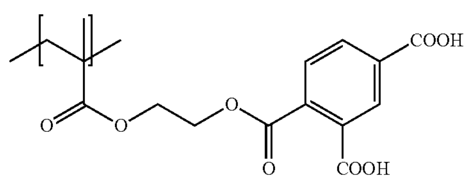

(Repeating Unit Having Graft Chain)

TABLE 6

| | | Graft chain | | | |
|---|---|---|---|---|---|
| | Structure of repeating unit having graft chain ("*" represents a linking site with the graft chain) | Structure of graft chain (numerical value added to the repeating unit is a number representing mass %)) | Tg (° C.) | Hansen solubility parameter ((cal/cm$^3$)$^{0.5}$) | Mw |
| a2-1 | 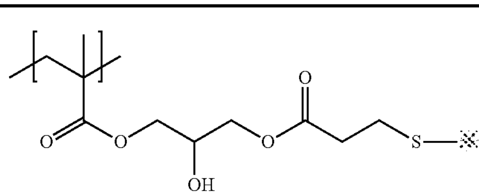 | 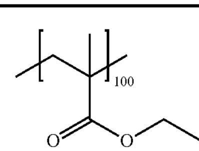 | 65 | 8.5 | 3600 |

TABLE 6-continued

| | Structure of repeating unit having graft chain ("*" represents a linking site with the graft chain) | Graft chain: Structure of graft chain (numerical value added to the repeating unit is a number representing mass %)) | Graft chain: Tg (° C.) | Graft chain: Hansen solubility parameter ((cal/cm$^3$)$^{0.5}$) | Graft chain: Mw |
|---|---|---|---|---|---|
| a2-2 | 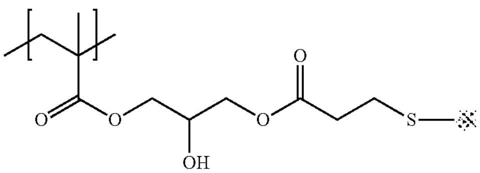 | 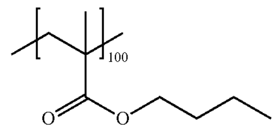 | 20 | 8.32 | 3800 |
| a2-3 | 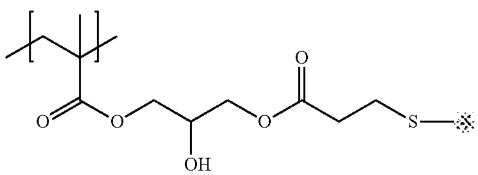 | 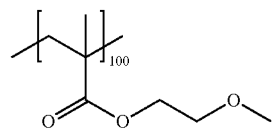 | 20 | 8.89 | 3900 |
| a2-4 | 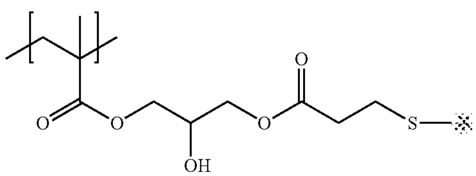 | 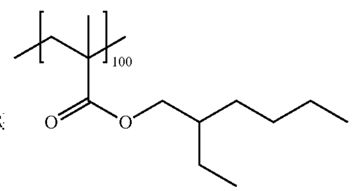 | −10 | 8.06 | 4000 |
| a2-5 | 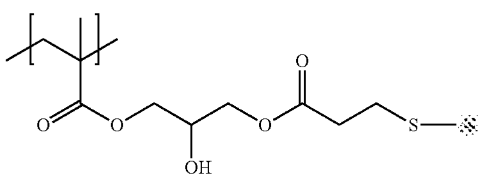 | 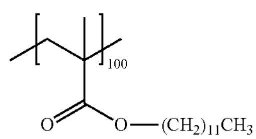 | −65 | 7.71 | 4200 |

TABLE 7

| | Structure of repeating unit having graft chain ("*" represents a linking site with the graft chain) | Graft chain: Structure of graft chain (numerical value added to the repeating unit is a number representing mass %) | Graft chain: Tg (° C.) | Graft chain: Hansen solubility parameter ((cal/cm$^3$)$^{0.5}$) | Graft chain: Mw |
|---|---|---|---|---|---|
| a2-6 | 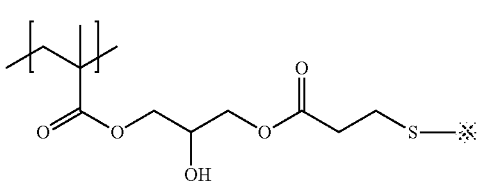 | 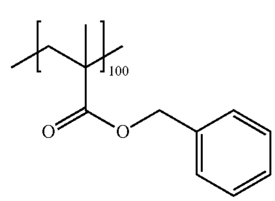 | 54 | 9.17 | 4000 |
| a2-7 | 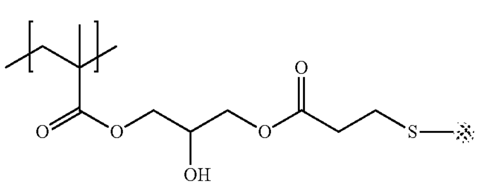 | 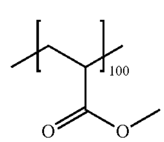 | 10 | 9.07 | 3200 |

TABLE 7-continued

| | Structure of repeating unit having graft chain ("*" represents a linking site with the graft chain) | Graft chain: Structure of graft chain (numerical value added to the repeating unit is a number representing mass %) | Graft chain: Tg (° C.) | Graft chain: Hansen solubility parameter ((cal/cm$^3$)$^{0.5}$) | Graft chain: Mw |
|---|---|---|---|---|---|
| a2-8 | 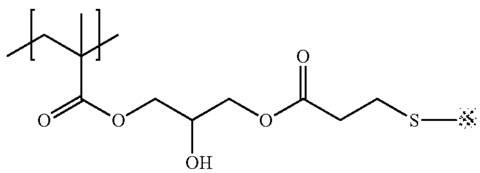 | 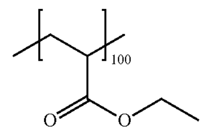 | −24 | 8.73 | 3300 |
| a2-9 | 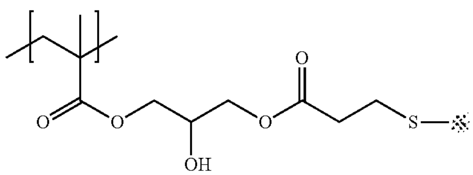 | 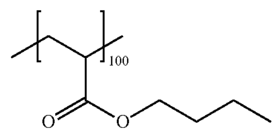 | −54 | 8.48 | 3800 |
| a2-10 | 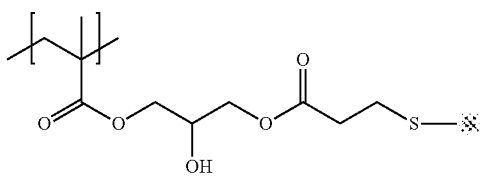 | 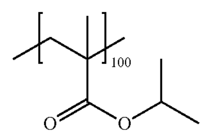 | 81 | 8.17 | 3800 |

TABLE 8

| | Structure of repeating unit having graft chain ("*" represents a linking site with the graft chain) | Graft chain: Structure of graft chain (numerical value added to the repeating unit is a number representing mass %) | Graft chain: Tg (° C.) | Graft chain: Hansen solubility parameter ((cal/cm$^3$)$^{0.5}$) | Graft chain: Mw |
|---|---|---|---|---|---|
| a2-11 | 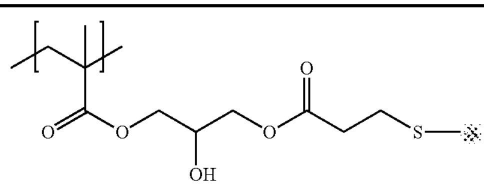 | 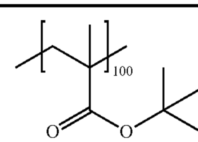 | 118 | 7.81 | 3800 |
| a2-12 | 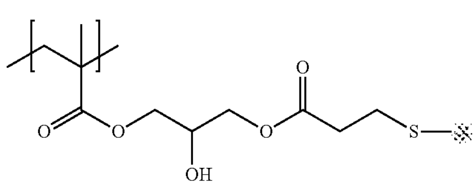 | 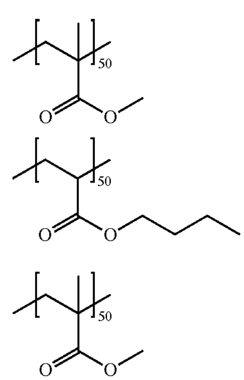 | 25.5 | 8.61 | 3600 |
| a2-13 | 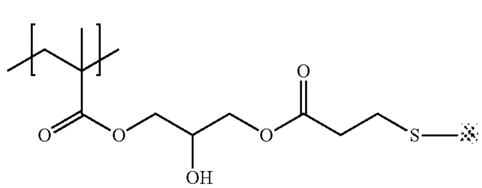 | 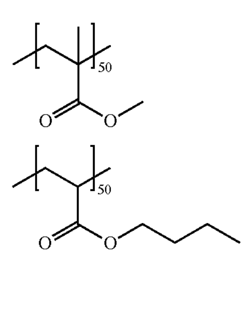 | 25.5 | 8.61 | 7200 |

TABLE 8-continued

| | | Graft chain | | | |
|---|---|---|---|---|---|
| | Structure of repeating unit having graft chain ("*" represents a linking site with the graft chain) | Structure of graft chain (numerical value added to the repeating unit is a number representing mass %) | Tg (° C.) | Hansen solubility parameter ((cal/cm$^3$)$^{0.5}$) | Mw |
| a2-14 | 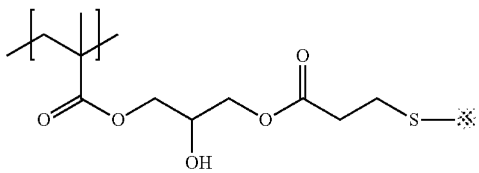 | 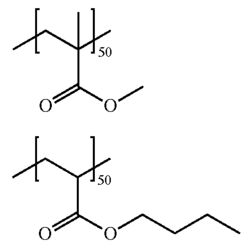 | 25.5 | 8.61 | 12000 |
| a2-15 | 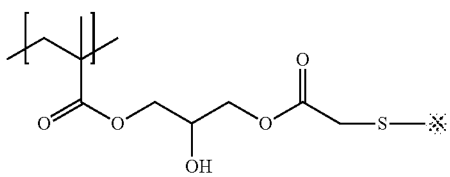 | 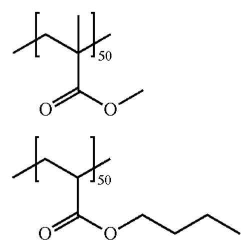 | 25.5 | 8.61 | 3500 |

TABLE 9

| | | Graft chain | | | |
|---|---|---|---|---|---|
| | Structure of repeating unit having graft chain ("*" represents a linking site with the graft chain) | Structure of graft chain (numerical value added to the repeating unit is a number representing mass %) | Tg (° C.) | Hansen solubility parameter ((cal/cm$^3$)$^{0.5}$) | Mw |
| a2-16 | 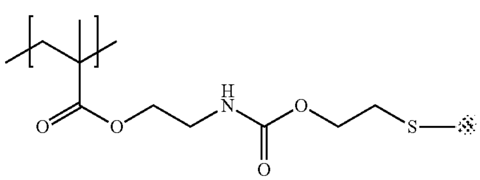 | 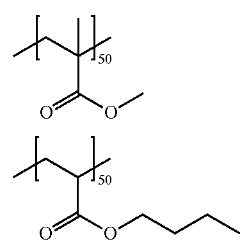 | 25.5 | 8.61 | 3500 |
| a2-17 | 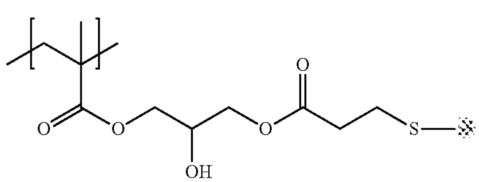 | 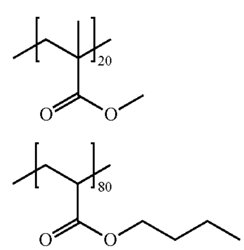 | −22 | 8.53 | 3700 |

TABLE 9-continued

| | Structure of repeating unit having graft chain ("*" represents a linking site with the graft chain) | Graft chain: Structure of graft chain (numerical value added to the repeating unit is a number representing mass %) | Graft chain: Tg (° C.) | Graft chain: Hansen solubility parameter ((cal/cm$^3$)$^{0.5}$) | Graft chain: Mw |
|---|---|---|---|---|---|
| a2-18 | 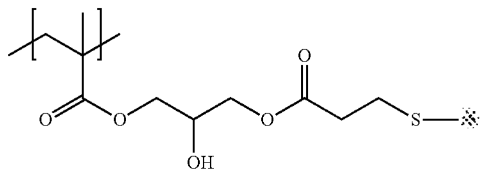 | 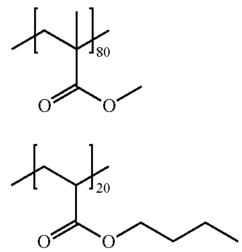 | 73 | 8.69 | 3600 |
| a2-19 | 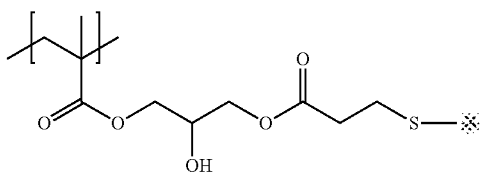 | 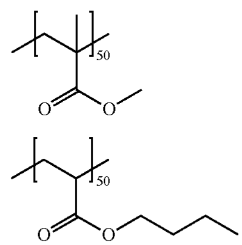 | 5.5 | 8.49 | 3700 |
| a2-20 | 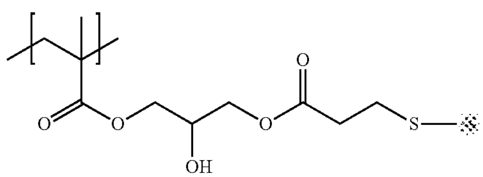 | 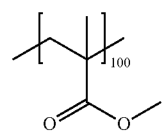 | 105 | 8.74 | 3300 |

TABLE 10

| | Structure of repeating unit having graft chain ("*" represents a linking site with the graft chain) | Graft chain: Structure of graft chain (numerical value added to the repeating unit is a number representing mass %) | Graft chain: Tg (° C.) | Graft chain: Hansen solubility parameter ((cal/cm$^3$)$^{0.5}$) | Graft chain: Mw |
|---|---|---|---|---|---|
| a2-21 | 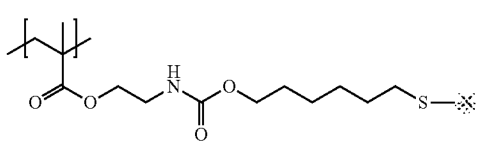 | 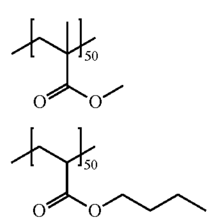 | 25.5 | 8.61 | 3400 |
| a2-22 | 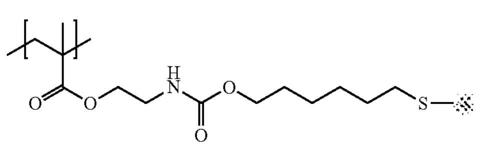 | 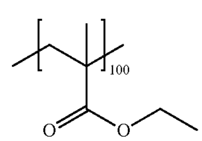 | 65 | 8.5 | 3500 |

TABLE 10-continued

| | Structure of repeating unit having graft chain ("※" represents a linking site with the graft chain) | Graft chain: Structure of graft chain (numerical value added to the repeating unit is a number representing mass %) | Graft chain: Tg (° C.) | Graft chain: Hansen solubility parameter ((cal/cm$^3$)$^{0.5}$) | Graft chain: Mw |
|---|---|---|---|---|---|
| a2-23 | 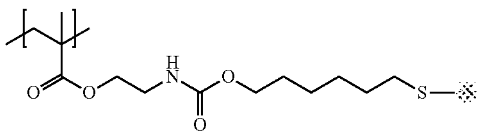 | 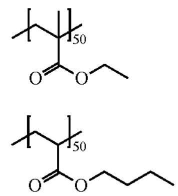 | 5.5 | 8.49 | 3550 |
| a2-24 | 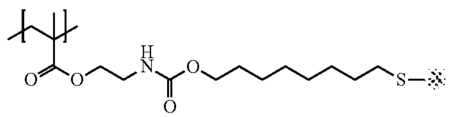 | 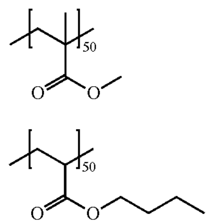 | 25.5 | 8.61 | 3450 |
| a2-25 | 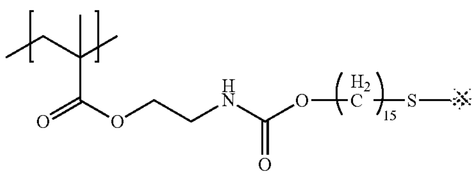 | 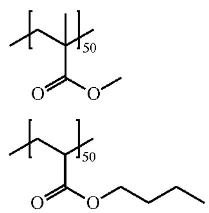 | 25.5 | 8.61 | 3450 |

The glass transition temperature (Tg) of the graft chain is a value calculated using a glass transition temperature of a homopolymer of the monomer corresponding to the repeating unit of the graft chain. As the value of the glass transition temperature of the homopolymer, the value of the glass transition temperature of the homopolymer described in Polymer Handbook (Wiley-Interscience) was used. Specifically, in a case where the graft chain was a homopolymer, the value of the glass transition temperature of the homopolymer described in Polymer Handbook (Wiley-Interscience) was used. In addition, in a case where the graft chain was a copolymer, the sum of values obtained by multiplying the value of each glass transition temperature of the homopolymer of the monomer which corresponded to each repeating unit of the copolymer by the mass ratio of each repeating unit of the copolymer was used.

The Hansen solubility parameter of the graft chain was obtained from the following expression (H-1) by calculating London dispersion force element (δD), molecular polarization element (dipole-dipole force element) (δP), and hydrogen bond element (δH) of the monomer corresponding to the repeating unit of the graft chain using Hansen Solubility Parameters in Practice (HSPiP), ver. 4.1.07, which is a program developed by Dr. Hansen's group proposed the Hansen solubility parameter. In addition, in a case where the graft chain was a copolymer, the sum of values obtained by multiplying the value of Hansen solubility parameter of the monomer which corresponded to each repeating unit of the copolymer by the mass ratio of each repeating unit of the copolymer was used.

$$\delta^2=(\delta D)^2+(\delta P)^2+(\delta H)^2 \quad \text{(H-1)}$$

δ: Hansen solubility parameter

δD: London dispersion force element

δP: molecular polarization element (dipole-dipole force element)

δH: hydrogen bond element

The weight-average molecular weight (Mw) of the graft chain was calculated by measuring Mw of the macromonomer used in the synthesis by gel permeation chromatography (GPC).

(Other Repeating Units)

a3-1 to a3-5: repeating units having the following structures (a3-1)

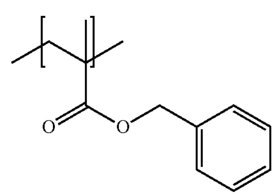

(a3-2)

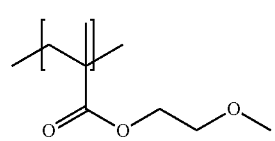

-continued (a3-3)

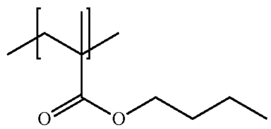

(a3-4)

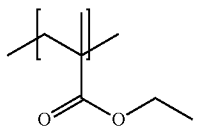

(a3-5)

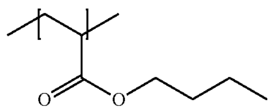

Comparative dispersant 2: into a reaction vessel equipped with a gas introduction tube, a thermometer, a condenser, and a stirrer, 62.6 parts by mass of 1-dodecanol, 287.4 parts by mass of ε-caprolactone, and 0.1 parts by mass of monobutyltin(IV) oxide as a catalyst were charged, and after replacement with nitrogen gas, the mixture was heated at 120° C. for 4 hours. After confirming that 98% thereof had reacted by solid content measurement, 36.6 parts by mass of pyromellitic anhydride was added thereto, and the reaction was performed at 120° C. for 2 hours. It was confirmed by acid value measurement that 98% or more of the acid anhydride was half-esterified, and the reaction was terminated. The acid value of the obtained reactant (resin) was 49 mgKOH/g, and the weight-average molecular weight (Mw) thereof was 7000. PGMEA was added to this reactant to adjust non-volatile content (concentration of solid contents) to 30 mass %, thereby obtaining a comparative dispersant 2.

Comparative dispersant 3: 30 mass % PGMEA solution of a resin having the following structure (a numerical value added to a main chain represents a mass ratio; Mw=15000, acid value=97 mgKOH/g)

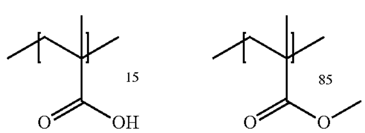

Resin D1: resin having the following structure (the numerical value described together with the main chain indicates a molar ratio, Mw=11000)

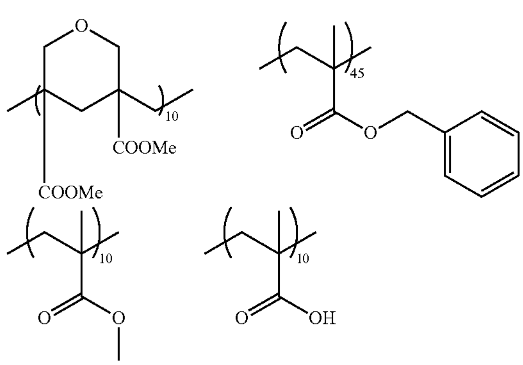

-continued

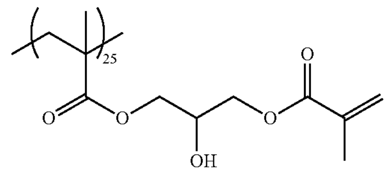

(Solvent)

PGMEA: propylene glycol monomethyl ether acetate

PGME: propylene glycol monomethyl ether

The average particle diameters of the pigments in the dispersion liquids G1, G2, G12, G18, G22, G23, G28, and G29 were measured on a volume basis using MICROTRACUPA 150 manufactured by Nikkiso Co., Ltd. The measurement results are shown below. The value of the average particle diameter of the pigment is a value at the secondary particle diameter measured by a dynamic light scattering method.

TABLE 11

| Dispersion liquid | Average particle diameter (nm) |
|---|---|
| Dispersion liquid G1 | 64 |
| Dispersion liquid G2 | 66 |
| Dispersion liquid G12 | 65 |
| Dispersion liquid G18 | 58 |
| Dispersion liquid G22 | 52 |
| Dispersion liquid G23 | 68 |
| Dispersion liquid G28 | 52 |
| Dispersion liquid G29 | 70 |

<Production of Curable Composition>

Examples 1 to 48 and Comparative Examples 1 to 3

The following raw materials were mixed to prepare a curable composition.

Dispersion liquid of the types shown in the following tables . . . 39.4 parts by mass Resin D1 . . . 0.58 parts by mass Polymerizable compound E1 . . . 0.54 parts by mass Photopolymerization initiator F3 . . . 0.33 parts by mass Surfactant H1 . . . 4.17 parts by mass p-methoxyphenol . . . 0.0006 parts by mass Propylene glycol monomethyl ether acetate (PGMEA) . . . 7.66 parts by mass Details of the materials indicated by the above abbreviations are as follows.

Resin D1: resin D1 described above

Polymerizable compound E1: KAYARAD DPHA (manufactured by Nippon Kayaku Co., Ltd.)

Photopolymerization initiator F3: compound having the following structure

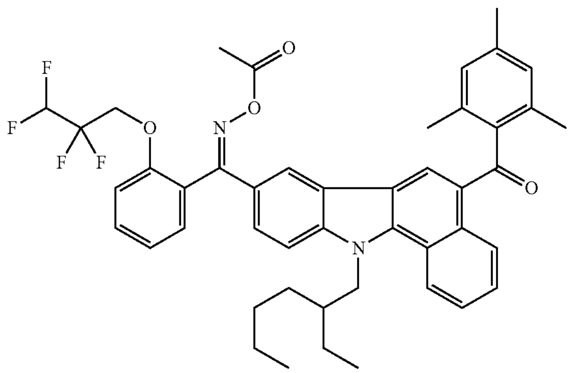 [SMILES: CCCCC(CC)Cn1c2ccc(/C(=N\OC(C)=O)c3ccccc3OCC(F)(F)C(F)F)cc2c2cc(C(=O)c3c(C)cc(C)cc3C)c3ccccc3c21]

Surfactant H1: 1 mass % PGMEA solution of the following mixture (Mw=14000; in the following formula, "%" representing the proportion of a repeating unit is mol %)

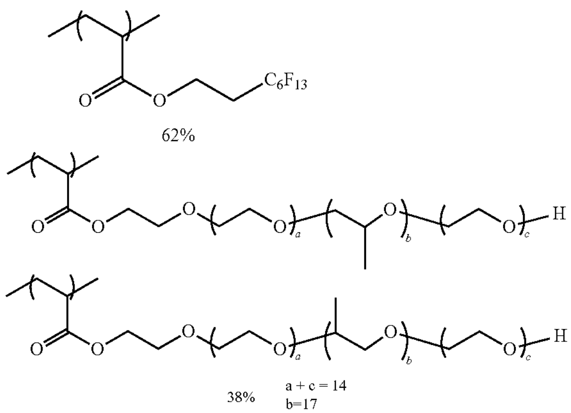

<Storage Stability>

An initial viscosity (V0) of the curable composition obtained above was measured with "RE-85L" manufactured by TOKI SANGYO CO., LTD. Next, the curable composition was allowed to stand at 45° C. for 3 days, and then a viscosity (V1) after standing was measured. The viscosity increase rate (%) of the curable composition after standing was calculated from the following expression, and the storage stability was evaluated according to the following evaluation standard. It can be said that the smaller the numerical value of the viscosity increase rate (%), the better the storage stability. The viscosity of the curable composition was measured in a state in which the temperature was adjusted to 25° C.

$$\text{Viscosity increase rate (\%)} = \{(\text{Viscosity}(V1)\text{ after standing} - \text{Initial viscosity}(V0))/\text{Initial viscosity}(V0)\} \times 100$$

A: $0 \le$ viscosity increase rate $\le 3\%$
B: $3\% <$ viscosity increase rate $\le 5\%$
C: $5\% <$ viscosity increase rate $\le 10\%$
D: $10\% <$ viscosity increase rate $\le 15\%$
E: $15\% <$ viscosity increase rate <Moisture Resistance>

Each curable composition was applied to a silicon wafer using a spin coater such that the film thickness after pre-baking was 0.7 μm, and a heating treatment (pre-baking) was performed for 120 seconds using a hot plate at 100° C. Next, using an i-ray stepper exposure device FPA-3000 i5+(manufactured by Canon Inc.), the silicon wafer was irradiated with light having a wavelength of 365 nm to perform exposure thereon with an exposure dose of 500 mJ/cm$^2$. Next, a heating treatment (post-baking) was performed for 300 seconds using a hot plate at 220° C., thereby forming a film. The obtained film was subjected to a moisture resistance test for 250 hours under conditions of a temperature of 130° C. and a humidity of 85% using a moisture resistance tester (HASTEST MODEL304R$^8$, manufactured by HIRAYAMA), and then the film thickness after the moisture resistance test was measured.

In a case where [Film thickness after moisture resistance test]/[Film thickness before moisture resistance test]=X, the moisture resistance was evaluated according to the following standard.

A: $X \ge 0.95$
B: $0.9 \le X < 0.95$
C: $0.8 \le X < 0.9$
D: $0.7 \le X < 0.8$
E: $X < 0.7$

<Adhesiveness>

CT-4000 (manufactured by Fujifilm Electronic Materials Co., Ltd.) was applied to a silicon wafer by a spin coating method so that the thickness of a film was 0.1 μm, and the silicon wafer was heated at 220° C. for 1 hour using a hot plate to form a base layer. Each curable composition was applied to this silicon wafer with a base layer using a spin coating method, and then the silicon wafer with a base layer was heated at 100° C. for 2 minutes using a hot plate to obtain a composition layer having a film thickness of 0.5 μm. Using an i-ray stepper FPA-3000 i5+(manufactured by Canon Inc.), the composition layer was irradiated with light having a wavelength of 365 nm through a mask pattern in which each of the square pixels with a side length of 1.1 μm was arranged on the substrate in a region of 4 mm×3 mm to perform exposure thereon with an exposure dose of 500 mJ/cm$^2$. The composition layer after exposure was subjected to puddle development for 60 seconds at 23° C. using a 0.3 mass % of aqueous solution of tetramethylammonium hydroxide. Next, the composition layer was rinsed by spin showering with water and was cleaned with pure water. Thereafter, water droplets were splashed by high-pressure air, and the silicon wafer was naturally dried. Next, post-baking was performed for 300 seconds at 220° C. using a hot plate to form a pattern. The obtained pattern was observed using an optical microscope, and among all patterns, patterns closely attached with each other were counted to evaluate the adhesiveness.

A: all patterns were closely attached with each other.
B: patterns closely attached with each other were 95% or more and less than 100% of all patterns.
C: patterns closely attached with each other were 90% or more and less than 95% of all patterns.
D: patterns closely attached with each other were 85% or more and less than 90% of all patterns.
E: patterns closely attached with each other were less than 85% of all patterns.

<Developability>

CT-4000 (manufactured by Fujifilm Electronic Materials Co., Ltd.) was applied to a silicon wafer by a spin coating method so that the thickness of a film was 0.1 μm, and the silicon wafer was heated at 220° C. for 1 hour using a hot plate to form a base layer. Each curable composition was applied to this silicon wafer with a base layer using a spin coating method, and then the silicon wafer with a base layer was heated at 100° C. for 2 minutes using a hot plate to obtain a composition layer having a film thickness of 1 μm. Using an i-ray stepper FPA-3000 i5+(manufactured by Canon Inc.), the composition layer was irradiated with light having a wavelength of 365 nm through a mask pattern in which each of the square pixels with a side length of 1.1 μm was arranged on the substrate in a region of 4 mm×3 mm to perform exposure thereon with an exposure dose of 200 mJ/cm$^2$. The composition layer after exposure was subjected to puddle development for 60 seconds at 23° C. using a 0.3 mass % of aqueous solution of tetramethylammonium hydroxide. Next, the composition layer was rinsed by spin showering with water and was cleaned with pure water. Thereafter, water droplets were splashed by high-pressure air, and the silicon wafer was naturally dried. Next, post-baking was performed for 300 seconds at 200° C. using a hot plate to form a pattern. The presence or absence of residues between the patterns was observed to evaluate the developability.

The area (unexposed area) other than the pattern formation area was observed with a scanning electron microscope (SEM) (magnification: 10,000 times), the number of residues having a diameter of 0.1 μm or more per an area (one area) of 5 μm×5 μm of the unexposed area was counted, and the residue was evaluated according to the following evaluation standard.

A: there was no residue per one area.

B: the number of residues per one area was less than 10.

C: the number of residues per one area was 10 or more and less than 20.

D: the number of residues per one area was 20 or more and less than 30.

E: the number of residues per one area was 30 or more and less than 100.

F: development was not possible at all.

TABLE 12

| | Type of dispersion liquid | Storage stability | Moisture resistance | Adhesiveness | Developability |
|---|---|---|---|---|---|
| Example 1 | Dispersion liquid G1 | B | A | A | C |
| Example 2 | Dispersion liquid G2 | B | A | A | A |
| Example 3 | Dispersion liquid G3 | B | A | A | A |
| Example 4 | Dispersion liquid G4 | C | A | B | A |
| Example 5 | Dispersion liquid G5 | C | A | C | A |
| Example 6 | Dispersion liquid G6 | C | A | A | B |
| Example 7 | Dispersion liquid G7 | B | A | B | A |
| Example 8 | Dispersion liquid G8 | B | A | B | A |
| Example 9 | Dispersion liquid G9 | B | A | C | A |
| Example 10 | Dispersion liquid G10 | C | A | A | D |
| Example 11 | Dispersion liquid G11 | C | A | A | D |
| Example 12 | Dispersion liquid G12 | B | A | A | A |
| Example 13 | Dispersion liquid G13 | B | B | A | A |
| Example 14 | Dispersion liquid G14 | C | B | A | A |
| Example 15 | Dispersion liquid G15 | C | B | A | A |
| Example 16 | Dispersion liquid G16 | B | A | A | A |
| Example 17 | Dispersion liquid G17 | B | B | A | A |
| Example 18 | Dispersion liquid G18 | A | A | A | A |
| Example 19 | Dispersion liquid G19 | A | A | A | A |
| Example 20 | Dispersion liquid G20 | A | A | A | A |
| Example 21 | Dispersion liquid G21 | B | A | A | A |
| Example 22 | Dispersion liquid G22 | A | A | A | B |
| Example 23 | Dispersion liquid G23 | B | A | A | A |
| Example 24 | Dispersion liquid G24 | A | A | A | A |
| Example 25 | Dispersion liquid G25 | A | A | A | A |
| Example 26 | Dispersion liquid G26 | A | A | A | A |
| Example 27 | Dispersion liquid G27 | A | A | A | A |
| Example 28 | Dispersion liquid G28 | A | A | A | A |
| Example 29 | Dispersion liquid G29 | B | A | A | B |
| Example 30 | Dispersion liquid G30 | B | A | A | A |

TABLE 13

| | Type of dispersion liquid | Storage stability | Moisture resistance | Adhesiveness | Developability |
|---|---|---|---|---|---|
| Example 31 | Dispersion liquid G31 | B | A | A | A |
| Example 32 | Dispersion liquid G32 | B | A | B | A |
| Example 33 | Dispersion liquid G33 | A | A | B | A |
| Example 34 | Dispersion liquid G34 | B | A | A | C |
| Example 35 | Dispersion liquid G35 | B | A | A | B |
| Example 36 | Dispersion liquid G36 | B | A | A | A |
| Example 37 | Dispersion liquid G37 | B | B | A | A |
| Example 38 | Dispersion liquid G38 | C | B | A | A |
| Example 39 | Dispersion liquid G39 | C | B | A | A |
| Example 40 | Dispersion liquid G40 | B | A | A | A |
| Example 41 | Dispersion liquid G41 | B | B | A | A |
| Example 42 | Dispersion liquid G42 | A | A | A | A |

TABLE 13-continued

| | Type of dispersion liquid | Storage stability | Moisture resistance | Adhesiveness | Developability |
|---|---|---|---|---|---|
| Example 43 | Dispersion liquid G43 | A | A | A | A |
| Example 44 | Dispersion liquid G44 | A | A | A | A |
| Example 45 | Dispersion liquid G45 | A | A | A | A |
| Example 46 | Dispersion liquid G46 | A | A | A | A |
| Example 47 | Dispersion liquid G47 | A | A | A | A |
| Example 48 | Dispersion liquid G48 | A | A | A | A |
| Comparative example 1 | Comparative dispersion liquid 1 | D | C | B | F |
| Comparative example 2 | Comparative dispersion liquid 2 | C | E | B | D |
| Comparative example 3 | Comparative dispersion liquid 3 | Not dispersed | | | |

As shown in the above tables, the curable compositions of Examples a goo evaluations of storage stability, moisture resistance, and developability.

In addition, with regard to the curable compositions of Examples 18 and 42 to 48, in a case where the curable compositions were allowed to stand at 45° C. for 7 days, and then a viscosity (V2) after standing was measured to calculate the viscosity increase rate, the viscosity increase rate of Examples 42 to 48 was 3% or less. In addition, the viscosity increase rate of Examples 42 to 48 was lower than that of Example 18.

Test Example 2

<Production of Dispersion Liquid>

(Dispersion Liquids G51 to G54)

A dispersion liquid G51 (dispersant used was a dispersant 46), a dispersion liquid G52 (dispersant used was a dispersant 47), a dispersion liquid G53 (dispersant used was a dispersant 48), and a dispersion liquid G54 (dispersant used was a dispersant 49) were respectively produced in the same manner as in the dispersion liquid G1, except that the dispersants 46 to 49 were used instead of the dispersant 1 of the dispersion liquid G1.

As the dispersants 46 to 49, a 30 mass % PGMEA solution of each resin synthesized by the following methods was used.

[Dispersant 46]

94.4 parts by mass of the 40 mass % PGMEA solution of the macromonomer B synthesized above, 14.6 parts by mass of methacrylic acid, 22.9 parts by mass of benzyl methacrylate, and 137 parts by mass of PGMEA were charged into a three-neck flask, the temperature of the mixture was increased to 75° C. while flowing nitrogen into the flask. 2.02 parts by mass of dodecyl mercaptan and 0.383 parts by mass of V-601 were further added thereto, and the mixture was heated at the same temperature for 2 hours. After further adding 0.383 parts by mass of V-601, the mixture was heated at the same temperature for 2 hours. After further adding 0.383 parts by mass of V-601, the mixture was heated at 90° C. for 3 hours. The polymerization reaction was terminated by the above operation. After terminating the reaction, 1.56 parts by mass of dimethyldodecylamine as an amine compound and 0.0450 parts by mass of 2,2,6,6-tetramethylpiperidine 1-oxyl (TEMPO) as a polymerization inhibitor were added thereto under air, and 11.9 parts by mass of 4-hydroxybutyl acrylate glycidyl ether as a reactive compound was added dropwise thereto. After dropwise addition, the mixture was heated in air at 90° C. for 24 hours to synthesize a resin. The completion of the reaction was confirmed by acid value measurement. PGMEA was added to the obtained resin to adjust the concentration of solid contents to 30 mass %, thereby obtaining a dispersant 46 (30 mass % PGMEA solution). The weight-average molecular weight of the obtained resin was 19000, and the acid value thereof was 72 mgKOH/g.

[Dispersant 47]

94.4 parts by mass of the 40 mass % PGMEA solution of the macromonomer B synthesized above, 14.6 parts by mass of methacrylic acid, 22.9 parts by mass of benzyl methacrylate, and 127 parts by mass of PGMEA were charged into a three-neck flask, the temperature of the mixture was increased to 75° C. while flowing nitrogen into the flask. 2.02 parts by mass of dodecyl mercaptan and 0.383 parts by mass of V-601 were further added thereto, and the mixture was heated at the same temperature for 2 hours. After further adding 0.383 parts by mass of V-601, the mixture was heated at the same temperature for 2 hours. After further adding 0.383 parts by mass of V-601, the mixture was heated at 90° C. for 3 hours. The polymerization reaction was terminated by the above operation. After terminating the reaction, 1.56 parts by mass of dimethyldodecylamine as an amine compound and 0.0450 parts by mass of 2,2,6,6,-tetramethylpiperidine 1-oxyl (TEMPO) as a polymerization inhibitor were added thereto under air, and 8.45 parts by mass of GMA as a reactive compound was added dropwise thereto. After dropwise addition, the mixture was heated in air at 90° C. for 24 hours to synthesize a resin. The completion of the reaction was confirmed by acid value measurement. PGMEA was added to the obtained resin to adjust the concentration of solid contents to 30 mass %, thereby obtaining a dispersant 47 (30 mass % PGMEA solution). The weight-average molecular weight of the obtained resin was 19000, and the acid value thereof was 74 mgKOH/g.

[Dispersant 48]

94.4 parts by mass of the 40 mass % PGMEA solution of the macromonomer B synthesized above, 14.6 parts by mass of methacrylic acid, 22.9 parts by mass of benzyl methacrylate, and 137 parts by mass of PGMEA were charged into a three-neck flask, the temperature of the mixture was increased to 75° C. while flowing nitrogen into the flask. 2.02 parts by mass of dodecyl mercaptan and 0.383 parts by mass of V-601 were further added thereto, and the mixture was heated at the same temperature for 2 hours. After further adding 0.383 parts by mass of V-601, the mixture was heated at the same temperature for 2 hours. After further adding 0.383 parts by mass of V-601, the mixture was heated at 90° C. for 3 hours. The polymerization reaction was terminated by the above operation. After terminating the reaction, 1.56 parts by mass of dimethyldodecylamine as an amine compound and 0.0450 parts by mass of 2,2,6,6,-tetramethylpiperidine 1-oxyl (TEMPO) as a polymerization inhibitor were added thereto under air, and 9.07 parts by mass of 4-chloromethylstyrene as a reactive compound was added dropwise thereto. After dropwise addition, the mixture was heated in air at 90° C. for 24 hours to synthesize a resin. The completion of the reaction was confirmed by acid value measurement. PGMEA was added to the obtained resin to adjust the concentration of solid contents to 30 mass %, thereby obtaining a dispersant 48 (30 mass % PGMEA solution). The weight-average molecular weight of the obtained resin was 19000, and the acid value thereof was 74 mgKOH/g.

[Dispersant 49]

94.4 parts by mass of the 40 mass % PGMEA solution of the macromonomer C synthesized above, 14.6 parts by mass of methacrylic acid, 22.9 parts by mass of benzyl methacrylate, and 137 parts by mass of PGMEA were charged into a three-neck flask, the temperature of the mixture was increased to 75° C. while flowing nitrogen into the flask. 2.02 parts by mass of dodecyl mercaptan and 0.383 parts by mass of V-601 were further added thereto, and the mixture was heated at the same temperature for 2 hours. After further adding 0.383 parts by mass of V-601, the mixture was heated at the same temperature for 2 hours. After further adding 0.383 parts by mass of V-601, the mixture was heated at 90° C. for 3 hours. The polymerization reaction was terminated by the above operation. After terminating the reaction, 1.56 parts by mass of dimethyldodecylamine as an amine compound and 0.0450 parts by mass of 2,2,6,6,-tetramethylpiperidine 1-oxyl (TEMPO) as a polymerization inhibitor were added thereto under air, and 11.9 parts by mass of 4-hydroxybutyl acrylate glycidyl ether as a reactive compound was added dropwise thereto. After dropwise addition, the mixture was heated in air at 90° C. for 24 hours to synthesize a resin. The completion of the reaction was confirmed by acid value measurement. PGMEA was added to the obtained resin to adjust the concentration of solid contents to 30 mass %, thereby obtaining a dispersant 49 (30 mass % PGMEA solution). The weight-average molecular weight of the obtained resin was 19000, and the acid value thereof was 72 mgKOH/g.

<Preparation and Evaluation of Curable Composition>

A curable composition of Example 51 (dispersion liquid used was the dispersion liquid G51), a curable composition of Example 52 (dispersion liquid used was the dispersion liquid G52), a curable composition of Example 53 (dispersion liquid used was the dispersion liquid G53), and a curable composition of Example 54 (dispersion liquid used was the dispersion liquid G54) were respectively produced in the same manner as in Example 1, except that, in the preparation of the curable composition of Example 1, the dispersion liquids G51 to G54 were used instead of the dispersion liquid G1. The storage stability, moisture resistance, adhesiveness, and developability of the obtained curable compositions were evaluated in the same method as in Test Example 1. Examples 51 to 53 had the same results as in Example 42. In addition, Example 54 had the same results as in Example 45.

Test Example 3

<Production of Dispersion Liquid>

(Dispersion Liquids G101 to G117)

230 parts by mass of zirconia beads having a diameter of 0.3 mm were added to a mixed solution obtained by mixing the type of G pigment listed in the table below in an amount of parts by mass described in the table below, the type of Y pigment listed in the table below in an amount of parts by mass described in the table below, the type of pigment derivative listed in the table below in an amount of parts by mass described in the table below, 18.7 parts by mass (equivalent to 5.61 parts by mass of solid content) of the above-described dispersant 16, and 67.3 parts by mass of propylene glycol monomethyl ether acetate as a solvent were mixed, the mixture was subjected to a dispersion treatment for 5 hours using a paint shaker, and the beads were separated by filtration to produce a dispersion liquid.

TABLE 14

| | G pigment | | | | | | Y pigment | | |
|---|---|---|---|---|---|---|---|---|---|
| | PG36 | PG58 | PG7 | PG59 | PG62 | PG63 | PY139 | PY150 | PY185 |
| Dispersion liquid G101 | 8.75 | | | | | | 3.85 | | |
| Dispersion liquid G102 | 8.75 | | | | | | | 3.85 | |
| Dispersion liquid G103 | 8.75 | | | | | | | | 3.85 |
| Dispersion liquid G104 | 8.75 | | | | | | | | 3.85 |
| Dispersion liquid G105 | 8.75 | | | | | | | | |
| Dispersion liquid G106 | 8.75 | | | | | | | | |
| Dispersion liquid G107 | 8.75 | | | | | | | | |
| Dispersion liquid G108 | | 8.75 | | | | | 3.85 | | |
| Dispersion liquid G109 | | 8.75 | | | | | | 3.85 | |
| Dispersion liquid G110 | | 8.75 | | | | | | | 3.85 |
| Dispersion liquid G111 | | | 8.75 | | | | | | 3.85 |
| Dispersion liquid G112 | | | | 8.75 | | | | | 3.85 |
| Dispersion liquid G113 | | | | | 8.75 | | | | 3.85 |
| Dispersion liquid G114 | | | | | | 8.75 | | | 3.85 |
| Dispersion liquid G115 | 4.65 | 4.15 | | | | | | | 3.85 |
| Dispersion liquid G116 | 8.75 | | | | | | | 1.3 | 2.55 |
| Dispersion liquid G117 | 4.65 | 4.15 | | | | | 0.65 | 0.65 | 2.55 |

TABLE 14-continued

| | Y pigment | | | Pigment derivative | | |
|---|---|---|---|---|---|---|
| | PY138 | PY231 | PY233 | Derivative 1 | Derivative 2 | Derivative 3 |
| Dispersion liquid G101 | | | | 1.4 | | |
| Dispersion liquid G102 | | | | 1.4 | | |
| Dispersion liquid G103 | | | | | 1.4 | |
| Dispersion liquid G104 | | | | | | 1.4 |
| Dispersion liquid G105 | 3.85 | | | 1.4 | | |
| Dispersion liquid G106 | | 3.85 | | 1.4 | | |
| Dispersion liquid G107 | | | 3.85 | 1.4 | | |
| Dispersion liquid G108 | | | | 1.4 | | |
| Dispersion liquid G109 | | | | 1.4 | | |
| Dispersion liquid G110 | | | | 1.4 | | |
| Dispersion liquid G111 | | | | 1.4 | | |
| Dispersion liquid G112 | | | | 1.4 | | |
| Dispersion liquid G113 | | | | 1.4 | | |
| Dispersion liquid G114 | | | | 1.4 | | |
| Dispersion liquid G115 | | | | 1.4 | | |
| Dispersion liquid G116 | | | | 1.4 | | |
| Dispersion liquid G117 | | | | 1.4 | | |

The raw materials indicated by abbreviations shown in the above tables are as follows.

(G Pigment)

PG36: C. I. Pigment Green 36

PG58: C. I. Pigment Green 58

PG7: C. I. Pigment Green 7

PG59: C. I. Pigment Green 59

PG62: C. I. Pigment Green 62

PG63: C. I. Pigment Green 63

(Y pigment)

PY139: C. I. Pigment Yellow 139

PY150: C. I. Pigment Yellow 150

PY185: C. I. Pigment Yellow 185

PY138: C. I. Pigment Yellow 138

PY231: C. I. Pigment Yellow 231

PY233: C. I. Pigment Yellow 233

(Pigment Derivative)

Derivatives 1 to 3: compounds having the following structure (in the following structural formulae, Me represents a methyl group and Et represents an ethyl group)

Derivative 1

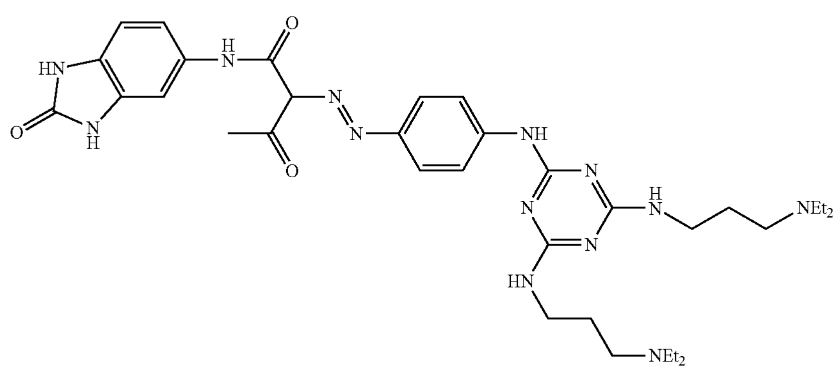

Derivative 2

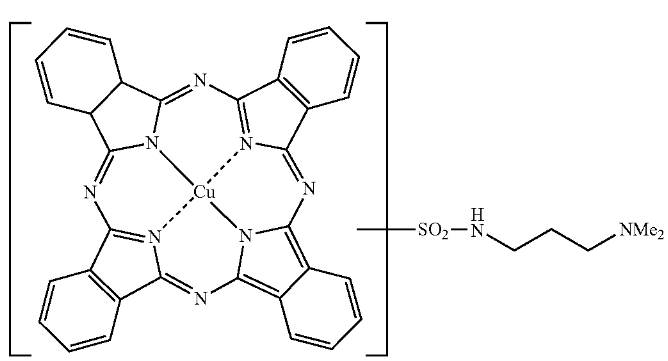

-continued

Derivative 3

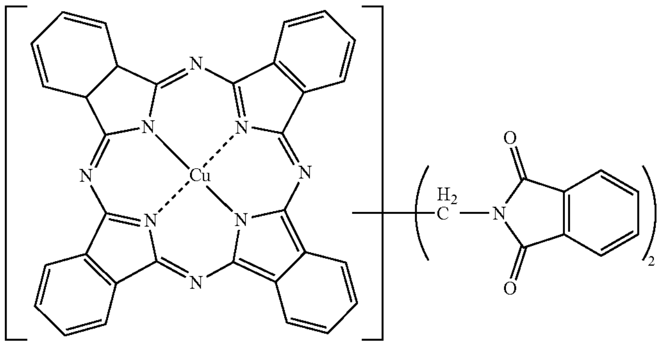

<Preparation and Evaluation of Curable Composition>

Curable compositions were prepared in the same manner as in Example 1, except that, in the preparation of the curable composition of Example 1, the dispersion liquids G101 to G117 (Examples 101 to 117) were used instead of the dispersion liquid G1. The storage stability, moisture resistance, adhesiveness, and developability of the obtained curable compositions were evaluated in the same method as in Test Example 1.

TABLE 15

| | Type of dispersion liquid | Storage stability | Moisture resistance | Adhesiveness | Developability |
|---|---|---|---|---|---|
| Example 101 | Dispersion liquid G101 | A | A | A | A |
| Example 102 | Dispersion liquid G102 | A | A | A | A |
| Example 103 | Dispersion liquid G103 | A | A | A | A |
| Example 104 | Dispersion liquid G104 | A | A | A | A |
| Example 105 | Dispersion liquid G105 | A | A | A | A |
| Example 106 | Dispersion liquid G106 | A | A | A | A |
| Example 107 | Dispersion liquid G107 | A | A | A | A |
| Example 108 | Dispersion liquid G108 | B | A | A | A |
| Example 109 | Dispersion liquid G109 | B | A | A | A |
| Example 110 | Dispersion liquid G110 | B | A | A | A |
| Example 111 | Dispersion liquid G111 | B | A | A | A |
| Example 112 | Dispersion liquid G112 | B | A | A | A |
| Example 113 | Dispersion liquid G113 | B | A | A | A |
| Example 114 | Dispersion liquid G114 | B | A | A | A |
| Example 115 | Dispersion liquid G115 | A | A | A | A |
| Example 116 | Dispersion liquid G116 | A | A | A | A |
| Example 117 | Dispersion liquid G117 | A | A | A | A |

As shown in the above tables, the curable compositions of Examples had good evaluations of storage stability, moisture resistance, and developability.

Test Example 4

<Preparation and Evaluation of Curable Composition>

Raw materials shown in the following tables were mixed to prepare a curable composition. The storage stability, moisture resistance, adhesiveness, and developability of the obtained curable compositions were evaluated in the same method as in Test Example 1. The obtained results of Examples 201 to 214 in each evaluation item were the same as that of Example 18.

TABLE 16

| | Dispersion liquid | | Resin | | Polymerizable compound | | Photopolymerization initiator | | Solvent | |
|---|---|---|---|---|---|---|---|---|---|---|
| | Type | Part by mass | Type | Part by mass | Type | Part by mass | Type | Part by mass | Type | Part by mass |
| Example 201 | Dispersion liquid G18 | 39.4 | D1 | 0.58 | E1 | 0.54 | F3 | 0.33 | PGMEA | 7.66 |
| Example 202 | Dispersion liquid G18 | 39.4 | D2 | 0.58 | E1 | 0.54 | F3 | 0.33 | PGMEA | 7.66 |
| Example 203 | Dispersion liquid G18 | 39.4 | D1 | 0.29 | E1 | 0.54 | F3 | 0.33 | PGMEA | 7.66 |
| | | | D2 | 0.29 | | | | | | |
| Example 204 | Dispersion liquid G18 | 39.4 | D1 | 0.58 | E2 | 0.54 | F3 | 0.33 | PGMEA | 7.66 |
| Example 205 | Dispersion liquid G18 | 39.4 | D1 | 0.58 | E3 | 0.54 | F3 | 0.33 | PGMEA | 7.66 |
| Example 206 | Dispersion liquid G18 | 39.4 | D1 | 0.58 | E4 | 0.54 | F3 | 0.33 | PGMEA | 7.66 |
| Example 207 | Dispersion liquid G18 | 39.4 | D1 | 0.58 | E5 | 0.54 | F3 | 0.33 | PGMEA | 7.66 |
| Example 208 | Dispersion liquid G18 | 39.4 | D1 | 0.58 | E1 | 0.27 | F3 | 0.33 | PGMEA | 7.66 |
| | | | | | E2 | 0.27 | | | | |
| Example 209 | Dispersion liquid G18 | 39.4 | D1 | 0.58 | E1 | 0.54 | F1 | 0.33 | PGMEA | 7.66 |
| Example 210 | Dispersion liquid G18 | 39.4 | D1 | 0.58 | E1 | 0.54 | F2 | 0.33 | PGMEA | 7.66 |
| Example 211 | Dispersion liquid G18 | 39.4 | D1 | 0.58 | E1 | 0.54 | F4 | 0.33 | PGMEA | 7.66 |
| Example 212 | Dispersion liquid G18 | 39.4 | D1 | 0.58 | E1 | 0.54 | F5 | 0.33 | PGMEA | 7.66 |
| Example 213 | Dispersion liquid G18 | 39.4 | D1 | 0.58 | E1 | 0.54 | F3 | 0.22 | PGMEA | 7.66 |
| | | | | | | | F4 | 0.11 | | |
| Example 214 | Dispersion liquid G18 | 39.4 | D1 | 0.58 | E1 | 0.54 | F3 | 0.22 | PGMEA | 3.83 |
| | | | | | | | F4 | 0.11 | Cyclohexanone | 3.83 |

The raw materials indicated by abbreviations shown in the above tables are as follows.

(Dispersion Liquid)

Dispersion liquid G18: dispersion liquid G18 described above (Resin)

D1: resin D1 described above

D2: resin having the following structure (the numerical value described together with the main chain indicates a molar ratio, Mw=14000)

(Polymerizable Compound)

E1: polymerizable compound E1 described above

E2: compound having the following structure

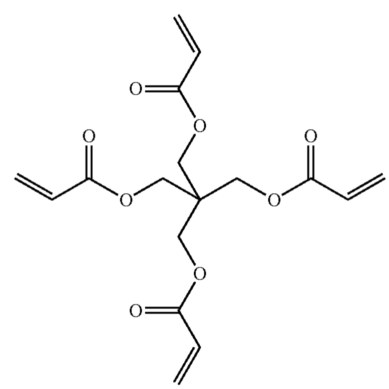 [SMILES: C=CC(=O)OCC(COC(=O)C=C)(COC(=O)C=C)COC(=O)C=C]

E3: compound having the following structure

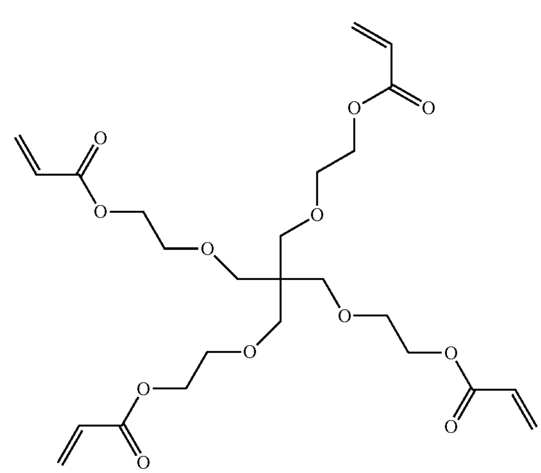 [SMILES: C=CC(=O)OCCOCC(COCCOC(=O)C=C)(COCCOC(=O)C=C)COCCOC(=O)C=C]

E4: compound having the following structure

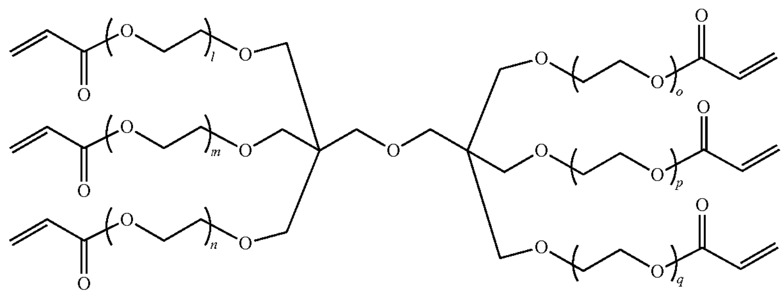

E5: ARONIX TO-2349 (manufactured by TOAGOSEI CO., LTD.)

(Photopolymerization Initiator)

F1: IRGACURE-OXE 01 (manufactured by BASF), compound having the following structure F2: IRGACURE-OXE 02 (manufactured by BASF), compound having the following structure F3: photopolymerization initiator F3 described above F4: IRGACURE 369 (manufactured by BASF), compound having the following structure F5: compound having the following structure (F1)

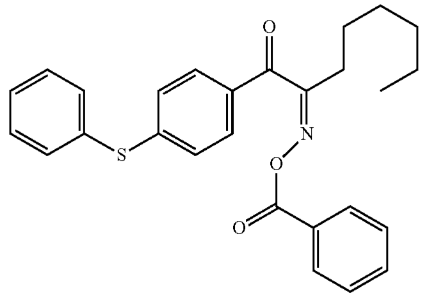

(F2)

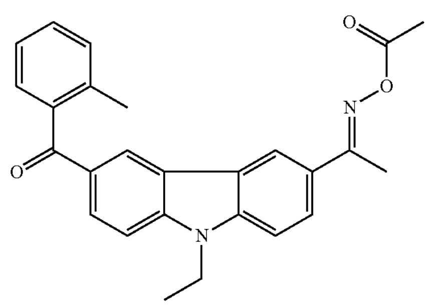

(F4)

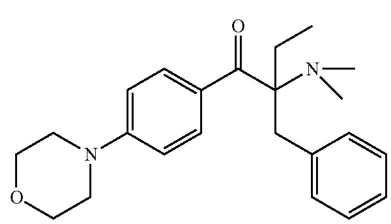

-continued (F5)

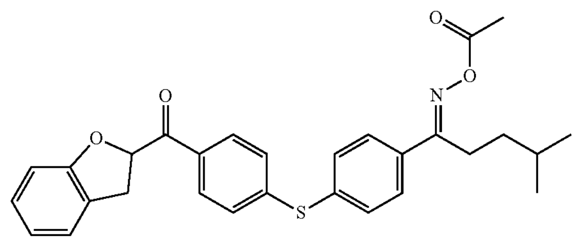

(Solvent)

PGMEA: propylene glycol monomethyl ether acetate

Example 301

A curable composition was prepared in the same manner as in Example 1 and evaluated in the same manner as in Example 1, except that the dispersion liquid G1 used in the curable composition of Example 1 was changed to the following dispersion liquid G301. The same results as in Example 12 were obtained except that the moisture resistance was "B" in each evaluation.

Dispersion liquid G301: dispersion liquid prepared by the following method 230 parts by mass of zirconia beads having a diameter of 0.3 mm were added to a mixed solution obtained by mixing 8.75 parts by mass of C. I. Pigment Green 36 as a G pigment, 3.85 parts by mass of C. I. Pigment Yellow 185 as a Y pigment, 1.40 parts by mass of the derivative 1 as a pigment derivative, 9.7 parts by mass (equivalent to 2.91 parts by mass of solid content) of a dispersant 12, 4.5 parts by mass (1.35 parts by mass in solid content) of a resin P-1, 4.5 parts by mass (1.35 parts by mass in solid content) of a resin P-2, and 67.3 parts by mass of propylene glycol monomethyl ether acetate as a solvent, the mixture was subjected to a dispersion treatment for 5 hours using a paint shaker, and the beads were separated by filtration to produce a dispersion liquid G301.

P-1: 30 mass % propylene glycol monomethyl ether acetate (PGMEA) solution of a resin having the following structure (the numerical value described together with the main chain indicates a molar ratio, and the numerical value described together with the side chain indicates the number of repeating units, Mw=20000)

P-2: 30 mass % PGMEA solution of a resin having the following structure (the numerical value described together with the main chain indicates a molar ratio, and the numerical value described together with the side chain indicates the number of repeating units, Mw=24000)

P-1

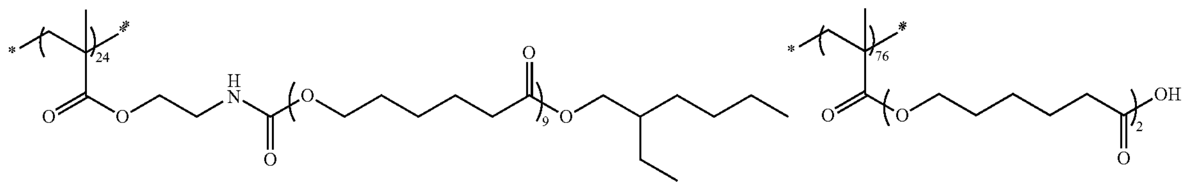

P-2

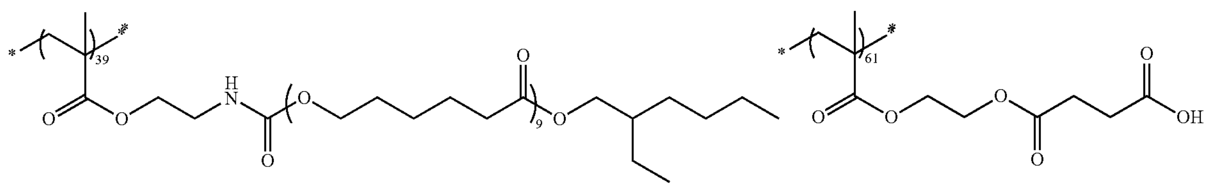

Test Example 5

Example 1001

A curable composition was prepared in the same manner as in Example 1, except that the following dispersion liquid R-1 was used. With regard to the obtained curable composition, the storage stability, moisture resistance, adhesiveness, and developability were evaluated in the same method as in Test Example 1. In each evaluation, the same results as in Example 17 were obtained.

Dispersion Liquid R-1: Dispersion Liquid Prepared by the Following Method 230 parts by mass of zirconia beads having a diameter of 0.3 mm were added to a mixed solution obtained by mixing 10.5 parts by mass of C. I. Pigment Red 254, 4.5 parts by mass of C. I. Pigment Yellow 139, 2.0 parts by mass of a derivative 4 as a pigment derivative, 5.5 parts by mass of a dispersant 17, and 77.5 parts by mass of PGMEA, the mixture was subjected to a dispersion treatment for 3 hours using a paint shaker, and the beads were separated by filtration to prepare a dispersion liquid R-1.

Derivative 4: Compound Having the Following Structure

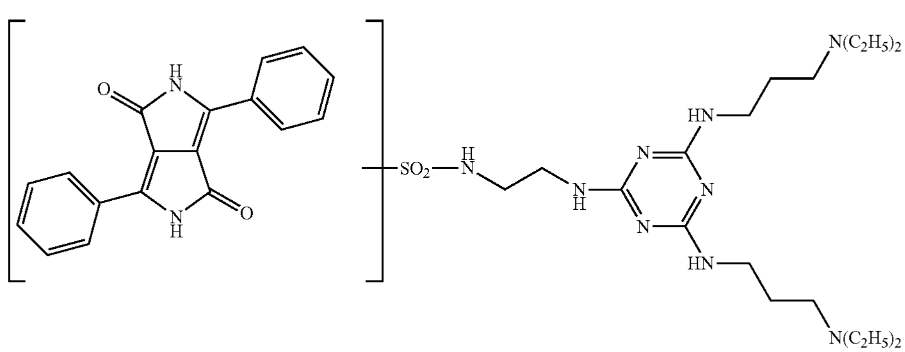

Comparative Example 1001

A curable composition was prepared in the same manner as in Example 1001, except that a dispersion liquid in which the dispersant 17 used in the dispersion liquid R-1 was changed to the comparative dispersant 2 was used. With regard to the obtained curable composition, the storage stability, moisture resistance, adhesiveness, and developability were evaluated in the same method as in Example 1. Each evaluation was the same as that of Comparative Example 2.

Example 1002

A curable composition was prepared in the same manner as in Example 1, except that the following dispersion liquid B-1 was used. With regard to the obtained curable composition, the storage stability, moisture resistance, adhesiveness, and developability were evaluated in the same method as in Example 1. In each evaluation, the same results as in Example 17 were obtained.

Dispersion Liquid B-1: Pigment Dispersion Liquid Prepared by the Following Method 230 parts by mass of zirconia beads having a diameter of 0.3 mm were added to a mixed solution obtained by mixing 12 parts by mass of C. I. Pigment Blue 15:6, 3 parts by mass of V dye 2 (acid value=7.4 mgKOH/g) described in paragraph No. 0292 of JP2015-041058A, 2.7 parts by mass of the derivative 3 as a pigment derivative, 4.8 parts by mass of the dispersant 17, and 77.5 parts by mass of PGMEA, the mixture was subjected to a dispersion treatment for 3 hours using a paint shaker, and the beads were separated by filtration to prepare a dispersion liquid.

Comparative Example 1002

A curable composition was prepared in the same manner as in Example 1002, except that a dispersion liquid in which the dispersant 17 used in the dispersion liquid B-1 was changed to the comparative dispersant 2 was used. With regard to the obtained curable composition, the storage stability, moisture resistance, adhesiveness, and developability were evaluated in the same method as in Example 1. Each evaluation was the same as that of Comparative Example 2.

Test Example 6

Example 2001

A silicon wafer was coated with a Green composition using a spin coating method so that the thickness of a film after post-baking was 1.0 μm. Next, the coating film was heated using a hot plate at 100° C. for 2 minutes. Next, using an i-ray stepper exposure device FPA-3000 i5+(manufactured by Canon Inc.), irradiation (exposure) was performed with light having a wavelength of 365 nm and an exposure dose of 1000 $mJ/cm^2$ through a mask having a dot pattern of 2 μm square. Next, puddle development was performed at 23° C. for 60 seconds using a tetramethylammonium hydroxide (TMAH) 0.3 mass % aqueous solution. Next, the coating film was rinsed by spin showering and was cleaned with pure water. Next, the Green composition was patterned by heating (post-baking) at 200° C. for 5 minutes using a hot plate. Likewise, a Red composition and a Blue composition were sequentially patterned to form green, red, and blue-colored patterns (Bayer pattern). As the Green composition, the curable composition of Example 1 was used. The Red composition and the Blue composition will be described later. The Bayer pattern refers to a pattern, as disclosed in the specification of U.S. Pat. No. 3,971,065A, in which a 2×2 array of color filter element having one Red element, two Green elements, and one Blue element is repeated. The obtained color filter was incorporated into a solid-state imaging element according to a known method. The solid-state imaging element had a suitable image recognition ability.

—Red Composition—

The following components were mixed and stirred, and the obtained mixture was filtered through a nylon filter (manufactured by Nihon Pall Corporation) having a pore size of 0.45 μm to prepare a Red composition.

Red pigment dispersion liquid: 51.7 parts by mass 40 mass % PGMEA solution of resin D1: 0.6 parts by mass Polymerizable compound E4: 0.6 parts by mass Photopolymerization initiator F1: 0.3 parts by mass Surfactant H1: 4.2 parts by mass PGMEA: 42.6 parts by mass —Blue Composition—

The following components were mixed and stirred, and the obtained mixture was filtered through a nylon filter (manufactured by Nihon Pall Corporation) having a pore size of 0.45 μm to prepare a Blue composition.

Blue pigment dispersion liquid: 44.9 parts by mass 40 mass % PGMEA solution of resin D1: 2.1 parts by mass Polymerizable compound E1: 1.5 parts by mass Polymerizable compound E4: 0.7 parts by mass Photopolymerization initiator F1: 0.8 parts by mass Surfactant H1: 4.2 parts by mass PGMEA: 45.8 parts by mass The raw materials used for the Red composition and the Blue composition are as follows.

Red Pigment Dispersion Liquid

A mixed solution consisting of 9.6 parts by mass of C. I. Pigment Red 254, 4.3 parts by mass of C. I. Pigment Yellow 139, 6.8 parts by mass of a dispersant (Disperbyk-161, manufactured by BYK Chemie), and 79.3 parts by mass of PGMEA was mixed and dispersed using a beads mill (zirconia beads; diameter: 0.3 mm) for 3 hours. Next, using a high-pressure disperser NANO-3000-10 (manufactured by Nippon BEE Chemical Co., Ltd.) equipped with a pressure reducing mechanism, the pigment dispersion liquid was further dispersed under a pressure of 2000 $kg/cm^3$ at a flow rate of 500 g/min. This dispersion treatment was repeated 10 times. As a result, a Red pigment dispersion liquid was obtained.

Blue Pigment Dispersion Liquid

A mixed solution consisting of 9.7 parts by mass of C. I. Pigment Blue 15:6, 2.4 parts by mass of C. I. Pigment Violet 23, 5.5 parts by mass of a dispersant (Disperbyk-161, manufactured by BYK Chemie), and 82.4 parts by mass of PGMEA was mixed and dispersed using a beads mill (zirconia beads; diameter: 0.3 mm) for 3 hours. Next, using a high-pressure disperser NANO-3000-10 (manufactured by Nippon BEE Chemical Co., Ltd.) equipped with a pressure reducing mechanism, the pigment dispersion liquid was further dispersed under a pressure of 2000 $kg/cm^3$ at a flow rate of 500 g/min. This dispersion treatment was repeated 10 times. As a result, a Blue pigment dispersion liquid was obtained.

Resin D1, polymerizable compound E1 and E4 photopolymerization initiator F1, and surfactant H1: above-described materials

EXPLANATION OF REFERENCES

1: support
2: partition wall
4: pixel
100: structural body

What is claimed is:

1. A curable composition comprising:

a pigment;

a resin;

a polymerizable compound;

a photopolymerization initiator; and a solvent;

wherein the resin includes a resin A which includes a repeating unit having a graft chain of a poly(meth) acrylate structure and a repeating unit having an acid group, and the graft chain of a poly(meth)acrylate structure includes a repeating unit represented by Formula (1), Formula (1)

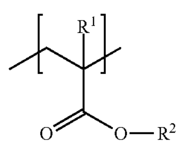

in Formula (1), $R^1$ represents a hydrogen atom, and $R^2$ represents a linear alkyl group having 1 to 20 carbon atoms.

2. The curable composition according to claim 1, wherein $R^2$ of Formula (1) is an alkyl group having 2 to 20 carbon atoms.

3. The curable composition according to claim 1, wherein $R^2$ of Formula (1) is a primary alkyl group having 2 to 20 carbon atoms.

4. The curable composition according to claim 1, wherein the graft chain of a poly(meth)acrylate structure includes a repeating unit represented by Formula (2), Formula (2)

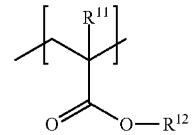

in Formula (2), $R^{11}$ represents a methyl group, and $R^{12}$ represents a hydrocarbon group having 1 to 20 carbon atoms.

5. The curable composition according to claim 1, wherein a glass transition temperature of the graft chain of a poly(meth)acrylate structure is 100° C. or lower.

6. The curable composition according to claim 1, wherein a Hansen solubility parameter of the graft chain of a poly(meth)acrylate structure is 7.8 to 9.5 $(cal/cm^3)^{0.5}$.

7. The curable composition according to claim 1, wherein the resin A is a dispersant.

8. The curable composition according to claim 1, wherein the pigment includes a chromatic pigment.

9. The curable composition according to claim 1, further comprising:

a pigment derivative.

10. A film formed of the curable composition according to claim 1, wherein the film is formed by comprising following steps:

a coating step, wherein the curable composition is applied to a silicon wafer using a spin coater;

a pre-bake step, wherein the curable composition formed on the silicon wafer was heated on a first hot plate;

an exposure step, wherein the curable composition, after the pre-bake step, was irradiate with light;

a post-bake step, wherein the curable composition, after the exposure step, was heated on a second hot plate, thereby forming the film.

11. A structural body comprising:

a support;

a partition wall provided on the support; and a pixel obtained from the curable composition according to claim 1 and provided on an area of the support partitioned by the partition wall.

12. A color filter comprising:

the film according to claim 10.

13. A solid-state imaging element comprising:

the film according to claim 10.

14. An image display device comprising:

the film according to claim 10.

* * * * *